United States Patent
Whitaker

(10) Patent No.: US 8,767,379 B2
(45) Date of Patent: Jul. 1, 2014

(54) RECREATIONAL VEHICLE USER INTERFACE SYSTEM AND METHOD

(71) Applicant: Connecticut Electric, Inc., Anderson, IN (US)

(72) Inventor: Chuck C. Whitaker, Anderson, IN (US)

( * ) Notice: Subject to any disclaimer, the term of this patent is extended or adjusted under 35 U.S.C. 154(b) by 0 days.

(21) Appl. No.: 13/794,088

(22) Filed: Mar. 11, 2013

(65) Prior Publication Data
US 2013/0197748 A1 Aug. 1, 2013

Related U.S. Application Data

(60) Provisional application No. 61/763,230, filed on Feb. 11, 2013.

(51) Int. Cl.
| | | |
|---|---|---|
| B60R 16/023 | (2006.01) | |
| B60R 16/033 | (2006.01) | |
| B60R 16/03 | (2006.01) | |
| H04L 29/08 | (2006.01) | |

(52) U.S. Cl.
CPC ......... *B60R 16/0231* (2013.01); *B60R 16/0315* (2013.01); *H04L 67/12* (2013.01)
USPC ............... 361/631; 700/17; 701/48; 307/10.1

(58) Field of Classification Search
USPC ........................................................ 701/31.4
See application file for complete search history.

(56) References Cited

U.S. PATENT DOCUMENTS

| | | | | |
|---|---|---|---|---|
| 6,107,696 A * | 8/2000 | Peter et al. | ...................... | 307/31 |
| 6,249,425 B1 * | 6/2001 | Sudo et al. | ..................... | 361/627 |
| 6,469,404 B1 * | 10/2002 | Pohjola | ........................ | 307/10.1 |
| 6,879,895 B2 * | 4/2005 | Capps et al. | ..................... | 701/36 |
| 6,965,818 B2 * | 11/2005 | Koenig et al. | ................... | 701/36 |
| 7,245,109 B2 | 7/2007 | Wallace | | |
| 7,592,713 B2 * | 9/2009 | Bryan et al. | ................... | 307/9.1 |
| 8,199,507 B2 * | 6/2012 | Shohet et al. | ................. | 361/710 |

OTHER PUBLICATIONS

Power Control System Model 100 Brochure; Precision Circuits, Inc., Lisle, IL 60532; [Date Unknown]; 2 pp.

\* cited by examiner

*Primary Examiner* — John R Olszewski
*Assistant Examiner* — Todd Melton
(74) *Attorney, Agent, or Firm* — Vincent J. Allen; Kevin M. Klughart; Carstens & Cahoon, LLP

(57) ABSTRACT

A recreational vehicle user interface (RVUI) system/method that allows centralized control and monitoring of electrical/environmental subsystems within the context of a recreational vehicle is disclosed. The system/method permits monitoring of a wide variety of electrical/environmental subsystems in this context, including but not limited to battery temperatures, battery voltages, overall system voltages, battery disconnect relays, vent fans, solar panels, cabin temperatures, battery temperature alarms, power converter modules, temperature sensitive power converters, load management controllers, AC distribution controllers, transfer switches, AC/generator inputs, storage tank levels, pumps, and other electrical loads. The system/method may be optionally configured to wirelessly communicate with a mobile device using a variety of customizable mobile user interface applications, and/or be configured to support a universal control/sensor motherboard that mates to a customizable user interface daughterboard with associated custom display/control indicia bezel/panel or integrated touch screen display/control.

20 Claims, 48 Drawing Sheets

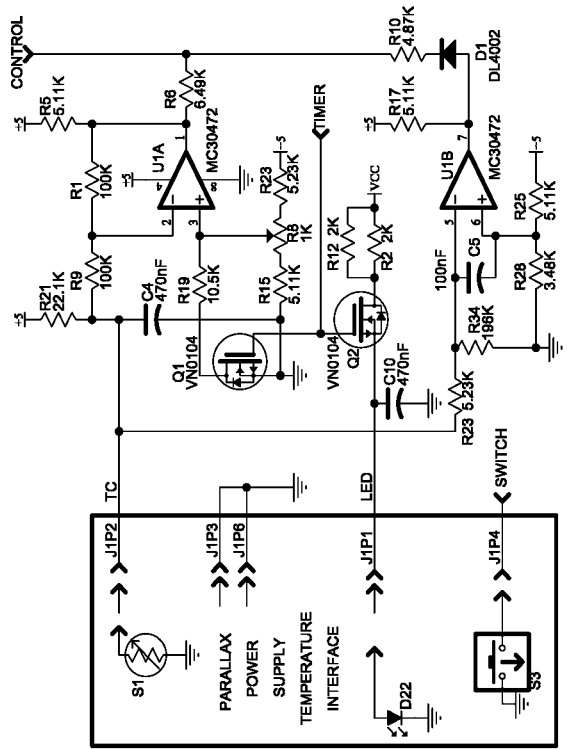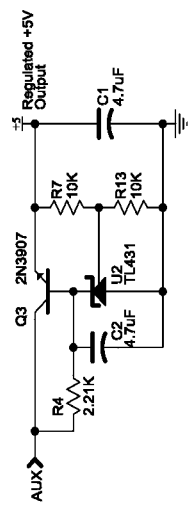
FIG. 19

2400

RECREATIONAL VEHICLE USER INTERFACE SYSTEM AND METHOD

CROSS REFERENCE TO RELATED APPLICATIONS

This application claims benefit under 35 U.S.C. §119 and incorporates by reference United States Provisional patent application for RECREATIONAL VEHICLE USER INTERFACE SYSTEM AND METHOD by inventor Chuck Whitaker, filed electronically with the USPTO on Feb. 11, 2013, with Ser. No. 61/763,230, EFS ID 14929300, confirmation number 1050.

This patent application includes by reference U.S. Pat. No. 7,245,109 issued on Jul. 17, 2009 to Bill Wallace for TEMPERATURE SENSITIVE POWER CONVERTER.

PARTIAL WAIVER OF COPYRIGHT

All of the material in this patent application is subject to copyright protection under the copyright laws of the United States and of other countries. As of the first effective filing date of the present application, this material is protected as unpublished material.

However, permission to copy this material is hereby granted to the extent that the copyright owner has no objection to the facsimile reproduction by anyone of the patent documentation or patent disclosure, as it appears in the United States Patent and Trademark Office patent file or records, but otherwise reserves all copyright rights whatsoever.

STATEMENT REGARDING FEDERALLY SPONSORED RESEARCH OR DEVELOPMENT

Not Applicable

REFERENCE TO A MICROFICHE APPENDIX

Not Applicable

FIELD OF THE INVENTION

The present invention generally relates to systems and methods for monitoring and controlling electrical/environmental subsystems. Specifically, the present invention attempts to provide an integrated user interface for control/monitoring of various electrical/environmental subsystems within the context of a recreational vehicle.

PRIOR ART AND BACKGROUND OF THE INVENTION

Prior Art Background (0100)

Within the context of Recreational Vehicles, a wide variety of electrical and/or environmental subsystems may be implemented. As generally illustrated in FIG. 1 (0100), the RV application context (0110) may incorporate electrical/environmental subsystems (0120) comprising items such as:
- sensors such as cabin temperature (0131), storage tank levels (0132) and the like;
- switching functions such as AC distribution (0141), transfer switches (0142), AC load management (0143), AC load shedding control (0144), and the like;
- load functions such as RV electrics/electronics (0151), pumps (0152), and other electrical loads;
- power generation functions such as AC generator controls (0161), solar panels (0162), house batteries (0163), AC-DC converters (0164), temperature sensitive AC/DC converters (such as described in U.S. Pat. No. 7,245,109) (0165), and other power generation subsystems.

All of these subsystems (0120) typically involve their own control systems and display/monitor/control user interfaces. These subsystem-specific user interfaces are often incompatible and incorporate a wide variety of incompatible displays, controls, and user interfaces.

From a user perspective, this lack of uniformity is problematic as it prevents centralized monitoring and control of the diverse subsystems (0120) within the RV context (0110). Furthermore, this lack of centralized monitoring and control capability may mean that critical information required to properly manage these systems is lost or not properly reported due to the spatially diverse nature of the displays/controls incorporated within these systems. In some circumstances, such as the use of temperature sensitive AC/DC converters (0165) and the like, minimal display and subsystem control is provided within the subsystem, making the lack of additional monitoring/control capability a significant deficiency in the current state of the prior art.

Deficiencies in the Prior Art

The prior art as detailed above suffers from the following deficiencies:
- Prior art RV user interfaces tend to be subsystem specific and do not provide a means of integrating monitoring and control of electrical/environmental subsystems throughout an entire RV context.
- Prior art RV user interfaces lack the ability to be reconfigurable based on application context.
- Prior art RV user interfaces lack the ability to adapt to the addition of new electrical/environmental subsystems.
- Prior art RV user interfaces are generally subsystem specific and cannot be easily reconfigured to support other subsystem monitoring/control.
- Prior art RV user interfaces do not support remote access or access via mobile communication devices.

While some of the prior art may teach some solutions to several of these problems, the core issue of providing an integrated user interface for RV electrical/environmental subsystems has not been addressed by the prior art.

OBJECTIVES OF THE INVENTION

Accordingly, the objectives of the present invention are (among others) to circumvent the deficiencies in the prior art and affect the following objectives:
(1) Provide for a recreational vehicle user interface system and method that permits a generic hardware interface to monitor and control a wide variety of electrical/environmental subsystems within an RV.
(2) Provide for a recreational vehicle user interface system and method that permits the user hardware interface to be reconfigurable.
(3) Provide for a recreational vehicle user interface system and method that permits monitoring/control of RV electrical/environmental subsystems using a mobile communication device.

While these objectives should not be understood to limit the teachings of the present invention, in general these objectives are achieved in part or in whole by the disclosed invention that is discussed in the following sections. One skilled in the art will no doubt be able to select aspects of the present invention as disclosed to affect any combination of the objectives described above.

BRIEF SUMMARY OF THE INVENTION

System Overview (0200)

The present invention in various embodiments addresses one or more of the above objectives in the following manner. As generally depicted in FIG. 2 (0200), the present invention implements a recreational vehicle user interface (RVUI) (0210) that bridges the recreational vehicle (RV) context (0220) and its associated recreational vehicle electrical/environmental subsystems (0221) with a user (0230), providing the user (0230) the capability of centrally observing the displayed status (0231) of the RVEES (0221) as well as initiating control functions (0232) directed at the RVEES (0221).

The electrical interface to the RVEES (0221) is provided by a universal control/sensor motherboard (UCSM) (0211) that provides universal interfacing capabilities to the various RVEES (0221) functions. The UCSM is then mated to a customizable user interface daughterboard (CUID) (0212) that translates the interface protocols of the UCSM (0211) into a hardware presentation interface that may vary widely based on the application and desired sophistication level of the overall system as constructed. This customized user interface hardware (0212) is then presented to the user (0230) via a custom indicia bezel/panel (CIBP) (0213) that provides a variety of options relating to status/control information as well as customizable options for presentation.

The combination of the CUID (0212) and the CIBP) (0213) permit a wide variation in overall system applications using a common UCSM (0211), thus reducing the overall cost of generating a plethora of variations in the overall hardware/ergonomic interface presented to the user (0230). This configuration also allows inexpensive variations of some CUID (0212) embodiments to occur by selectively populating the CUID (0212) with components and then customizing the CIBP (0213) to support the components utilized in the CUID (0212) board population.

Within this application context the RVUI (0210) may be configured to permit the user (0230) to interact (0233) with a mobile communication device (MCD) (0234) that wirelessly communicates (0235) with the UCSM (0211) to monitor (0231) and/or control (0232) elements within the RVEES (0221) using the UCSM (0211) as the portal for communication with the RVEES (0221).

Method Overview (0300)

The present invention system may be utilized in the context of an overall recreational vehicle user interface method as depicted in the flowchart of FIG. 3 (0300), wherein the recreational vehicle user interface system described previously is controlled by a method having the following steps:

(1) electrically interconnecting the electrical inputs of the UCSM to monitoring nodes within the electrical system of the RVEES (0301);

(2) electrically interconnecting the electrical outputs of the UCSM to control nodes within the electrical system of the RVEES (0302);

(3) configuring the CUID to provide a customized user hardware interface to the UCSM consistent with the interconnections in step (1) and step (2) (0303);

(4) configuring the CIBP with legends and indicia to conform to the CUID customized user hardware interface (0304);

(5) relaying status information from the RVEES to the UCSM for presentation on the CUID status display as presented by the CIBP to a user (0305); and (6) relaying control inputs from the CUID to the UCSM for transmission to the RVEES to control RVEES functions defined by the user interface presented on the CIBP (0306).

As seen from the flowchart in FIG. 3 (0300), step (1) (0301)-step (4) (0304) are generally associated with installation of the RVUI within an existing RVEES context, and step (5) (0305)-step (6) (0306) are generally associated with operation of the installed system. Integration of this and other preferred exemplary embodiment methods in conjunction with a variety of preferred exemplary embodiment systems described herein is anticipated by the overall scope of the present invention.

BRIEF DESCRIPTION OF THE DRAWINGS

For a fuller understanding of the advantages provided by the invention, reference should be made to the following detailed description together with the accompanying drawings wherein:

FIG. 19 illustrates an exemplary 5VDC supply generator and control comparator schematic used in a PARALLAX POWER SUPPLY as interfaced to a preferred invention embodiment;

DESCRIPTION OF THE PRESENTLY PREFERRED EXEMPLARY EMBODIMENTS

Figure 1:
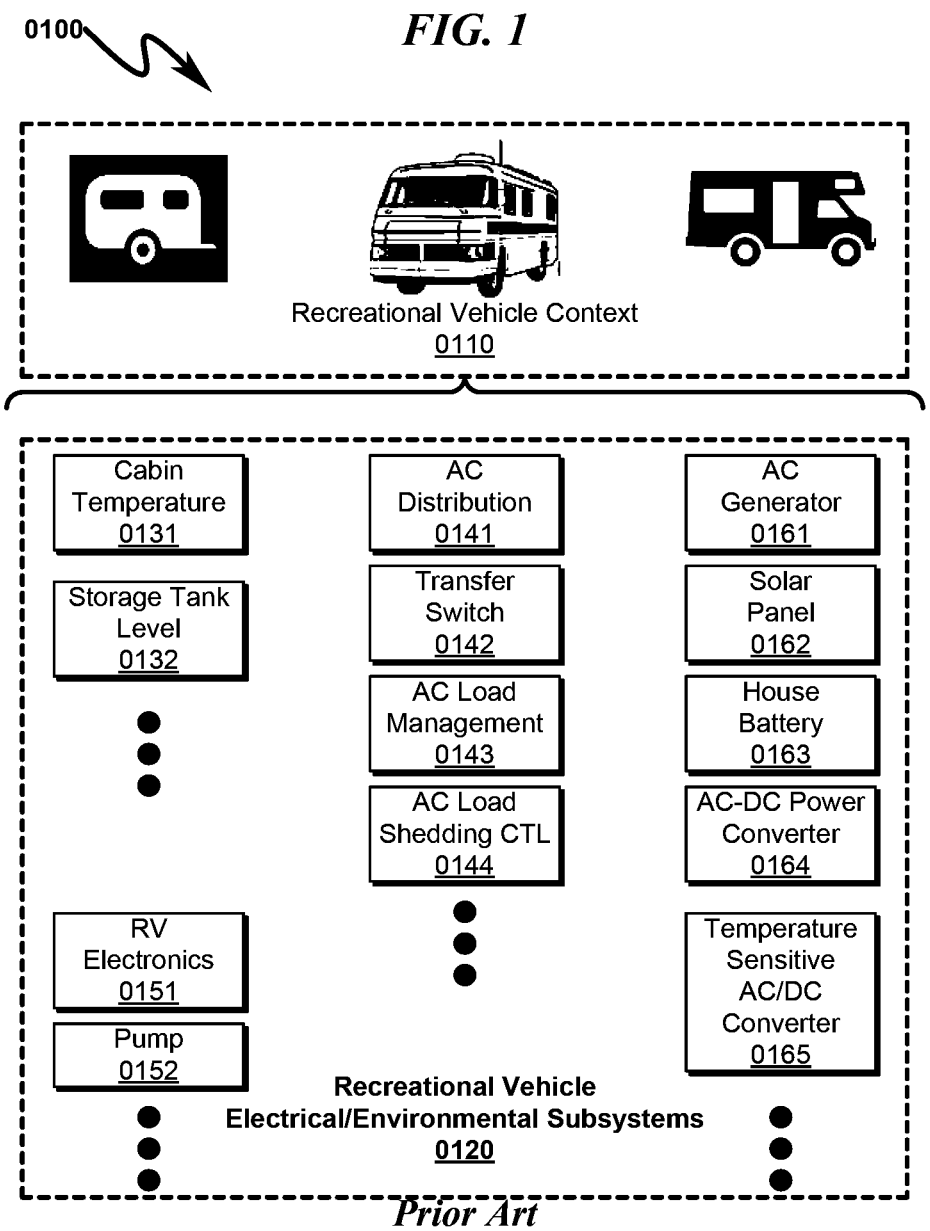
FIG. 1 illustrates a prior art depiction of various electrical/environmental subsystems within a conventional RV application context.

While this invention is susceptible of embodiment in many different forms, there is shown in the drawings and will herein be described in detailed preferred embodiment of the invention with the understanding that the present disclosure is to be considered as an exemplification of the principles of the invention and is not intended to limit the broad aspect of the invention to the embodiment illustrated.

The numerous innovative teachings of the present application will be described with particular reference to the presently preferred embodiment, wherein these innovative teachings are advantageously applied to the particular problems of a RECREATIONAL VEHICLE USER INTERFACE SYSTEM AND METHOD. However, it should be understood that this embodiment is only one example of the many advantageous uses of the innovative teachings herein. In general, statements made in the specification of the present application do not necessarily limit any of the various claimed inventions. Moreover, some statements may apply to some inventive features but not to others.

RVUI Not Limitive

The present invention will make use of the term Recreational Vehicle User Interface (RVUI) to encompass the various embodiments of the present invention as they apply to the monitoring and control of electrical/environmental subsystems within a Recreational Vehicle (RV) environment.

PARALLAX Preferred Component Source Not Limitive

Various embodiments of the present invention may optimally incorporate products from PARALLAX POWER SUPPLY (a division of Connecticut Electric Inc.), 1819 W. 38th Street, Anderson, Ind. 46013, tel: 1-800-443-4859/1-800-

730-2557. References to PARALLAX within this document refer to exemplary component parts generally available from, but not necessarily limited to, this source.

Electrical/Environmental Subsystem Not Limitive

The term Recreational Vehicle Electrical/Environmental Subsystem (RVEES) will be used herein to denote the application scope of the present invention. The present invention makes no limitation on the type of subsystem which may be monitoring and/or controlled within the range of RVEES in a Recreational Vehicle (RV) application context. Typical (but not limitive) examples of these RVEES include: battery temperature, battery voltage, overall system voltage, battery disconnect relay, vent fan, solar panel, cabin temperature, temperature alarm, power converter module, temperature sensitive power converter, PARALLAX POWER SUPPLY, load management controller, AC distribution controller, transfer switch, AC/generator input, storage tank sensor, pump, 12V electrical load, and 24V electrical load.

As will be clear from a given context, a particular subsystem may be amenable to monitoring and control (such as battery voltage and corresponding charging circuit activation), or in some cases only monitoring (ambient cabin temperature), or in some instances only control (disconnection of shore input power). Thus, the terms "monitoring" and "control" should be broadly interpreted within this context.

PARALLAX POWER SUPPLY Not Limitive

Various embodiments of the present invention may be integrated as improvements on existing RV power supply systems. For example, the present invention may be integrated with power supply subsystems incorporating technology from U.S. Pat. No. 7,245,109 for TEMPERATURE SENSITIVE POWER CONVERTER. Herein these power supply subsystems will be termed "PARALLAX POWER SUPPLY" subsystems, although these subsystems need not necessarily be manufactured by the assignee of U.S. Pat. No. 7,245,109. Thus, in this specifically limited combination context the present invention may be considered an improvement of PARALLAX POWER SUPPLY subsystems as described in this issued U.S. patent.

TempAssure Not Limitive

Various embodiments of the present invention may be integrated as improvements on existing RV power supply systems incorporating PARALLAX® POWER SUPPLY subsystems incorporating TempAssure battery charging technologies that modulate battery charging characteristics based on the measured battery and/or ambient temperature. While many preferred embodiments are designed to operate directly with this type of power supply subsystem, the present invention is not specifically limited to this type of battery charging technology or subsystem.

PCB Not Limitive

Various embodiments of the present invention may make use of printed circuit boards (PCBs) in preferred construction scenarios. The use of PCBs in this context is not limitive in the construction of the universal control/sensor motherboard (UCSM) and corresponding customizable user interface daughterboard (CUID). While in many application contexts these components may be fabricated using PCBs of identical (or near identical) size, this is not a requirement of the present invention.

Display Not Limitive

The present invention anticipates a wide variety of displays may be used to implement various indicator functions within the scope of various invention embodiments. Specifically, the use of "bar graph" displays (typically of LED or LCD construction) may be used to provide "fuel gauge" type displays of items such as voltage levels, storage tank levels, temperature, and the like. These displays are commercially available (or may be constructed of discrete LEDs) to incorporate various colors to indicate various levels (red/orange/yellow/green) of the various monitored RV subsystem quantities.

The present invention also anticipates the use of individual LED/LCD indicators to announce alarm conditions, such as high battery temperature, storage tank full, battery disconnected, etc. These alarm conditions may optionally incorporate blinking indicators at various flash rates.

The present invention also anticipates the use of digital LED/LCD indicators to indicate absolute or relative (percentage) RV subsystem resource levels, such as ambient temperature, battery temperature, storage tank fill level, etc. The term "digital" in this context may incorporate conventional multi-segment (7-segment, 14-segment, etc.) LED/LCD displays and/or dot matrix displays, either of which may be configured to display numeric and/or alphanumeric information.

The present invention may also incorporate more complex display indicators such as touch screen displays, graphics LCD panels, and the like to present a more robust user interface and permit the user to more finely control the overall RV subsystems monitored/supervised by the RVUI.

From the above discussion it should be evident that within the context of the present invention scope, the term "display" should be given its broadest possible interpretation consistent with the invention application context.

Component Values Not Limitive

The present invention anticipates a wide variety of electrical components may be used to implement various functions within the scope of various invention embodiments. Thus, the specific component values provided herein are exemplary and not necessarily limitive of the present invention scope.

Portable/Mobile Computing Device Not Limitive

The present invention anticipates a wide variety of applications for the recreational vehicle user interface system/method taught herein. Within the application context, the term "portable computing device" or "mobile computing device (MCD)" and their variants should be given the broadest possible interpretation, to include but not be limited to laptop computers, cellphones, mobile phones, smart phones, tablet computers, and other like and typical applications where the device is typically considered portable or mobile.

While the present invention anticipates that the computational capability of the "computing device" described herein may vary widely, it is anticipated that some aspects of the present invention may be implemented using software embodied in computer readable program code means embodied on a tangible medium that is computer readable.

Battery Not Limitive

The present invention anticipates a wide variety of batteries and battery chemistries may be managed by the recreational vehicle user interface described herein. Within this context, many preferred system embodiments will utilize lead-acid batteries. However, the present invention makes no limitation on the specific type of battery and/or battery chemistry that may be adapted using the present invention teachings.

Battery Voltage Not Limitive

The present invention anticipates a wide variety of batteries and battery voltages may be managed by the recreational vehicle user interface described herein. Within this context, many preferred system embodiments will utilize 12VDC battery systems. However, the present invention makes no limitation on the specific battery voltages, and other battery voltages (such as 24VDC systems) are also anticipated within the invention scope.

Line/Shore/Generator Voltage Not Limitive

The present invention anticipates a wide variety of AC voltages may be utilized within the invention context. While the present invention may be advantageously applied to nominal 120/240 VAC systems, other AC line voltages associated with shore/generator systems may also be accommodated without loss of invention scope or generality.

Wireless Communication Interface Not Limitive

The present invention anticipates a wide variety of wireless communication technologies may be utilized to communicate from the system as described to a portable (mobile) computing device. While many preferred invention embodiments may make use of BLUETOOTH® or WiFi wireless communications, the present invention is not specifically limited in scope to these particular wireless communication standards.

System Overview (0400)

Figure 4:
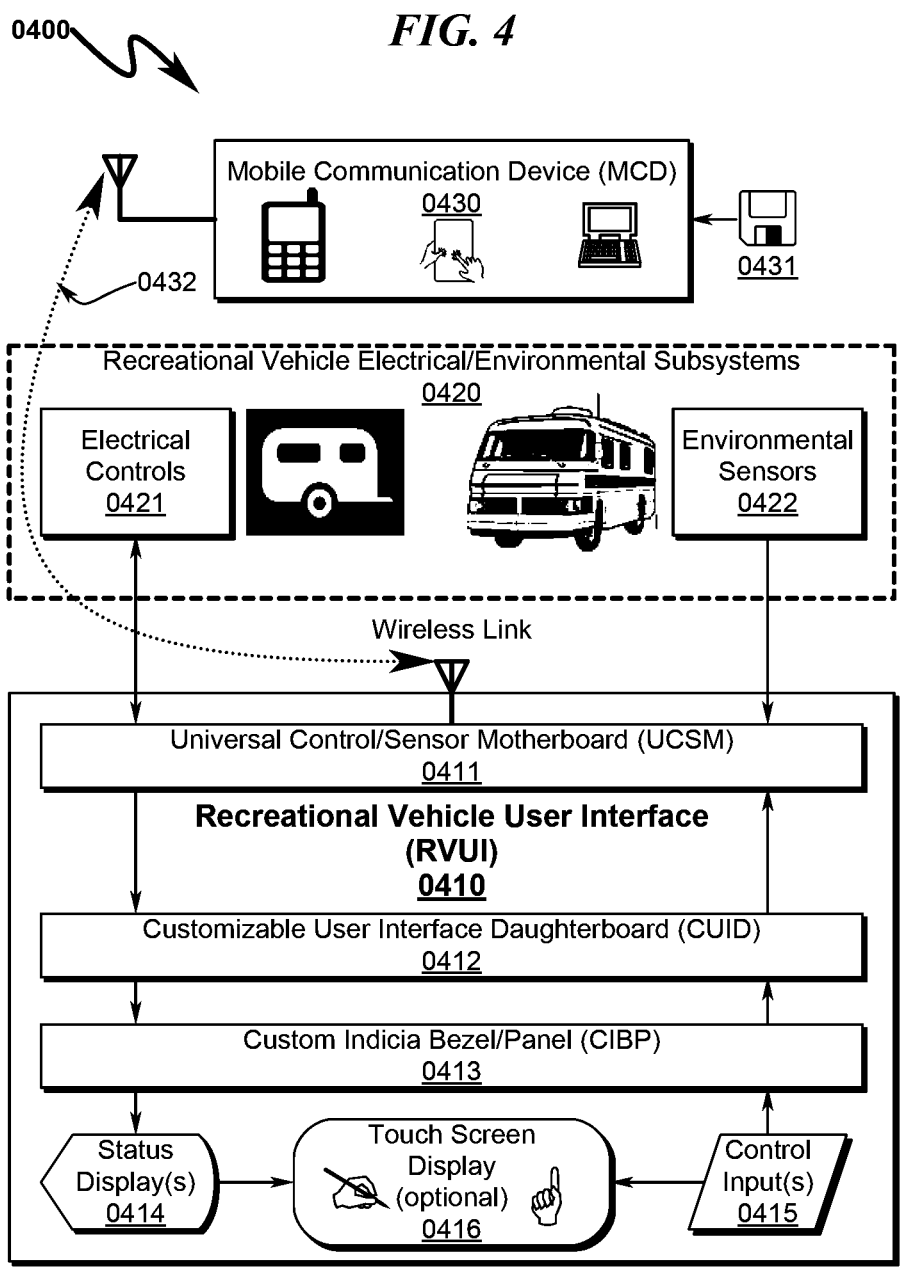
FIG. 4 illustrates a general system block diagram illustrating a preferred embodiment of the present invention.

The present invention may be seen in an overview context as generally illustrated in FIG. 4 (0400), wherein a recreational vehicle user interface (RVUI) (0410) operates to integrate monitoring/control of recreational vehicle electrical (0421) and/or environmental (0422) subsystems (0420). Within this context the RVUI (0410) further comprises a universal control/sensor motherboard (UCSM) (0411) that may be computer controlled with software read from a variety of computer readable media. The UCSM (0411) electrically interfaces to a customizable user interface daughterboard (CUID) (0412) that defines the possible hardware interfaces possible for the user interface to the RVUI (0410). The CUID (0412) may be customized for a wide variety of end-user applications and human interface requirements. The CUID (0412) is associated with a custom indicia bezel/panel (CIBP) (0413) that presents the CUID (0412) hardware interface to the user with bezel/panel cutouts, legends, and the like that formalize the user interface to the user. This permits a given CUID (0412) to present a wide variety of presentation forms to the user and may also allow a wide variety of interpretations of the status displays (0414) and/or control inputs (0415) as they are manipulated by the user. The system as described may also integrate the status display (0414) and the control inputs (0415) in the form of a touch screen display (0406) in some embodiments.

The system also anticipates in some embodiments that a mobile communication device (MCD) (0430) (such as a laptop computer, tablet computer, mobile phone, etc.) operating under control of software read from a computer readable medium (0431) may communicate with the UCSM (0411) via a wireless communication link (0432) to affect monitoring and/or control of environmental/electrical subsystems within the RV (0420). Within this context, the application software (0432) running on the MCD (0430) may present a variety of monitoring/control display "skins" to the user in response to identification and/or configuration information retrieved from the UCSM (0411).

Exemplary RVUI DC Subsystems Application (0500)

Figure 5:
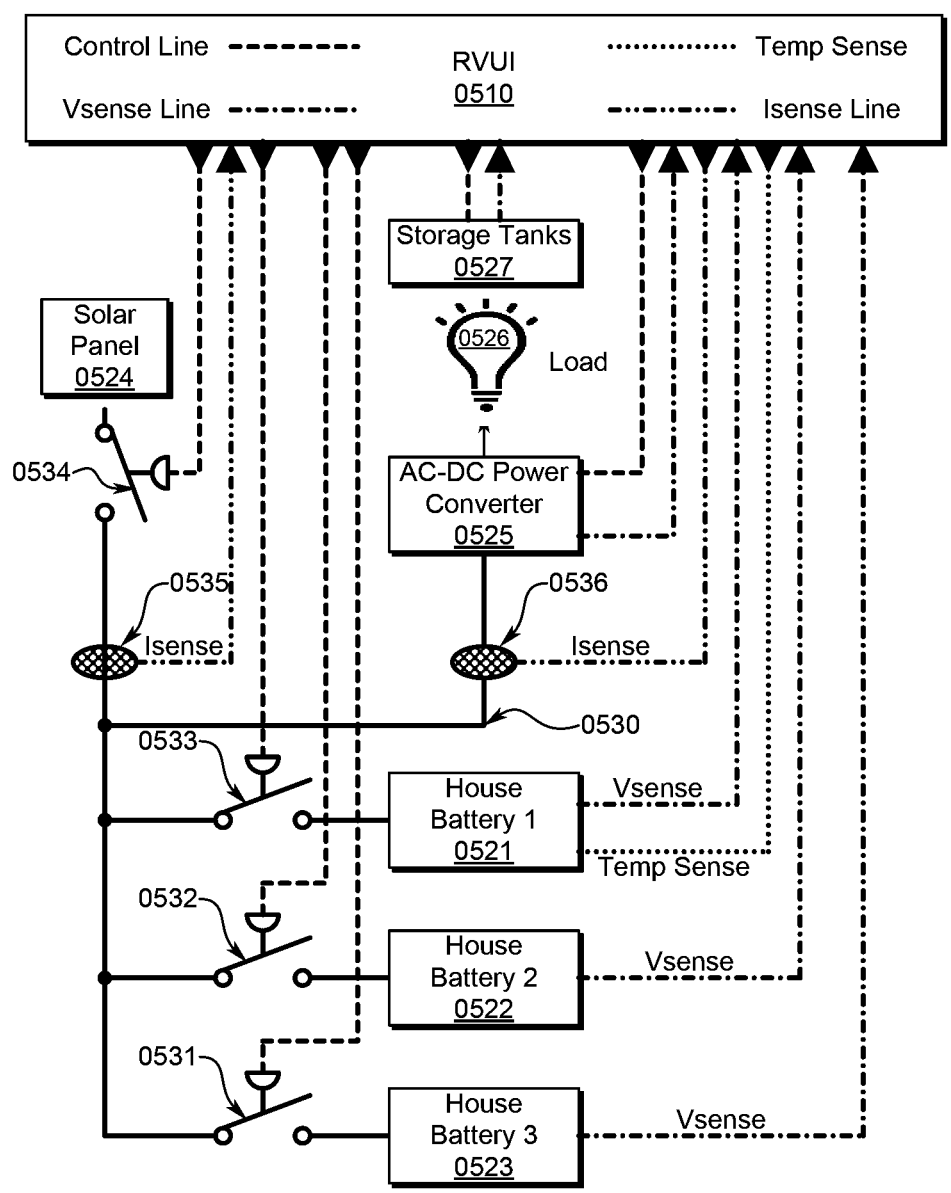
FIG. 5 illustrates a preferred exemplary system embodiment of the present invention as applied to DC power distribution subsystem integration in the context of a recreational vehicle.

The RVUI (0410) depicted in FIG. 4 (0400) may be implemented to control various DC subsystems as generally depicted in FIG. 5 (0500), wherein the RVUI (0510) illustrated supervises various house batteries (0521, 0522, 0523) in addition to solar panels (0524) and a DC-to-AC power converter (0525) having connected DC loads (0526) as well as management of storage tanks (0527). In this configuration various contactors (relays, solid state switches, active breakers, etc.) (0531, 0532, 0533, 0534) control connection of these DC sources/sinks to the 12VDC (or 24VDC) power bus (0530). Within this context the various control lines, voltage sense (Vsense) line, current sense (Isense) lines, and temperature sense lines are illustrated. Shunts or other current sensing devices (0535, 0536) may be used in various portions of the circuit to detect current flow and thus loading/sourcing of various system components. This information may be used by the RVUI (0510) to control various electrical load shedding devices to maximize available power for critical RV systems operations.

Exemplary RVUI AC Subsystems Application (0600)

Figure 6:
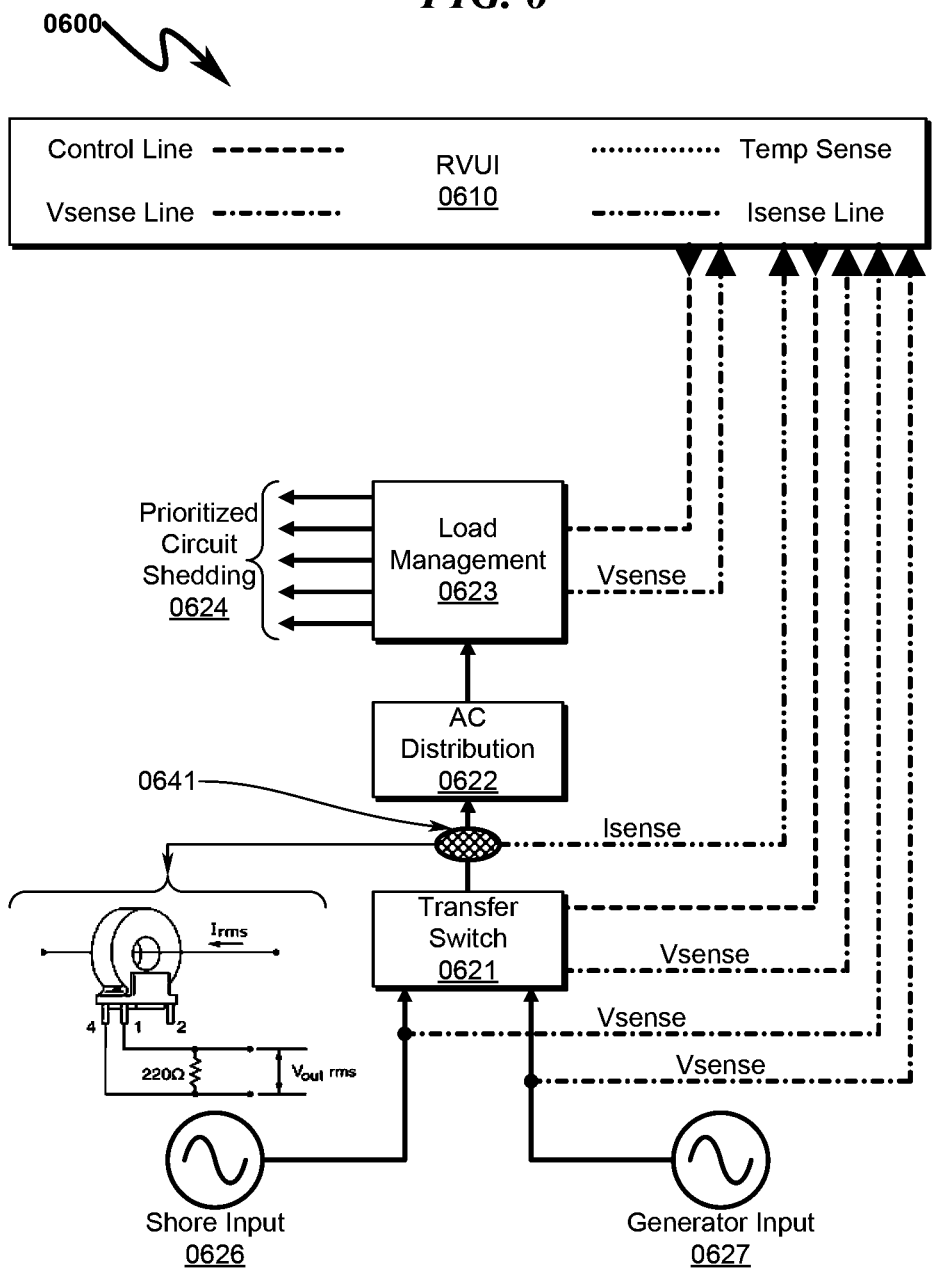
FIG. 6 illustrates a preferred exemplary system embodiment of the present invention as applied to AC power distribution subsystem integration in the context of a recreational vehicle.

The RVUI (0410) depicted in FIG. 4 (0400) may be implemented to control various AC subsystems as generally depicted in FIG. 6 (0600), wherein the RVUI (0610) illustrated supervises a power transfer switch (0621) (distributing power to an AC distribution system (0622)) in addition to a load management subsystem (0623) (which may incorporate a prioritized load shedding mechanism (0624)). In this exemplary configuration, the transfer switch (0621) may select between short AC power input (0626) and generator input (0627) to supply the AC distribution system (0622). As with the DC control/distribution system illustrated in FIG. 5 (0500), AC current sensors (0641) (such as COILCRAFT® model CS60-050L/075L/100L 50/60 Hz Current Sensors or CAMBELL SCIENTIFIC® model CS10/CS15 Current Transformers) may be used to sense current flow throughout the system and thus allow control of the load shedding system (0623) or other subsystems to modulate instantaneous power consumption within the RVEES context.

Load Shedding Monitoring/Control

Priority/Shed Circuit Control (0700)

Figure 7:
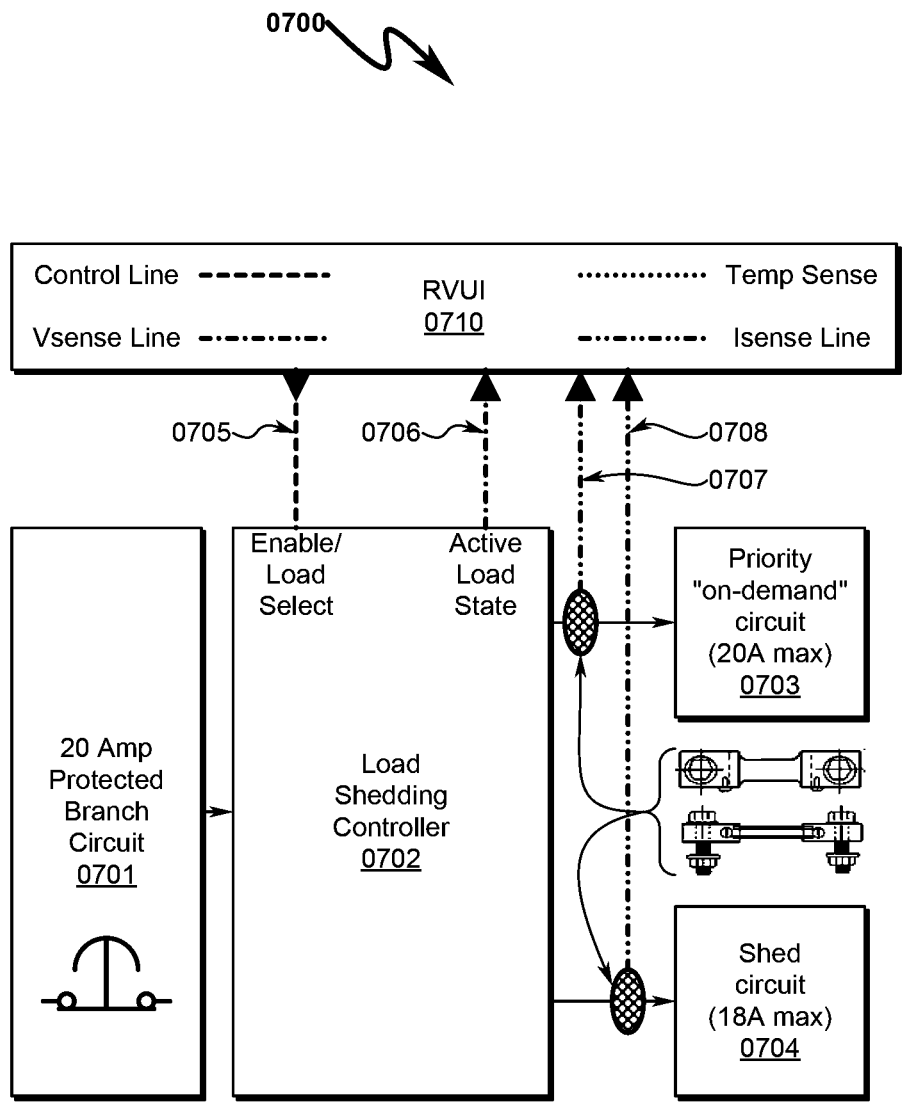
FIG. 7 illustrates a preferred exemplary system embodiment of the present invention as applied to priority/shed circuit control by a load shedding controller in the context of a recreational vehicle.

The present invention as depicted in the exemplary embodiment of FIG. 6 (0600) may incorporate a wide variety of load management (0623) subsystems and methodologies. One example of this is generally illustrated in the load shedding example of FIG. 7 (0700), wherein the RVUI (0710) controls the output of a branch circuit (0701) feeding a load shedding controller (0702). In this example, the load shedding controller (0702) is configured to support a "priority" load (0703) and a "shed" circuit (0704) such that the "shed" circuit (0704) is disconnected if and when the "priority" load (0703) demands more power than would normally be available from the breaker protected branch circuit (0701).

Here the load shedding controller may be configured/controlled (0705) by the RVUI (0710) with status information (0706) on the load shedding controller (0702) being provided to the RVUI (0710). The enable/load select control input (0705) in the load shedding controller (0702) may be used to configure the priority level of the load devices (0703, 0704) in this configuration or enable/disable the load shedding behavior of the load shedding controller (0702). The RVUI (0710) may also be configured to sense the respective priority current flow (0707) and shed current flow (0708) via the use of shunts or other current sensing devices.

Priority/Shed Circuit Control (0800)

Figure 8:
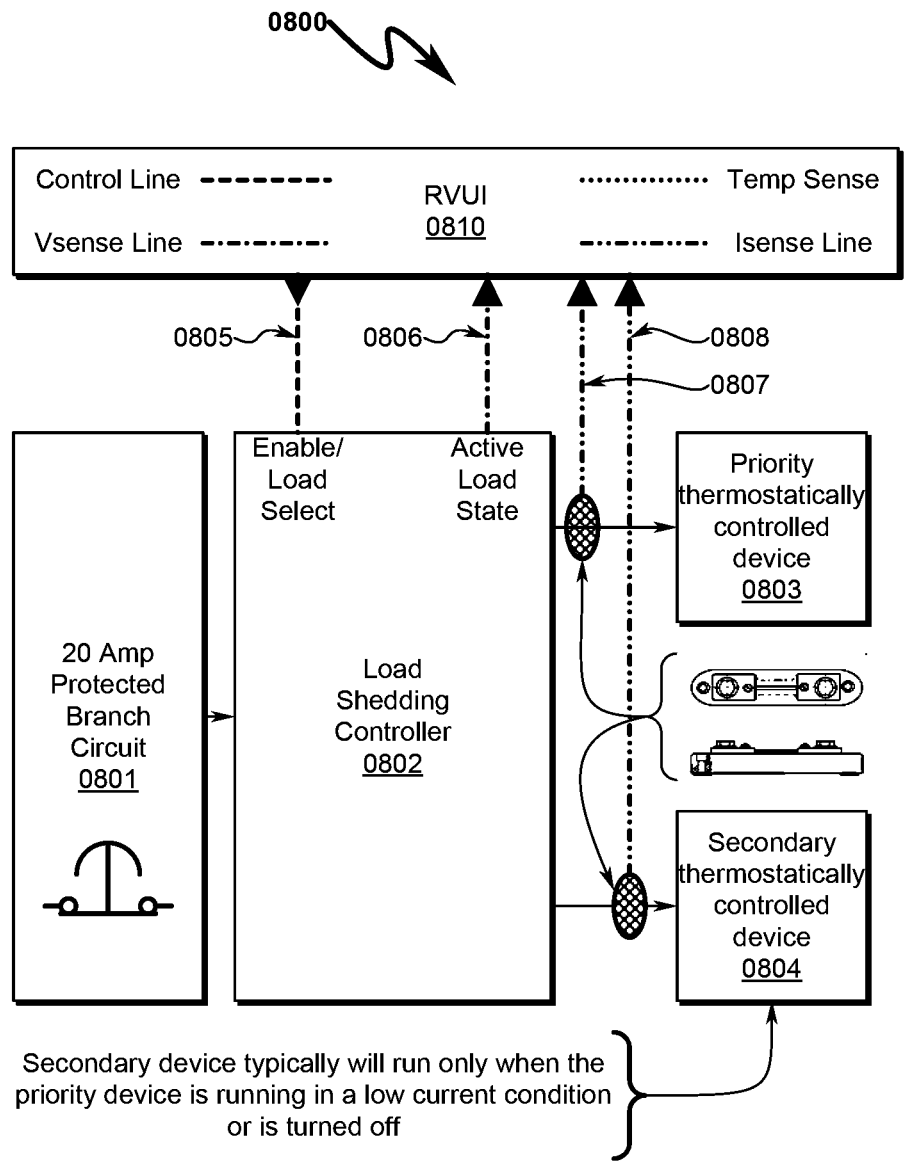
FIG. 8 illustrates a preferred exemplary system embodiment of the present invention as applied to priority/secondary thermostatic load circuit control by a load shedding controller in the context of a recreational vehicle.

Another example of the load management (0623) subsystems and methodologies depicted in FIG. 6 (0600) is generally illustrated in the load shedding example of FIG. 8 (0800), wherein the RVUI (0810) controls the output of a branch circuit (0801) feeding a load shedding controller (0802). In this example, the load shedding controller (0802) is configured to support a "priority" load (0803) and a "secondary" circuit (0804) such that the "secondary" circuit (0804) is disconnected if and when the "priority" load (0803) more than a nominal amount of power from the breaker protected branch circuit (0801). This system configuration is generally applicable to subsystems supporting thermostatically controlled devices that when activated generally consume a majority of the available power from the branch circuit (0801).

Here the load shedding controller may be configured/controlled (0805) by the RVUI (0810) with status information (0806) on the load shedding controller (0802) being provided to the RVUI (0810). The enable/load select control input (0805) in the load shedding controller (0802) may be used to configure the priority level of the load devices (0803, 0804) in this configuration or enable/disable the load shedding behavior of the load shedding controller (0802). The RVUI (0810) may also be configured to sense the respective priority current flow (0807) and shed current flow (0808) via the use of shunts or other current sensing devices.

Exemplary RV Subsystem Integration/Control (0900)

Figure 9:
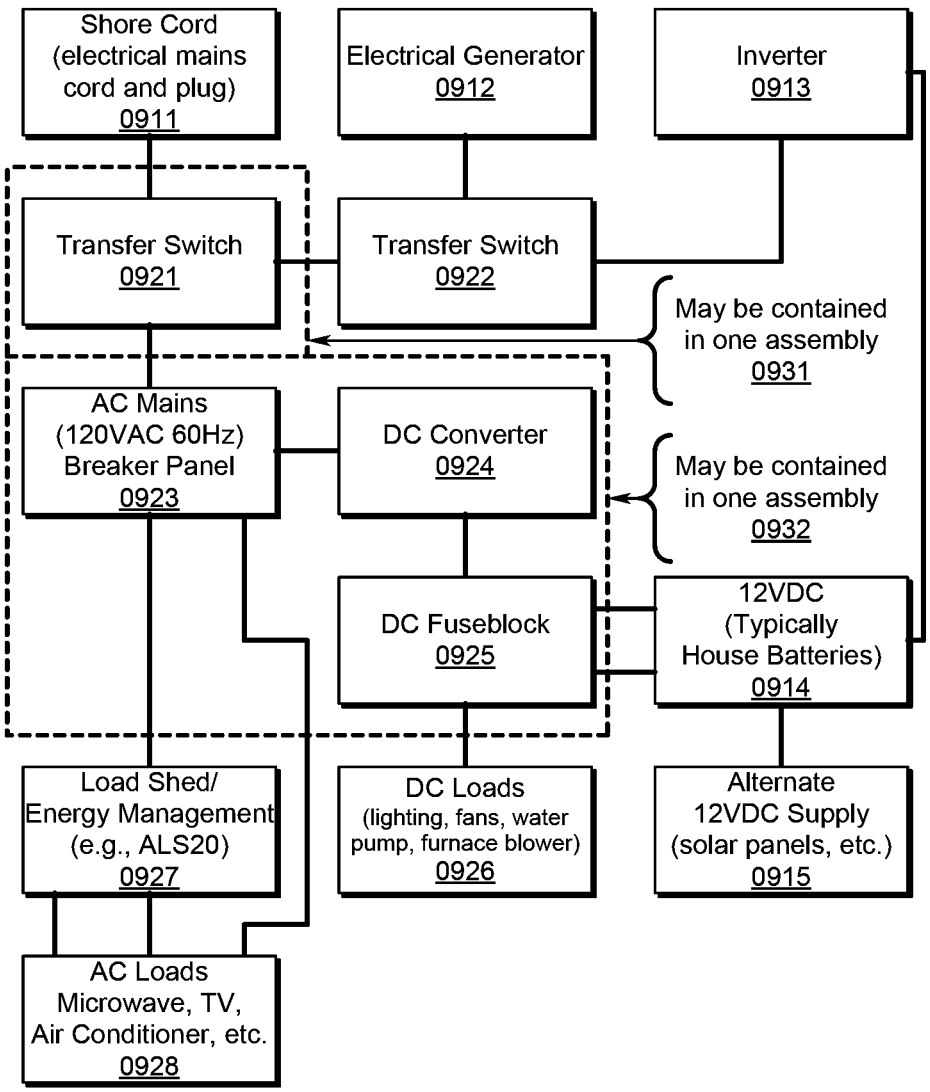
FIG. 9 illustrates an exemplary system block diagram illustrating typical RV electrical/environmental subsystem interactions that may be monitored/controlled using various invention embodiments.

While the present invention may be implemented in a wide variety of RVEES application contexts, an exemplary application context as depicted in FIG. 9 (0900) is typical. Here a variety of power sources such as shore mains (0911), electrical generators (0912), and DC-AC inverters (0913) supplied from 12VDC sources (0914) and/or alternate DC supplies (0915) such as solar cells, etc. are used to supply power to a switching and power distribution network. This switching/power distribution network generally comprises transfer switches (0921, 0922) in conjunction with AC mains breaker panels (0923). The AC mains distribution panel (0923) feeds the AC/DC converter (0924) which in turn powers the DC fuseblock (0925) which support a variety of DC loads (0926) and provides for battery (0914) charging. The AC mains distribution breaker panel (0923) will also generally supply power to a load shedding/energy management subsystem (0927) and/or directly supply a wide variety of AC loads (0928) such as microwave ovens, TVs, air conditioners, etc.

Within this application context a wide variety of components may be utilized, but in several preferred embodiments the transfer switches (0921, 0922) may be configured using PARALLAX MODEL ATS-301 or ATS-501 transfer switches. Additionally, in some embodiments several of these subsystems may be integrated as unitary subsystems, such as in the case of the transfer switches (0931) (as with PARALLAX MODELS 7155A and 7335A) and AC mains distribution (0932) (as with PARALLAX MODELS 7155, 7355, and 555). Examples of preferred load shed devices include but are not limited to the PARALLAX MODEL ALS-20. DC switching between the various subsystem components can be accomplished using a PARALLAX MODEL BR-100 SPDT controlled switch or equivalent.

As previously discussed, each of the depicted subsystems in FIG. 9 (0900) may have associated with it some form of manual display/control system, each of which are incompatible with the remaining subsystems and which are generally spatially localized to the individual subsystem. As generally described in FIG. 2 (0200)-FIG. 8 (0800), the present invention in various embodiments may be configured to monitor/control each of the subsystems depicted in FIG. 9 (0900), providing a uniform and centralized command/control infrastructure for the RVEES.

Exemplary UCSM/CUID Embodiment (1000)-(1200)

Figure 10:
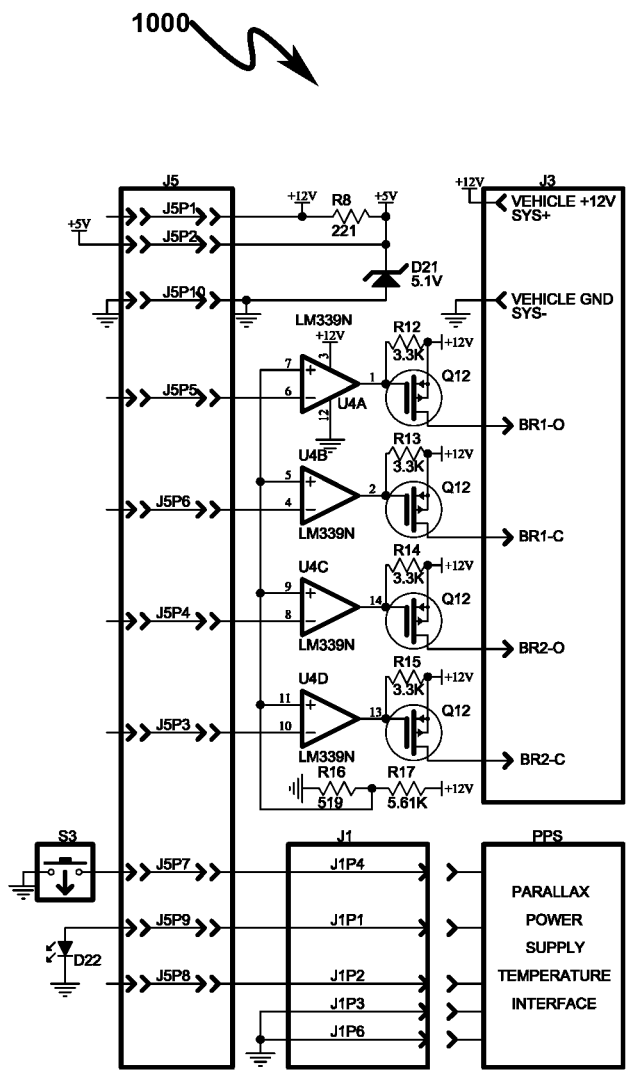
FIG. 10 illustrates an exemplary UCSM invention embodiment.
Figure 11:
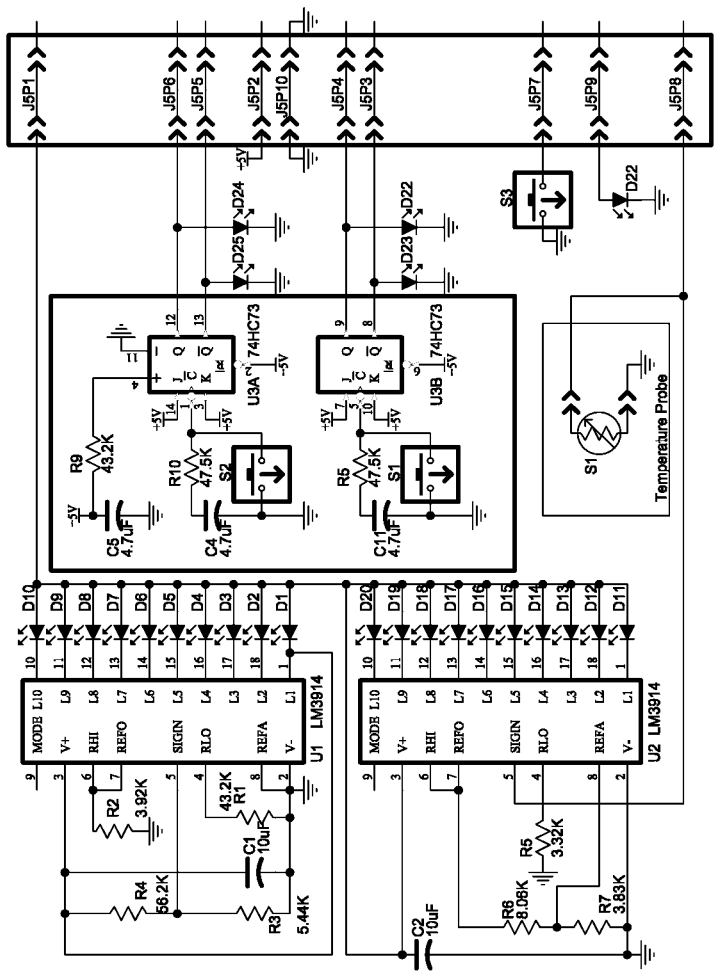
FIG. 11 illustrates an exemplary CUID invention embodiment.
Figure 12:
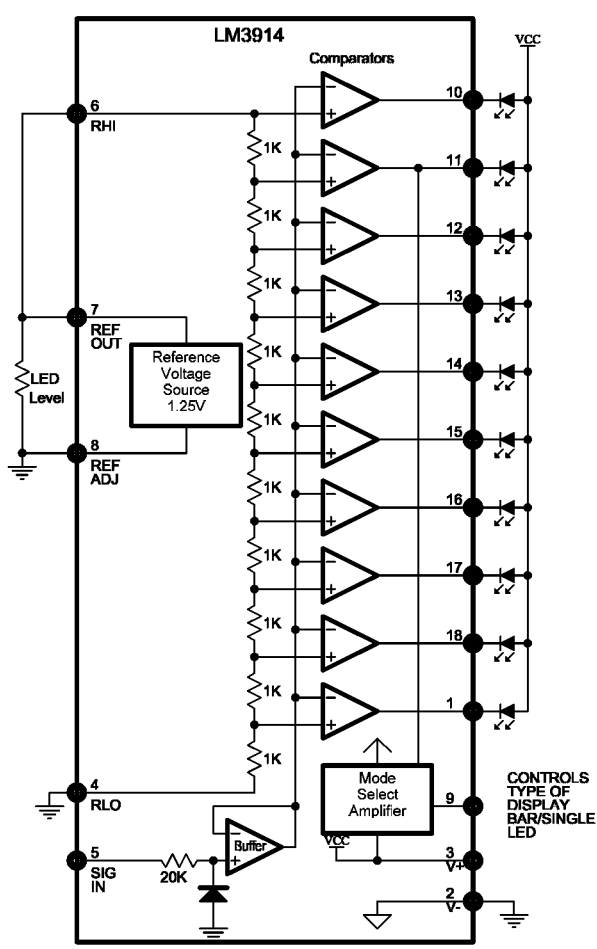
FIG. 12 illustrates an internal schematic of a National Semiconductor LM3914 dot/bar display driver that is useful in implementing some preferred embodiments of the present invention.

While various embodiments and pairings of UCSM/CUID are anticipated by the present invention, an exemplary embodiment of a UCSM is generally illustrated in FIG. 10 (1000) wherein a PARALLAX POWER SUPPLY is interfaced and controlled. The J5 connector provides an interface to the CUID as detailed in FIG. 11 (1100). Various control inputs (S1/S2/S3) in the FIG. 11 (1100) schematic operate with display drivers (U1/U2) to provide the custom user interface. Details of an exemplary LED driver supporting bargraph display (U1/U2) functionality is detailed in FIG. 12 (1200) via the use of a LM3914 integrated circuit.

Exemplary PCB Embodiment (1300)-(1500)

Figure 33:
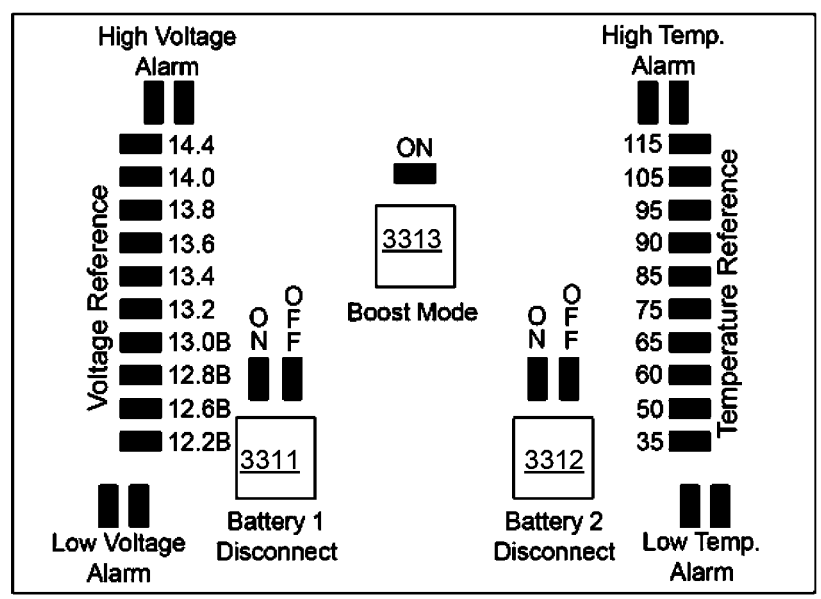
FIG. 33 illustrates a front view of an exemplary custom indicia bezel/panel (CIBP)
Figure 36:
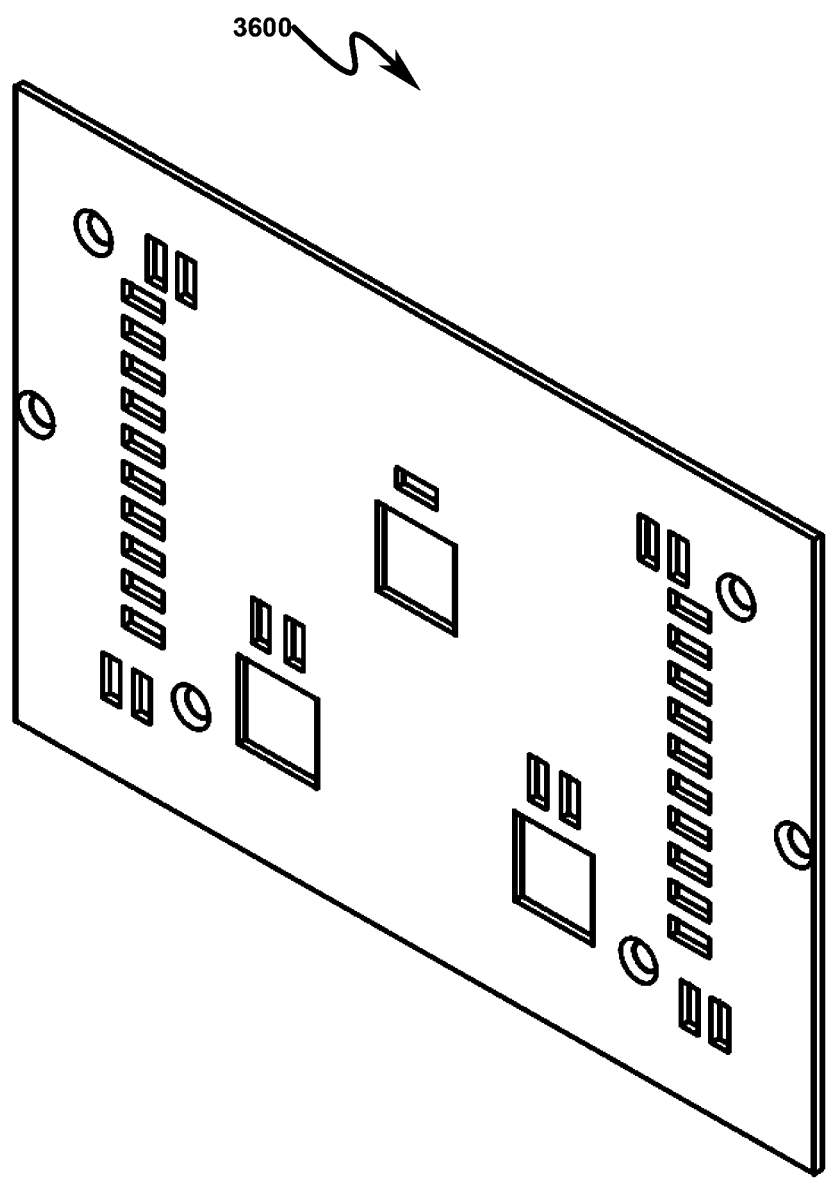
FIG. 36 illustrates a perspective view of an exemplary custom indicia bezel/panel (CIBP) corresponding to the front view of FIG. 33.

While the present invention may be implemented using a wide variety of fabrication techniques, the use of printed circuit board (PCB) technology is preferred. As generally illustrated in the silkscreen layer image of FIG. 13 (1300) and the routing layer images of FIG. 14 (1400) (top) and FIG. 15 (1500) (bottom), this exemplary embodiment optimally utilizes a single fabrication process cycle incorporating a top universal control/sensor motherboard (UCSM) (1310, 1410, 1510) which piggybacks the customizable user interface daughterboard (CUID) (1320, 1420, 1520). For simplicity of illustration, the associated power and ground planes for the PCB fabrication have been omitted in these images. An exemplary custom indicia bezel/panel (CIBP) covering the user interface daughterboard (CUID) (1320, 1420, 1520) is detailed in the mechanical drawing of FIG. 36 (3600) and the graphic text overlay of FIG. 33 (3300).

Exemplary PCB Expansion Capability (1300)-(1500)

Figure 13:
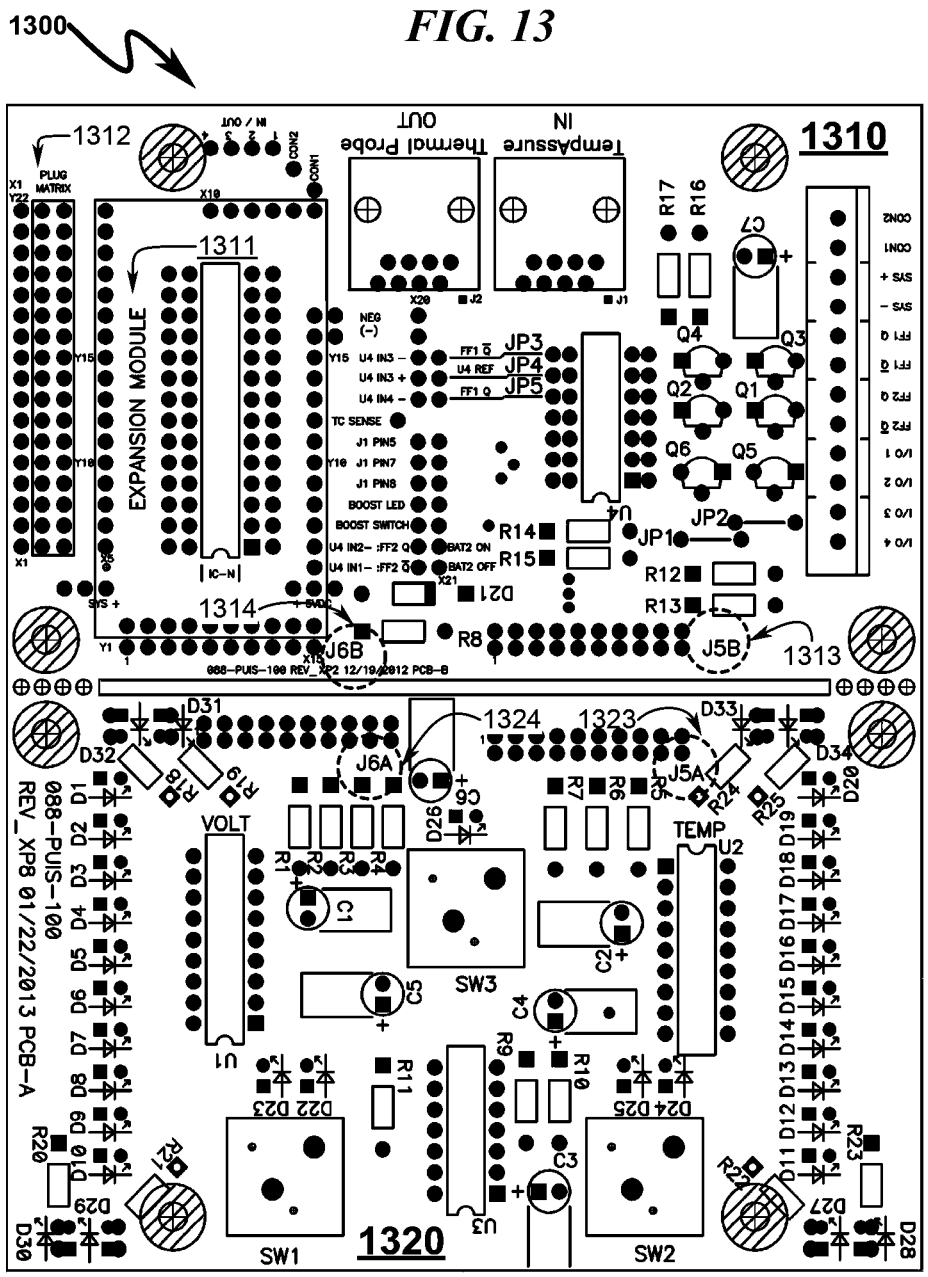
FIG. 13 illustrates an exemplary PCB silkscreen layer image of a preferred exemplary invention embodiment.
Figure 15:
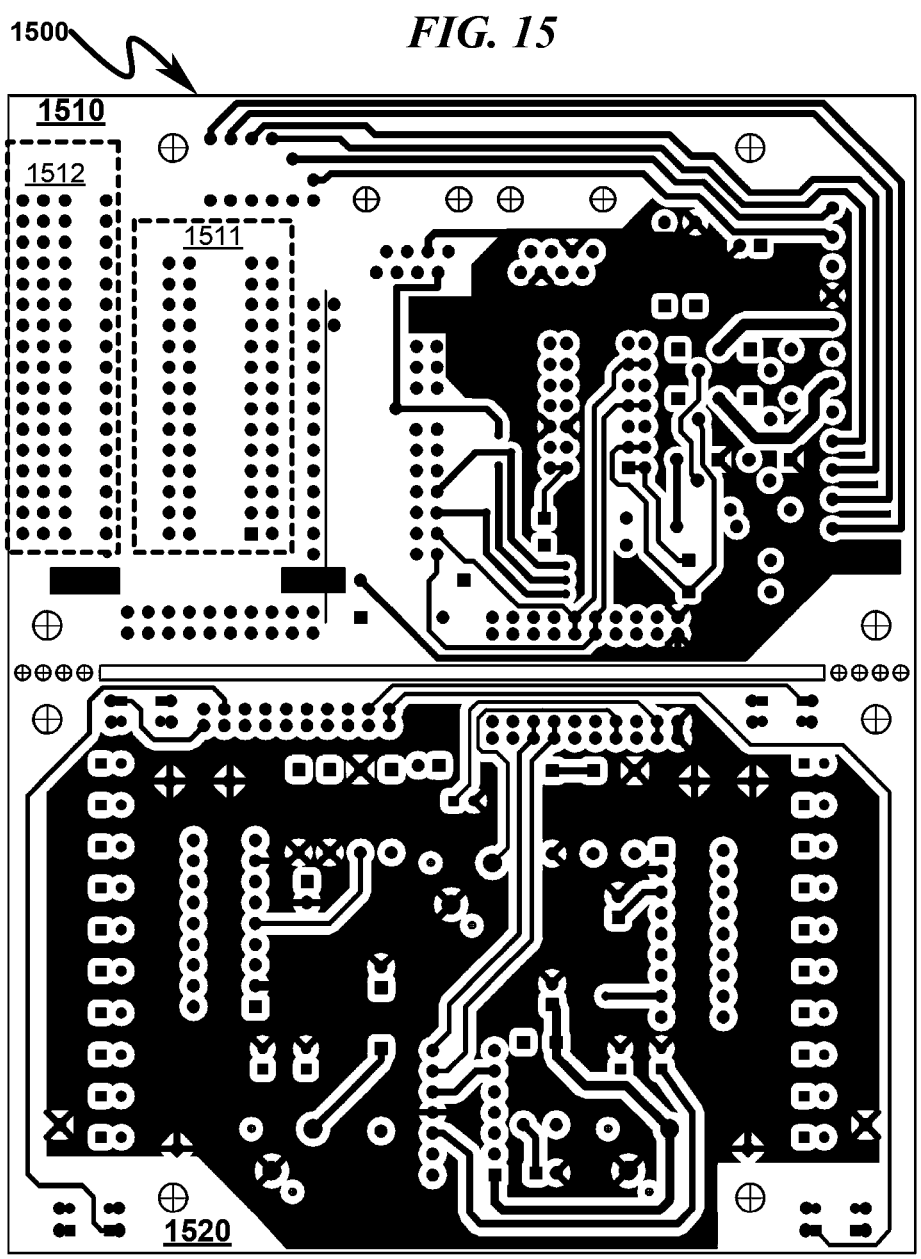
FIG. 15 illustrates an exemplary PCB routing trace bottom layer image of a preferred exemplary invention embodiment.

The exemplary UCSM PCB layouts generally illustrated in FIG. 13 (1300)-FIG. 15 (1500) may be easily be reconfigured in the field to monitor and control all key signal lines provided by a wide variety of RVEES components, including but not limited to the following:

A TempAssure equipped PARALLAX AC to DC converter. These signal lines are provided by the umbilical connection from the TempAssure unit to a modular jack or connection point (J1 in this exemplary embodiment).

System connections for the RV (RVEES) as provided by terminals or other connection means. (J3 in this exemplary embodiment).

A combination of these signal lines, and additional lines as necessary provided from terminals on an expansion module to monitor and control RVEES elements as required.

It should be noted that Q5 and Q6 (FIG. 13 (1300)) may be populated on the exemplary PCB to form an H-bridge switch network. This H-bridge switch network adds the ability for motor control applications or other situations where there is a need to produce a signal in forward or reversed polarity such as in some battery disconnect relays. This is accomplished by FF1 terminals and the I/O 1&2 terminals and jumpers JP1 and JP2 installed. Some higher power applications (such as a slide room motor) may require control relays for current switching.

Figure 14:
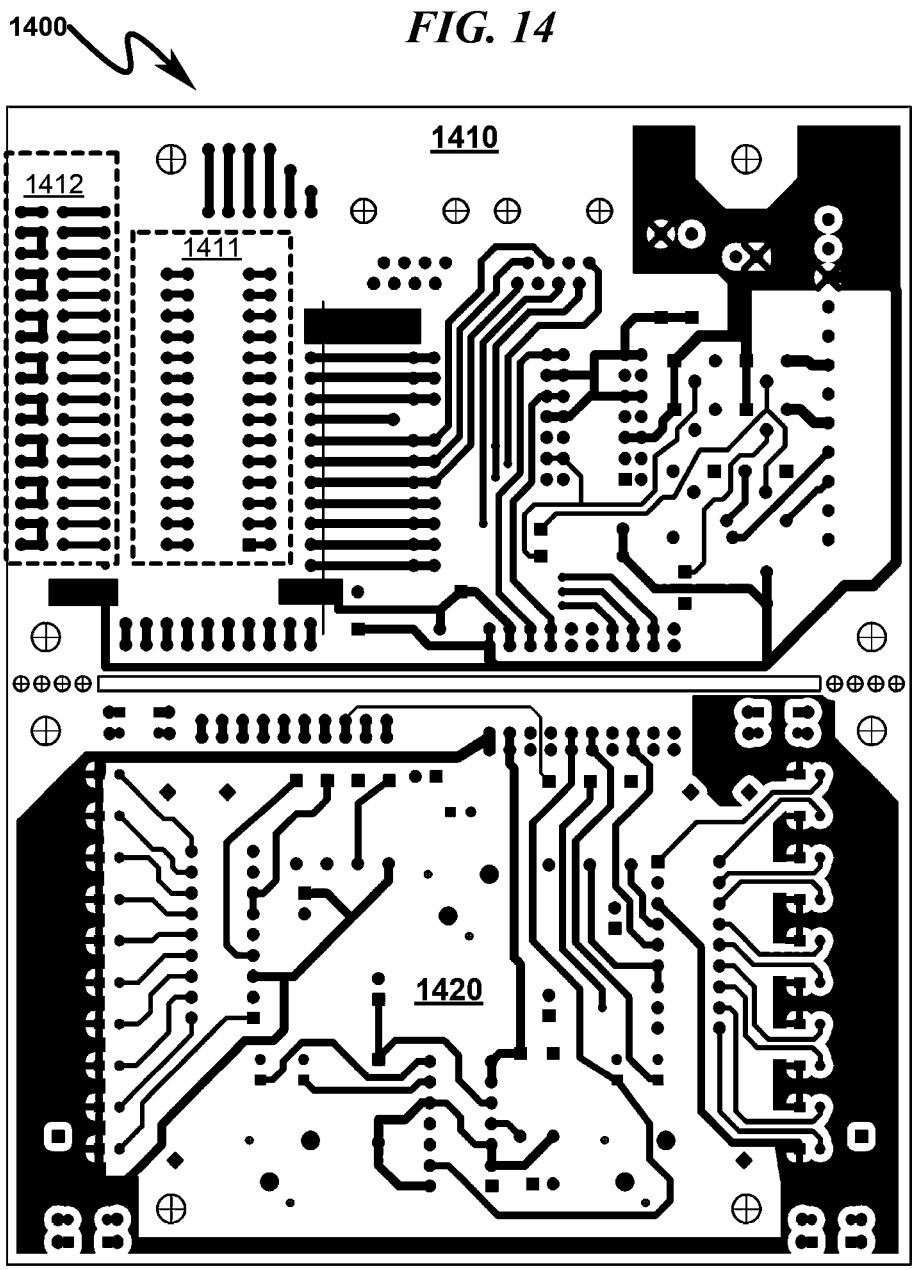
FIG. 14 illustrates an exemplary PCB routing trace top layer image of a preferred exemplary invention embodiment.

The exemplary UCSM PCB (FIG. 13 (1300, 1310), FIG. 14 (1400, 1410), and FIG. 15 (1500, 1510)) may also incorporate an Expansion Module Landing Array (EMLA) (1311, 1411, 1511) as indicated. This area is typically laid out in a Cartesian (X,Y) array for hole identification purposes it is laid out in a 0.100" grid as depicted. The area is intended to accept either soldered-in (current) or pluggable (future) expansion modules. These modules will have access to all I/O channels, TempAssure signal lines, control of the switching outputs FF1 and FF2, all power busses, J6 connection points, and the Plug Matrix (1312, 1412, 1512). There is also additional room here for the placement of one or more ICs (such as a micro controller) allowing for pin access by the expansion module.

The exemplary UCSM PCB (FIG. 13 (1300, 1310), FIG. 14 (1400, 1410), and FIG. 15 (1500, 1510)) may also incorporate a Plug Matrix (1312, 1412, 1512) as indicated. This PCB area is typically a 2×0.100 pin header that allows custom settings to be programmed prior to installation by the use of small shorts used to connect pins either vertically or horizontally. Utilization of this method is shown in the Standard Alarm Module (SAM) schematic (FIG. 27 (2700)) to set alarm features.

The exemplary UCSM PCB (FIG. 13 (1300, 1310), FIG. 14 (1400, 1410), and FIG. 15 (1500, 1510)) may also incorporate a UCSM/CUID jumpers to permit reconfiguration of the interface between the UCSM/CUID. The J5A/B (1313, 1323) and J6A/B (1314, 1324) jumpers provide multiple connection points between CUID/CIBP and UCSM to allow for many configurations and styles as a particular application context may require.

Access to currently undefined pins on J1 on the exemplary PCB depicted also allow for the ability to control additional features of a TempAssure equipped Parallax Power Supply converter system in the future.

The present invention anticipates that the Expansion Module Landing Array (EMLA) may form the basis for an interconnect channel between a number of UCSM modules that are "stacked" and use the EMLA as a common pathway to collect and distribute signaling information to the CUID. The exact methodology of inter-PCB connection may vary but is optimally implemented using standard pin/socket header connectors in many preferred embodiments.

System Expansion Capability

An important feature of the present invention is the capability to expand to other RVEES systems that be added to the RV environment after the RVUI is incorporated into the RV environment. Within this context, PARALLAX® products are anticipated as additional RVEES subsystems, but the present invention is not limited to these particular products.

In its current form, all devices that are not TempAssure equipped converters from Parallax Power Supply are interfaced through a connector (J3 as generally illustrated in FIG. 10 (1000)) and with the possible requirements of additional interface terminals as provided by through an expansion module. Examples of this expansion include but are not limited to:

- All non-TempAssure converters either manufactured by PARALLAX or some other manufacturer will interface (and be provide power for) by connecting to the SYS+ (Positive) and SYS− (Negative) terminals on J3 (FIG. 10 (1000)). This will power the user interface, as well as provide the voltage signal for the voltage meter portion of the interface. This voltage is considered to be the system voltage in most embodiments, and will be used to determine functions based on system voltage levels (i.e. high voltage alarm).
- Automatic Transfer Switches and Energy Management Devices. These type of devices from any manufacturer currently must be hard wired from a sensing device or direct connection at the device or device cabling to the I/O lines of the UCSM or additionally the UCSM expansion module (such as in the power monitoring set up of an automatic transfer switch which is illustrated as requiring 12 I/O lines, the additional termination points would be made available as part of the expansion module). As PARALLAX (or other RVEES) products evolve, the present invention anticipates that they may include design-in functionality to devices allowing them to more directly integrate with the user interface panel. The interfacing techniques shown in the Transfer Switch Integration drawing (FIG. 28 (2800), FIG. 29 (2900)) would be common for many high voltage or high current devices in the RVEES.
- Low voltage or signal level inputs may be wired directly to I/O terminals on the USCM or USCM module. This would include most low power 12VDC devices or signals obtained from storage tank probes for example.

One skilled in the art will recognize that by providing the expansion module landing array and plug matrix the UCSM permits incorporation of additional sensing/control functions to the RVEES environment without major hardware modifications to the RVUI.

Three-State Battery Charging Stages and Methods

The present invention teaches within the context of the overall system implementation an advanced battery charging method useful in charging batteries that service components of the RVEES. This advanced charging method is an improvement on existing prior art battery charging techniques. The prior art teaches that optimal battery charging can be accomplished using a three-state charging method, the states/stages being generally described as BULK, ABSORPTION, and FLOAT charging as described below.

BULK Charging Stage

The primary purpose of a battery charger is to recharge a battery. This first stage is typically where the highest voltage and amperage the charger is rated for will actually be used. The level of charge that can be applied without overheating the battery is known as the battery's natural absorption rate. For a typical 12 volt AGM battery, the charging voltage going into a battery will reach 14.6-14.8 volts, while flooded batteries can be even higher. For the GEL battery, the voltage should be no more than 14.2-14.3 volts. If the charger is a 10 amp charger, and if the battery resistance allows for it, the charger will put out a full 10 amps. This charging stage will recharge batteries that are severely drained. There is no risk of overcharging in this stage because the battery hasn't even reached full yet.

ABSORPTION Charging Stage

Prior art "smart" chargers will detect voltage and resistance from the battery prior to charging. After reading the battery the charger determines which stage to properly charge the battery. Once the battery has reached approximately 80% state of charge, the charger will enter the absorption stage. At this point most chargers will maintain a steady voltage, while the amperage declines. The lower current going into the battery safely brings up the charge on the battery without overheating it.

This stage takes more time. For instance, the last remaining 20% of the battery takes much longer when compared to the first 20% during the bulk stage. The current continuously declines until the battery almost reaches full capacity.

FLOAT Charging Stage

Some chargers enter float mode as early as 85% state of charge but others begin closer to 95%. Either way, the float stage brings the battery all the way through and maintains the 100% state of charge. The voltage will taper down and maintain at a steady 13.2-13.4 volts, which is the maximum voltage a 12 volt battery can hold. The current will also decrease to a point where it's considered a trickle. That's where the term "trickle charger" comes from. It's essentially the float stage where there is charge going into the battery at all times, but only at a safe rate to ensure a full state of charge and nothing more. Most smart chargers do not turn off at this point, yet it is completely safe to leave a battery in float mode for months to even years at a time.

Summary

While these prior art charging methods are theoretically capable of maintaining optimal battery charge levels, they suffer from practical limitations on how the battery charge level is to be determined in a working electrical system. The present invention solves these issues by implementing a multi-state charging system utilizing time, unloaded battery voltage measurements, and boosted battery charging to optimally charge a battery on a continuous basis.

Exemplary RV Multi-State Charging Method (1600)

Figure 16:
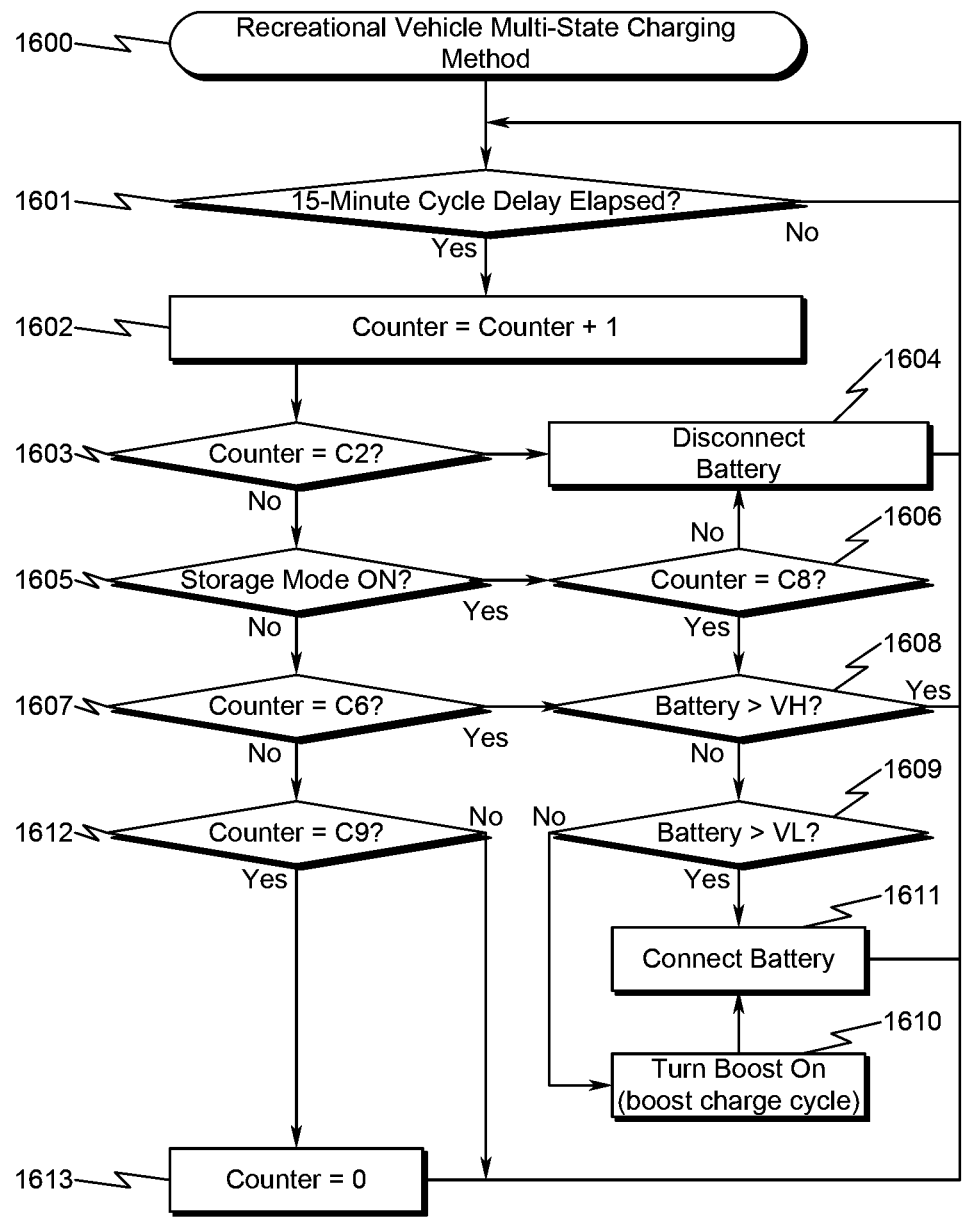
FIG. 16 illustrates an exemplary flowchart depicting a RV multi-state battery charging method useful in some preferred invention embodiments.

As generally depicted in FIG. 16 (1600), the present invention may incorporate a multi-state charging control method to optimize the lifespan of a battery monitored and/or controlled by the overall RV user interface. This RV multi-state charging method utilizes a system embodiment of the present invention to monitor the battery voltage and based on timing parameters generated by the system, initiates a variety of charging cycles for the battery to ensure maximum battery availability and useful life. This RV multi-state charging method may generally be described in terms of the following steps:

(1) determining if a cycle delay has elapsed, and if not, proceeding to step (1) (1601);
(2) incrementing a counter (1602);
(3) determining if the counter value is equal to a preset count parameter C2 (nominally 2), and if not, proceeding to step (5) (1603);
(4) disconnecting the battery and proceeding to step (1) (1604);
(5) determining if battery storage mode is enabled, and if not, proceeding to step (7) (1605);
(6) determining if the counter value is equal to a preset count parameter C8 (nominally 8), and if so, proceeding to step (8), otherwise proceeding to step (4) (1606);
(7) determining if the counter value is equal to a preset count parameter C6 (nominally 6), and if not, proceeding to step (12) (1607);
(8) determining if the battery voltage is greater than a predetermined upper voltage VH (nominally 12.7V), and if so, proceeding to step (1) (1608);
(9) determining if the battery voltage is greater than a predetermined lower voltage VL (nominally 12.5V), and if not, proceeding to step (11) (1609);
(10) enabling battery boost charging (1610);
(11) connecting the battery to the charger and proceeding to step (1) (1611);
(12) determining if the counter value is equal to a preset count parameter C9 (nominally 9), and if not, proceeding to step (1) (1612); and
(13) resetting the counter value to zero and proceeding to step (1) (1613).

One skilled in the art will recognize that these method steps may be augmented or rearranged without limiting the teachings of the present invention. This general method summary may be augmented by the various elements described herein to produce a wide variety of invention embodiments consistent with this overall design description.

It should also be noted that the specific counter values and battery voltages depicted in this flowchart are only representative of a wide variety of combinations possible, and may be applied to various battery chemistries on a customized basis. The 12.7V battery voltage generally indicates a threshold wherein the battery should not be charged further. The 12.5V battery voltage generally indicates a decision point between a normal charge (>12.5V) or a boost charge (<12.5V). The counter values indicated are only indicative of typical timing for this control loop and are not necessarily fixed at the values indicated in all invention applications.

Exemplary RV Multi-State Charging Decision Tree Method (1700)

Figure 17:
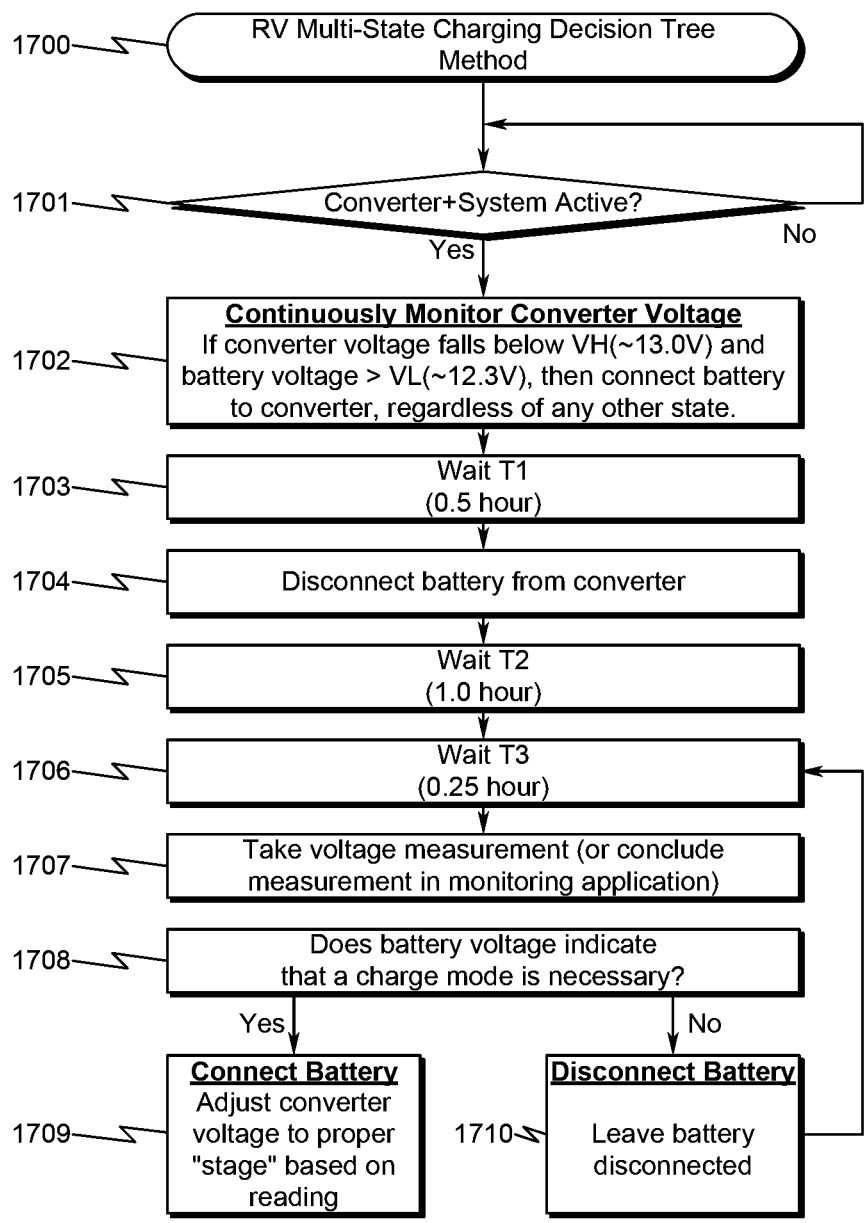
FIG. 17 illustrates an exemplary flowchart depicting a RV multi-state battery charging decision tree method useful in some preferred invention embodiments.

The RV multi-state charging method depicted in the flowchart of FIG. 16 (1600) may also be more generally described in terms of a pseudo-code decision tree as depicted in FIG. 17 (1700). Within this context, the decision tree method associated with the multi-state charging method may be described in terms of the following steps:

(1) determine if the battery charge converter and the load system are both active, and if not, proceeding to step (1) (1701);
(2) continuously monitor the converter voltage and if the converter voltage falls below an upper threshold VH (13.0V nominal) and the battery voltage is greater than a lower threshold VL (12.3V nominal), then connect the battery to the battery charge converter regardless of any other state (1702);
(3) wait a first time period T1 (nominally 0.5 hour) (1703);
(4) disconnect the battery from the charge converter (1704);
(5) wait a time period T2 (nominally 1.0 hour) (1705);
(6) wait a time period T3 (nominally 0.25 hour) (1706);
(7) measure the battery voltage (or conclude measurement in monitoring application) (1707);
(8) determine if the measured battery voltage indicates a charge mode is necessary, and if so, proceeding to step (10) (1708);
(9) connect the battery to the converter system and adjusting the converter voltage to the proper battery charging stage based on the measured battery voltage (1709); and

(10) disconnecting the battery from the converter and proceed to step (6) (1710).

One skilled in the art will recognize that these method steps may be augmented or rearranged without limiting the teachings of the present invention. This general method summary may be augmented by the various elements described herein to produce a wide variety of invention embodiments consistent with this overall design description.

It should also be noted that the specific voltage thresholds and timer values depicted in this flowchart are only representative of a wide variety of combinations possible.

Exemplary POWER SUPPLY Application (1800)-(2100)

Figure 18:
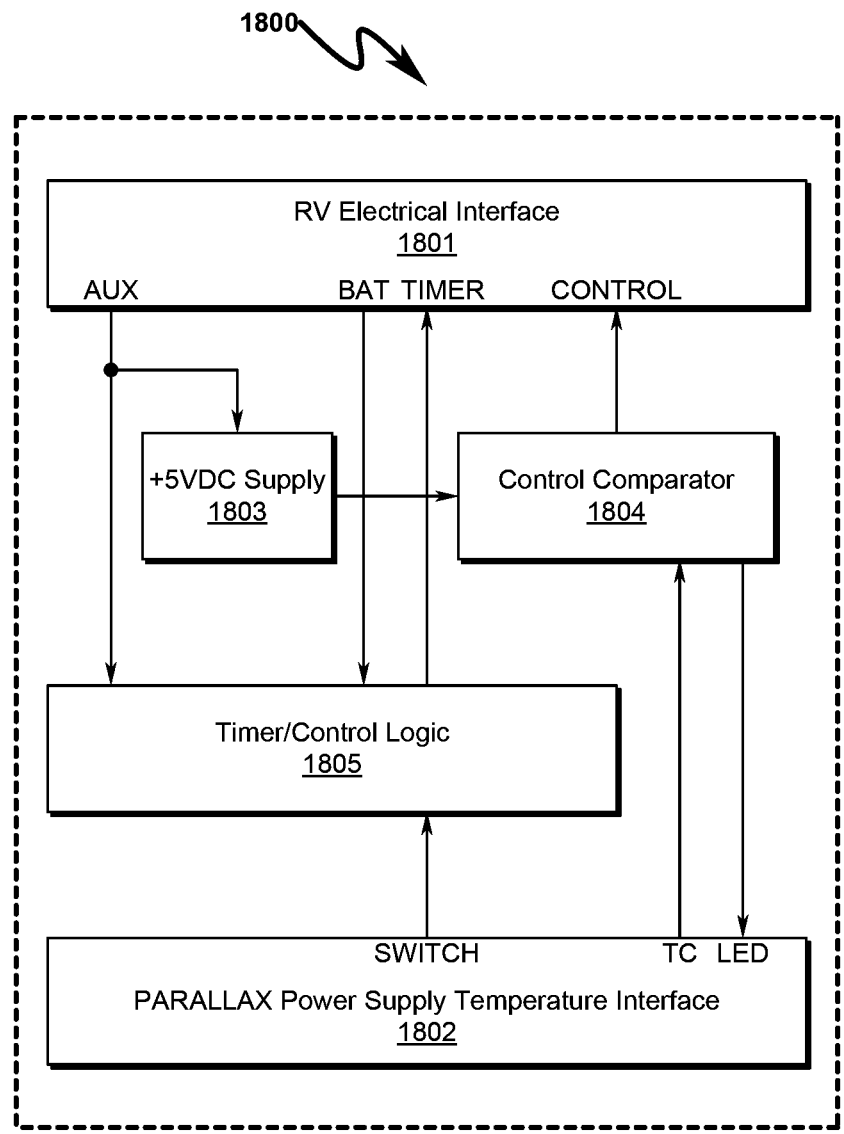
FIG. 18 illustrates an exemplary system block diagram of an implementation of an exemplary invention embodiment interfaced to a PARALLAX POWER SUPPLY.
Figure 21:
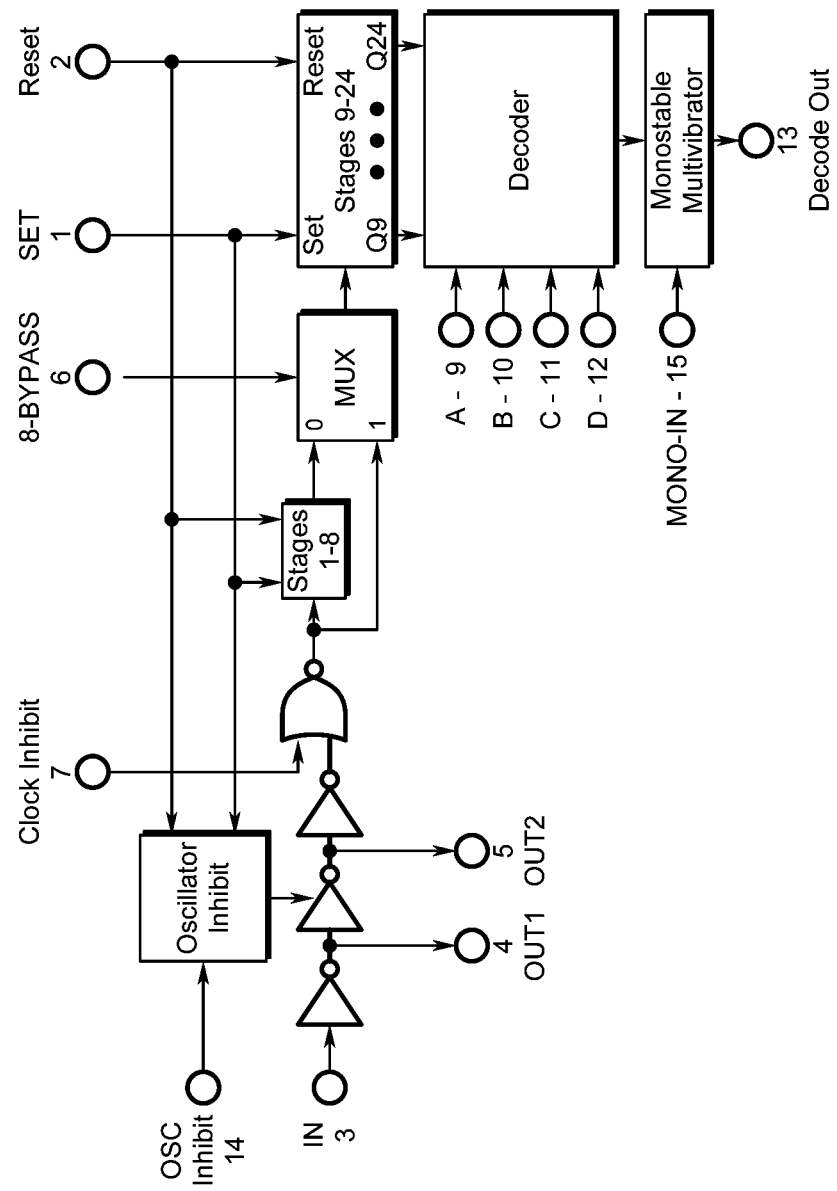
FIG. 21 illustrates an exemplary counting circuit (MC14536B) useful in implementing some timing functions within a variety of preferred exemplary invention embodiments.

An example of the present invention as interfaced to a PARALLAX POWER SUPPLY is generally illustrated in FIG. 18 (1800)-FIG. 21 (2100). Referencing FIG. 18 (1800), the RV electrical interface (1801) may incorporate AUX/BAT power and TIMER as well as CONTROL lines. The PARALLAX POWER SUPPLY (1802) interface comprises SWITCH, TC (temperature), and LED signal lines as depicted elsewhere in FIG. 10 (1000) and FIG. 11 (1100). This POWER SUPPLY may be supported by a 5VDC power supply (1803) and controlled by control comparator (1804) circuitry and timer/control logic (1805).

The CONTROL line in this context may be configured to send a signal to a PARALLAX® converter which ultimately influences the PWM control to increase the output voltage slightly (this would typically be the quick charge function). This influence of the PWM may not always be accomplished in the same manner in all PARALLAX® converter products, however the process is the same in that the signal from the CONTROL line influences the PWM to produce a higher voltage for faster charging. The length of time is controlled by the timer within the TempAssure module. Some embodiments may allow manual control of this function. In general the TempAssure circuitry will be allowed to operate only when there is power at the input stage of the converter. In other PARALLAX® converter models this signal may be gated high, by other means. The AUX line is a secondary power circuit internal to a PARALLAX® converter used for secondary system control circuits. This is the main supply voltage for the TempAssure module. The BATTERY line simply provides a high state to the TempAssure circuits to prevent the timer cycling or restarting by removing and restoring the shore line or generator in quick succession. (i.e., refueling a generator).

Figure 20:
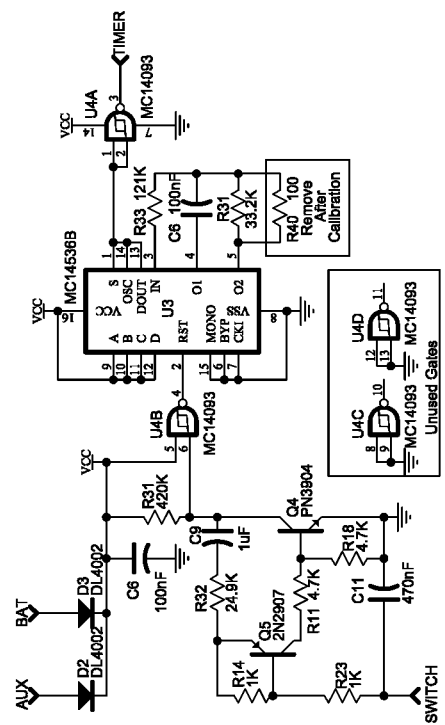
FIG. 20 illustrates an exemplary timer/control logic schematic used in a PARALLAX POWER SUPPLY as interfaced to a preferred invention embodiment.

FIG. 19 (1900) depicts a general form of the 5VDC power supply (1803) and a typical configuration for the control comparator (1804) circuitry, and FIG. 20 (2000) details a typical timer/control logic (1805) configuration within a power supply interfaced to the present invention. FIG. 21 (2100) details more information on the core integrated circuit of the timer/control logic (1805) configuration, optimally selected as a MC14536B.

One skilled in the art will recognize that this typical power supply interface is only exemplary of many interfaces that are possible and that may be monitored/controlled by various embodiments of the present invention as taught herein.

Exemplary Battery Charging Method (2200)

Figure 22:
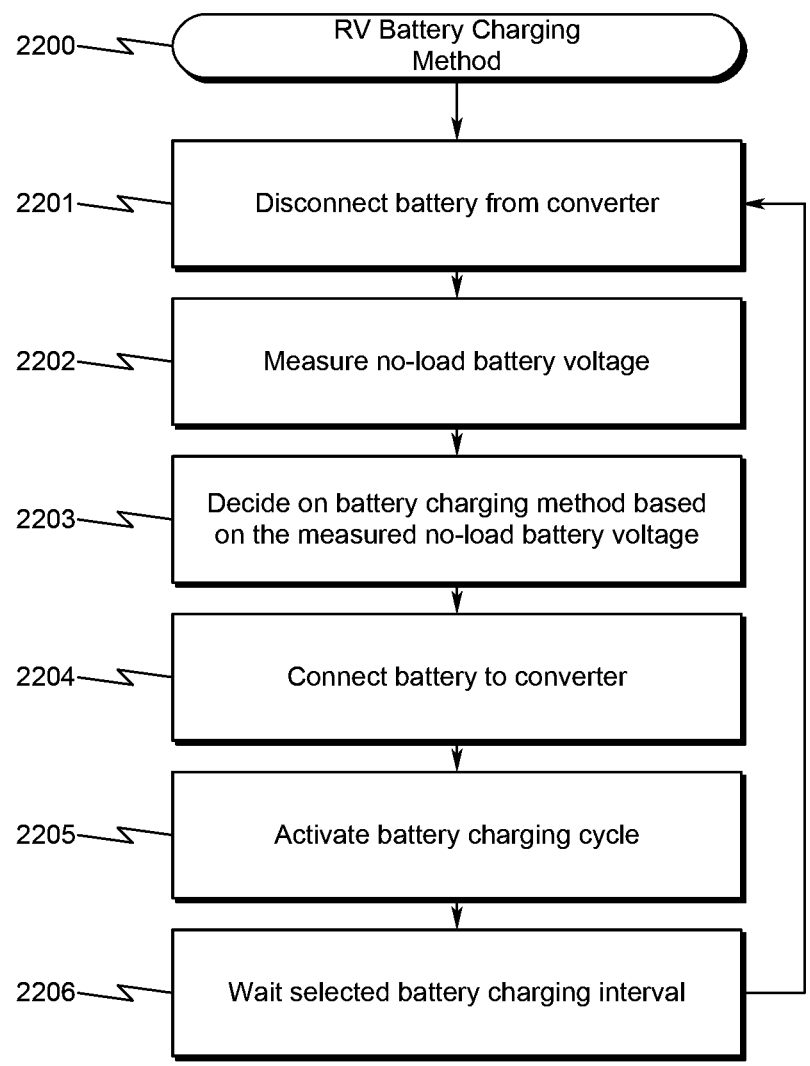
FIG. 22 illustrates an exemplary battery charging method useful in many invention embodiments.

As generally depicted by the flowchart of FIG. 22 (2200), the present invention may optionally implement a battery charging method having the following steps:

(1) disconnecting the battery from the battery charging converter (2201);
(2) measuring the no-load battery voltage (2202);
(3) deciding on a battery charging method based on the measured no-load battery voltage (2203);
(4) connecting the battery to the battery charging converter (2204);
(5) activating the battery charge cycle (2205); and
(6) waiting a selected battery charging interval and then proceeding to step (1) (2206).

One skilled in the art will recognize that these method steps may be augmented or rearranged without limiting the teachings of the present invention. This general method summary may be augmented by the various elements described herein to produce a wide variety of invention embodiments consistent with this overall design description.

Exemplary Recreational Vehicle APX Switching Method (2300)

Figure 23:
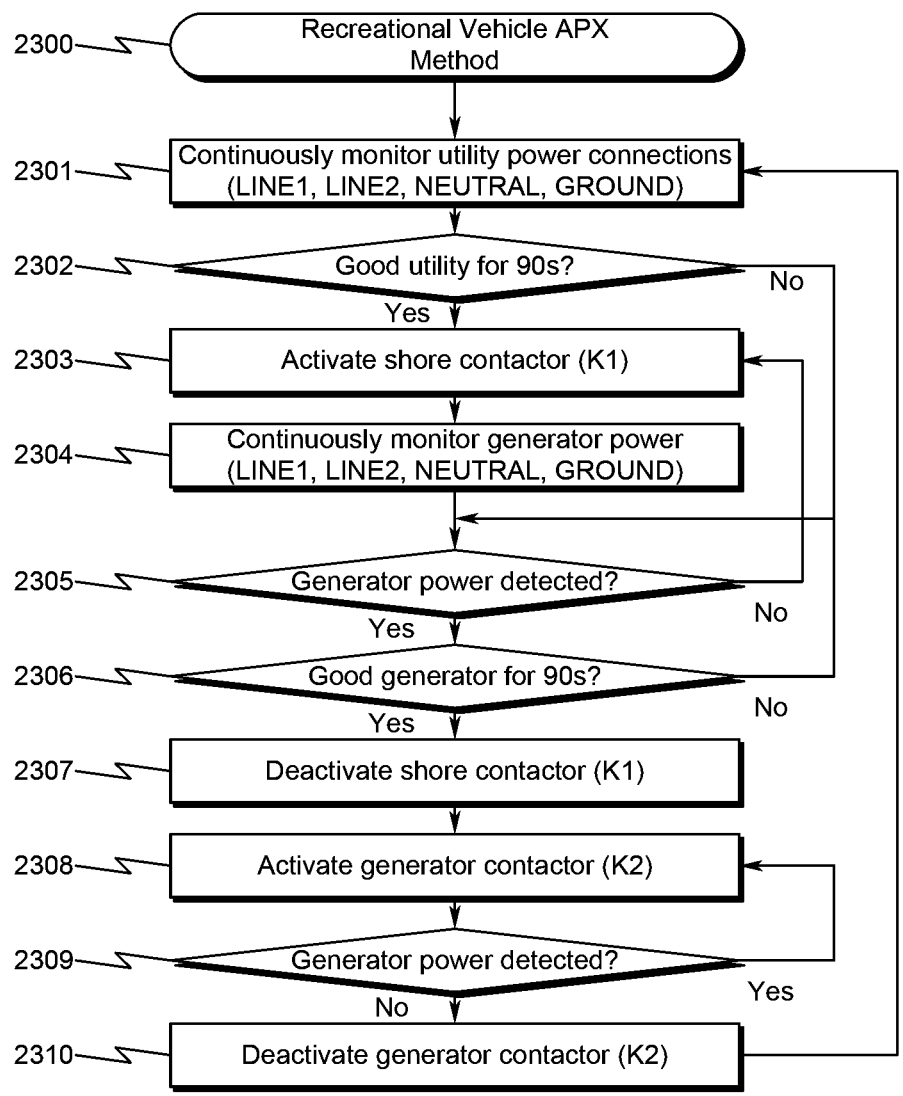
FIG. 23 illustrates an exemplary APX switching method useful in many invention embodiments.

As generally depicted by the flowchart of FIG. 23 (2300), the present invention may optionally implement an APX automatic switching method having the following steps:

(1) continuously monitoring the utility power connection status (LINE1, LINE2, NEUTRAL, GROUND) (2301);
(2) determining if good utility power is detected for approximately 90 s, and if not, proceeding to step (5) (2302);
(3) activating the shore contactor (K1) (2303);
(4) continuously monitoring the generator power connection status (LINE1, LINE2, NEUTRAL, GROUND) (2304);
(5) determining if generator power is detected, and if not, proceeding to step (3) (2305);
(6) determining if good generator power is detected for approximately 90 s, and if not, proceeding to step (5) (2306);
(7) releasing the shore contactor (K1) (2307);
(8) activating the generator contactor (K2) (2308);
(9) determining if generator power is detected, and if so, proceeding to step (8) (2309); and
(10) deactivating the generator contactor (K2) and proceeding to step (1) (2310).

One skilled in the art will recognize that these method steps may be augmented or rearranged without limiting the teachings of the present invention. This general method summary may be augmented by the various elements described herein to produce a wide variety of invention embodiments consistent with this overall design description.

Exemplary User Interface Current Sensor (2400)

Figure 24:
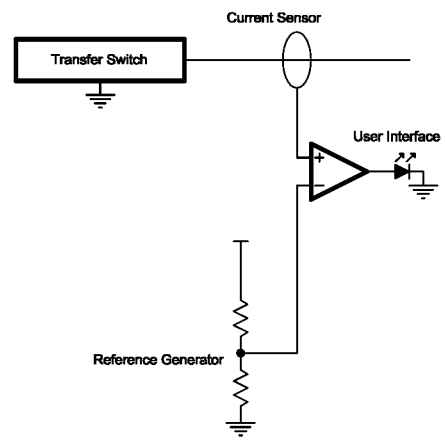
FIG. 24 illustrates an exemplary sensing technology useful in implementing the user interface in several preferred invention embodiments.

While many types of user interface sensing arrangements are possible, the embodiment generally illustrated in FIG. 24 (2400) is preferred in many invention embodiments. Current sensors used in this configuration may be generally seen in FIG. 30 (3000)-FIG. 32 (3200).

Exemplary Multi-State Charging Hardware (2500)-(2600)

Figure 25:
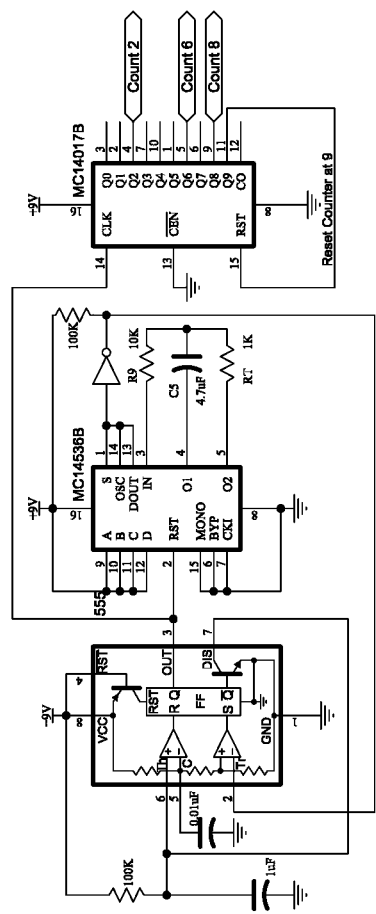
FIG. 25 illustrates an exemplary timing control system useful in implementing several preferred invention embodiments.
Figure 26:
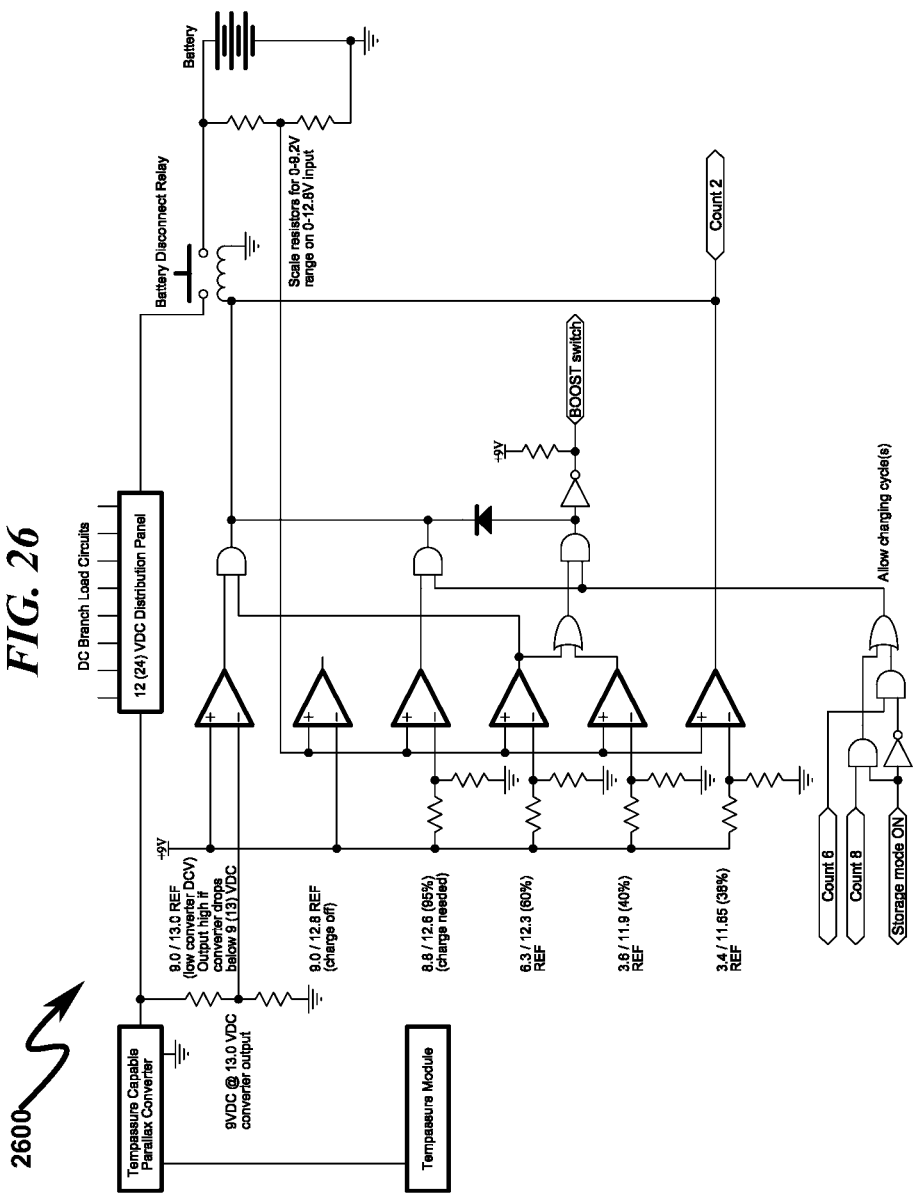
FIG. 26 illustrates an exemplary monitoring and charge activation system useful in implementing several preferred invention embodiments.

While the methods illustrated in FIG. 16 (1600) and FIG. 17 (1700) may be implemented in a wide variety of hardware platforms, an exemplary hardware implementation is generally illustrated in FIG. 25 (2500) and FIG. 26 (2600). FIG. 25 (2500) generally illustrates the timing control for the system and FIG. 26 (2600) generally illustrates the control logic and sensing methodology used to control the battery charging.

Within FIG. 25 (2500) the 555 One Shot advances the counter and resets the timer every 15 minute cycle. The decade counter is used to count 15 minute time segments and activate controls the charging sequence. Additional count positions are available along with cascading of the counter for additional time segments.

Note that this form of battery charging differs from the prior art in that the Battery Disconnect Relay illustrated in FIG. 26 (2600) permits the battery to be disconnected from the power converter to then accurately gauge the no-load battery voltage and then make a decision as to the true battery charge state of the battery.

Exemplary Alarm Indicator Interface (2700)

Figure 27:
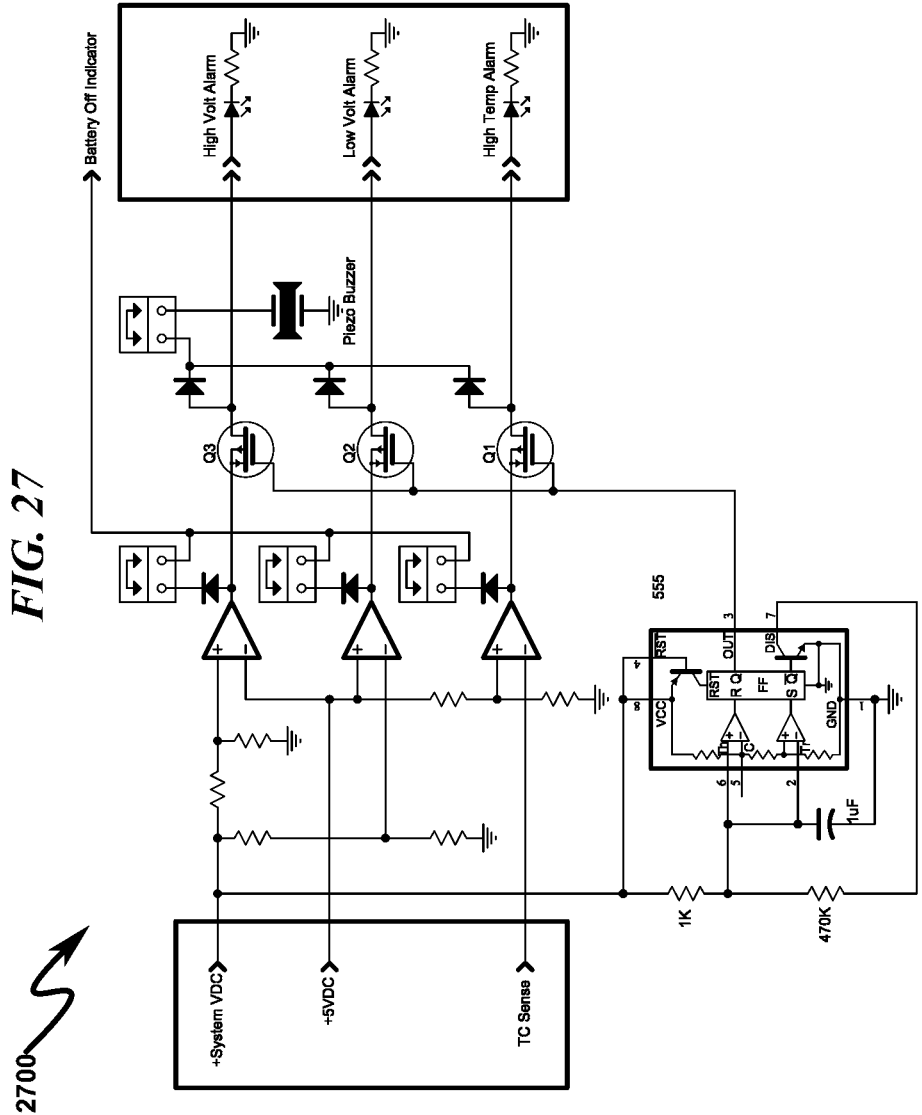
FIG. 27 illustrates an exemplary alarm interface useful in many invention embodiments.

An exemplary alarm indicator interface useful in several preferred invention embodiments is generally illustrated in FIG. 27 (2700). Note that jumpers as illustrated permit configuration of the system to activate the various alarm states, both audible and visual. The 555 timer permits pulsing of the displays/alarms for additional emphasis. Within this context the present invention also anticipates the use of visual alarm and/or audible alarm indicators that are either individually activated or activated in conjunction with visual displays.

Exemplary Utility/Generator Switching Control (2800)-(2900)

Figure 28:
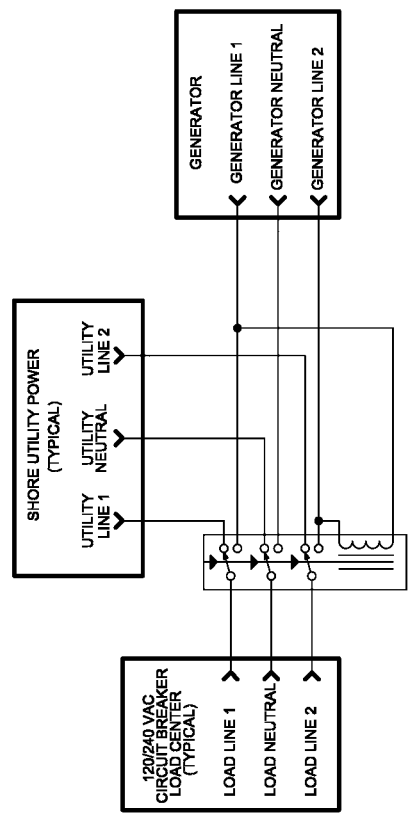
FIG. 28 illustrates an exemplary APX switching system useful in many invention embodiments.

As generally illustrated in FIG. 28 (2800), the system may be configured as depicted to control the crossover from shore utility power to the generator automatically. This diagram depicts an RV automatic transfer switch in its simplest form. Integration with a user interface can range from something as simple as monitoring the generator LINE1 and indicating when the generator is actively on via the panel (CIBP).

Figure 29:
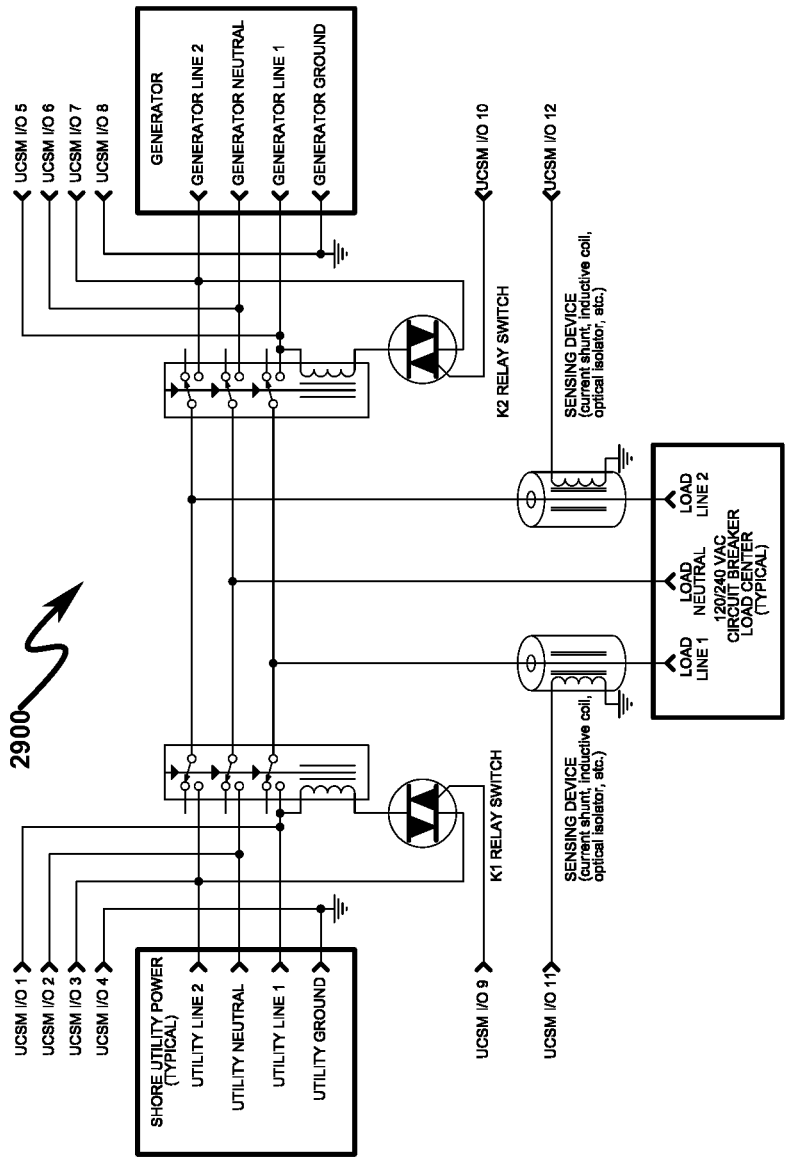
FIG. 29 illustrates an exemplary monitored APX switching system useful in many invention embodiments.

Alternatively, the system may be configured in a more complex form as generally illustrated in FIG. 29 (2900), wherein the transfer switch is contactor based, one for the utility connection and one for the generator connection. Four user interface I/O lines may be used in this configuration to monitor generator LINE1, LINE2, NEUTRAL, and GROUND. In addition, four user interface I/O lines may be used to monitor utility LINE1, LINE2, NEUTRAL, and GROUND at the contactor input.

During shore connections the system may continuously monitor the incoming lines for items including (but not limited to) open connections, improper phasing (polarity), line imbalances (i.e., LINE1=115VAC, LINE2=127VAC), high or low voltage situations, etc. All parameters must be favorable for automatic power exchange 90 seconds prior to switching. Activation of the contactor (K1) is by the user interface gating on the contactor (K1) coil switch (illustrated as a triac but could also be another type of switching device such as a transistor, FET, relay, or combination of devices triggered by a low voltage signal).

When generator power is detected, the lines are monitored as above, as long as all monitored parameters are favorable, the shore contactor (K1) is released. If all monitored parameters remain favorable for APX 90 seconds then the generator contactor (K2) is engaged.

Current sensing on the load lines may be used to display current utilization on the CUID/CIBP.

Exemplary Current Sensing Techniques (3000)-(3200)

Figure 30:
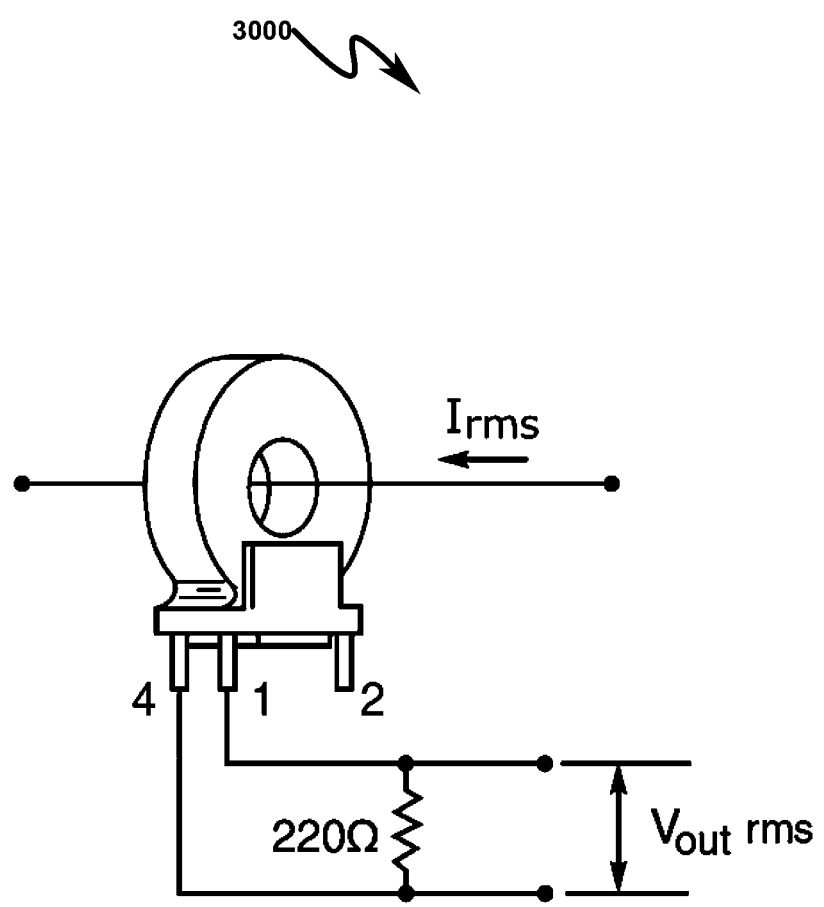
FIG. 30 illustrates a typical schematic overview of an AC current sensor useful in some preferred invention embodiments.
Figure 31:
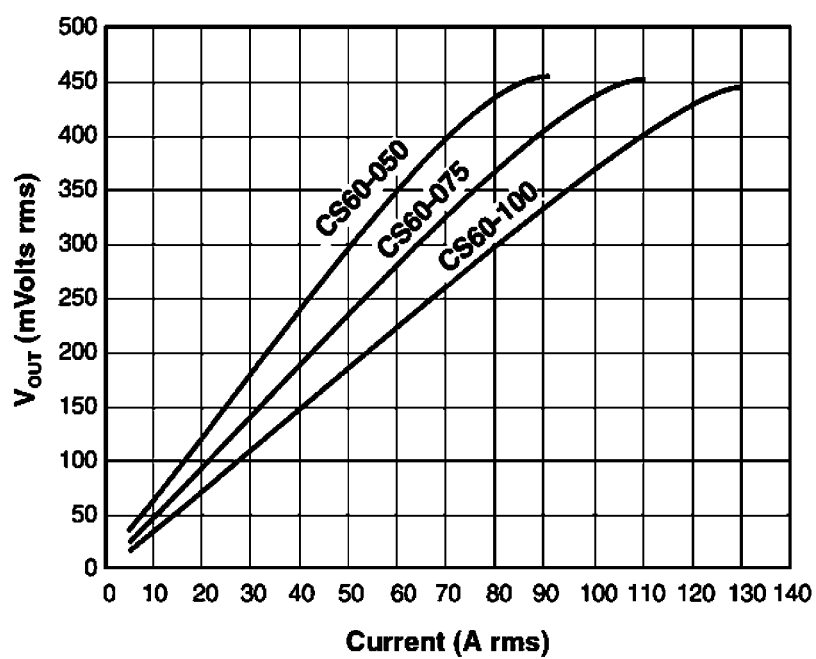
FIG. 31 illustrates a typical performance characteristic of an AC current sensor useful in some preferred invention embodiments.
Figure 32:
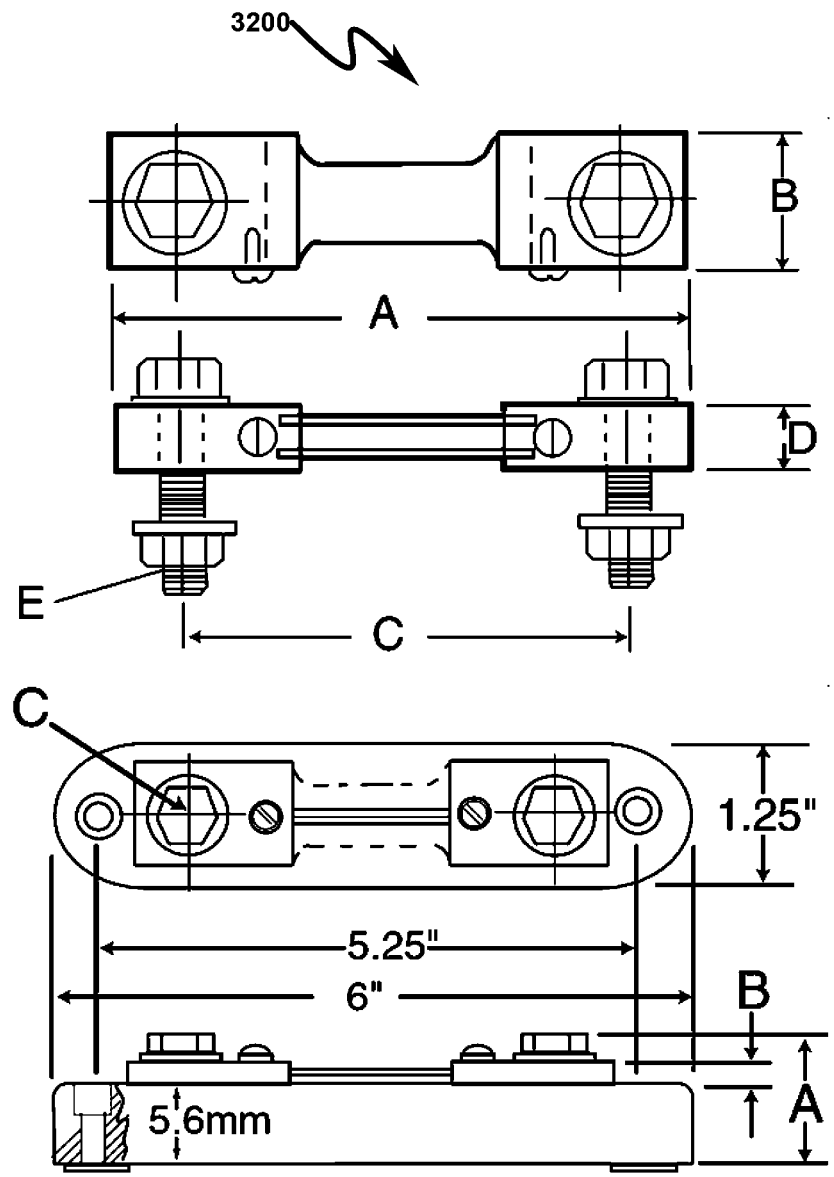
FIG. 32 illustrates a typical mechanical construction of a several shunt sensors useful in some preferred invention embodiments.

While a variety of current sensing technologies may be utilized with respect to the monitoring system described in FIG. 29 (2900), several are preferred. Specifically, the current sensing coils by COILCRAFT® (such as COILCRAFT® model CS60-050L/075L/100L 50/60 Hz Current Sensors or CAMBELL SCIENTIFIC® model CS10/CS15 Current Transformers) as schematically depicted in FIG. 30 (3000) and functionally depicted by the performance characteristics of FIG. 31 (3100) are preferred in many invention embodiments. By corollary, DC current sensing as indicated by shunt sensors described herein may optimally utilized current sensing shunts from SIMPSON® (SIMPSON® External Portable and Switchboard Shunts such as models 06713-06715 (100-200 A); 06500 (100 A); and 06503-06508 (150 A-500 A)) having general mechanical characteristics as generally illustrated in FIG. 32 (3200).

Exemplary Custom Indicia Bezel/Panel (CIBP) (3300)-(3600)

Figure 34:
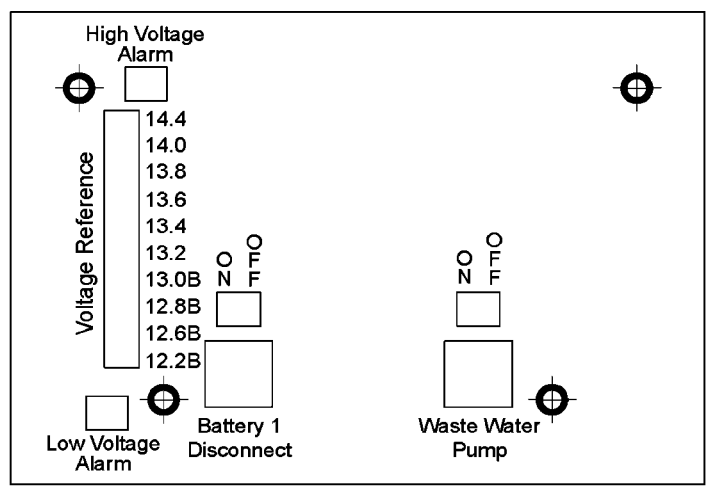
FIG. 34 illustrates a front view of an exemplary custom indicia bezel/panel (CIBP)

Within the context of various implementations of the present invention, a variety of custom indicia bezel/panels (CIBP) may be incorporated into the system to cover the customizable user interface daughterboard (CUID). Exemplary implementations of the CIBP are generally illustrated by the front view of FIG. 33 (3300), alternative front view of FIG. 34 (3400), alternate front view of FIG. 35 (3500), and perspective view in FIG. 36 (3600), wherein the CIBP has support to monitor battery voltages and temperatures and initiate alarms for under/over-voltage and high temperature battery conditions. Provisions for battery disconnection (3311, 3312) and battery boost mode control (3313) are also provided.

Figure 35:
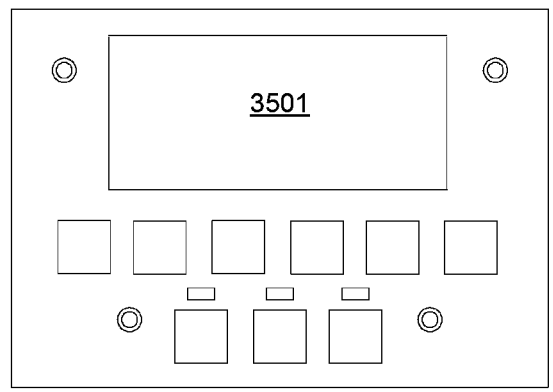
FIG. 35 illustrates a front view of an exemplary LCD custom indicia bezel/panel (CIBP)

FIG. 35 (3500) illustrates a variation of the CUID which may incorporate a LCD display (3501) to integrate status/monitoring/control messages to the user from among the various RVEES components.

Exemplary Preferred Embodiment Assembly (3700)-(4000)

Figure 37:
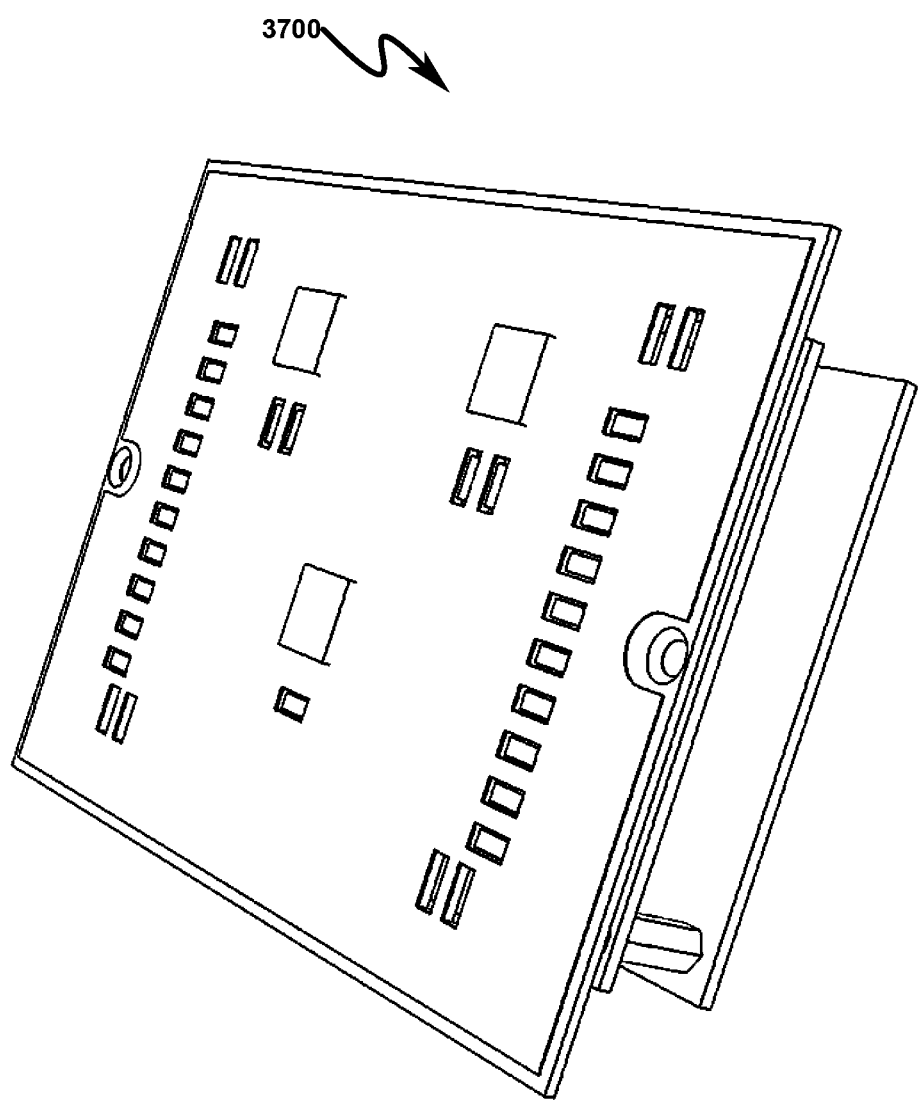
FIG. 37 illustrates a front perspective assembled view of a preferred exemplary embodiment of the present invention.
Figure 38:
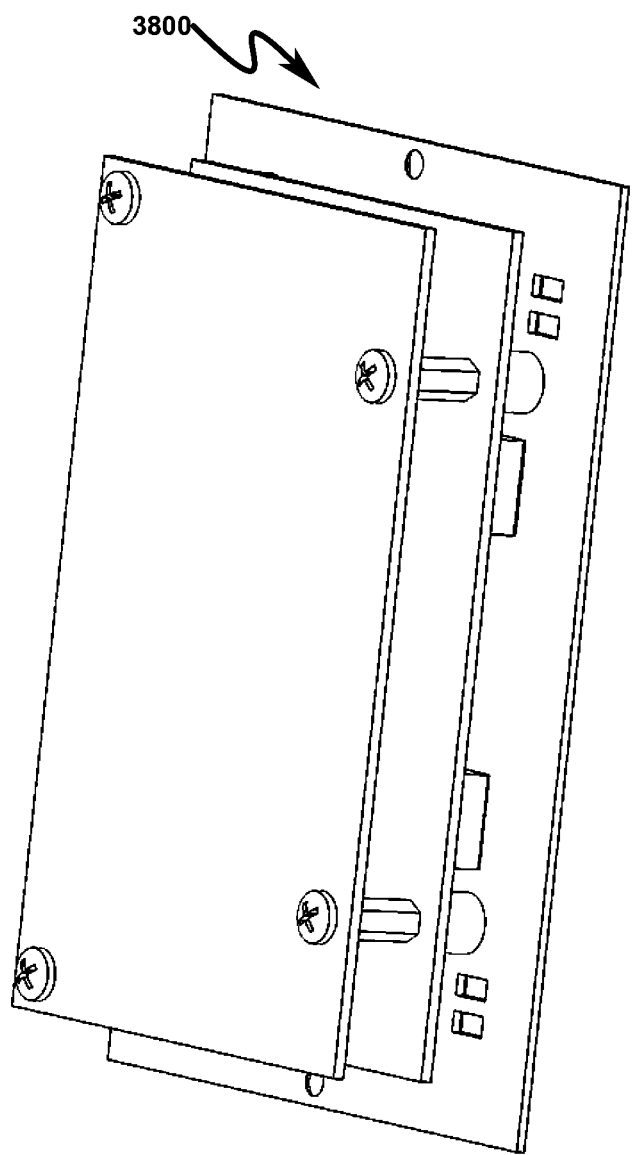
FIG. 38 illustrates a back perspective assembled view of a preferred exemplary embodiment of the present invention.
Figure 39:
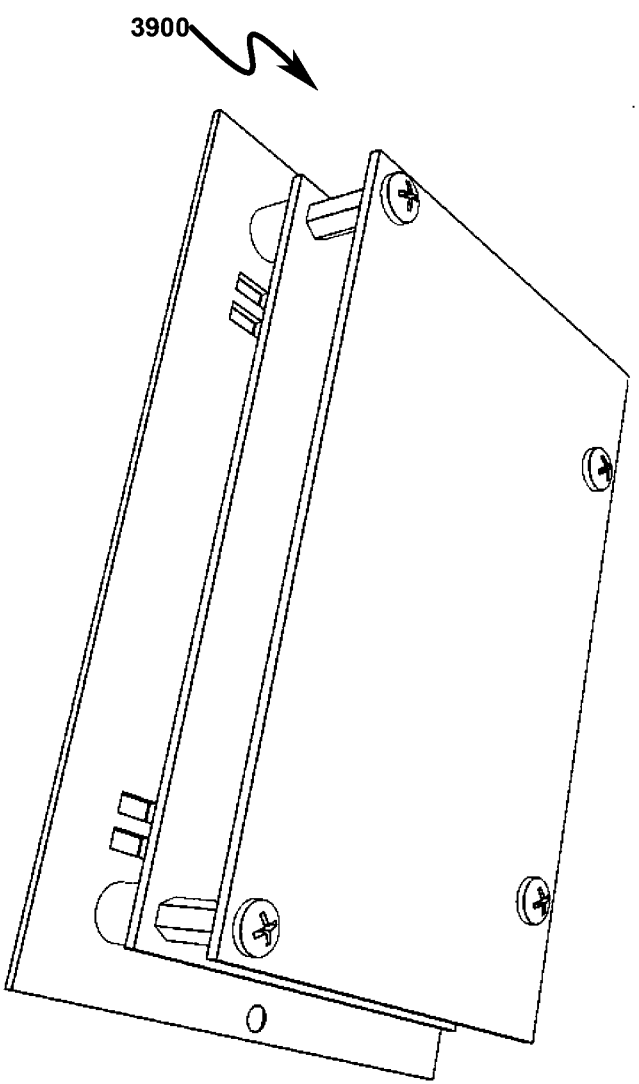
FIG. 39 illustrates a back perspective assembled view of a preferred exemplary embodiment of the present invention.
Figure 40:
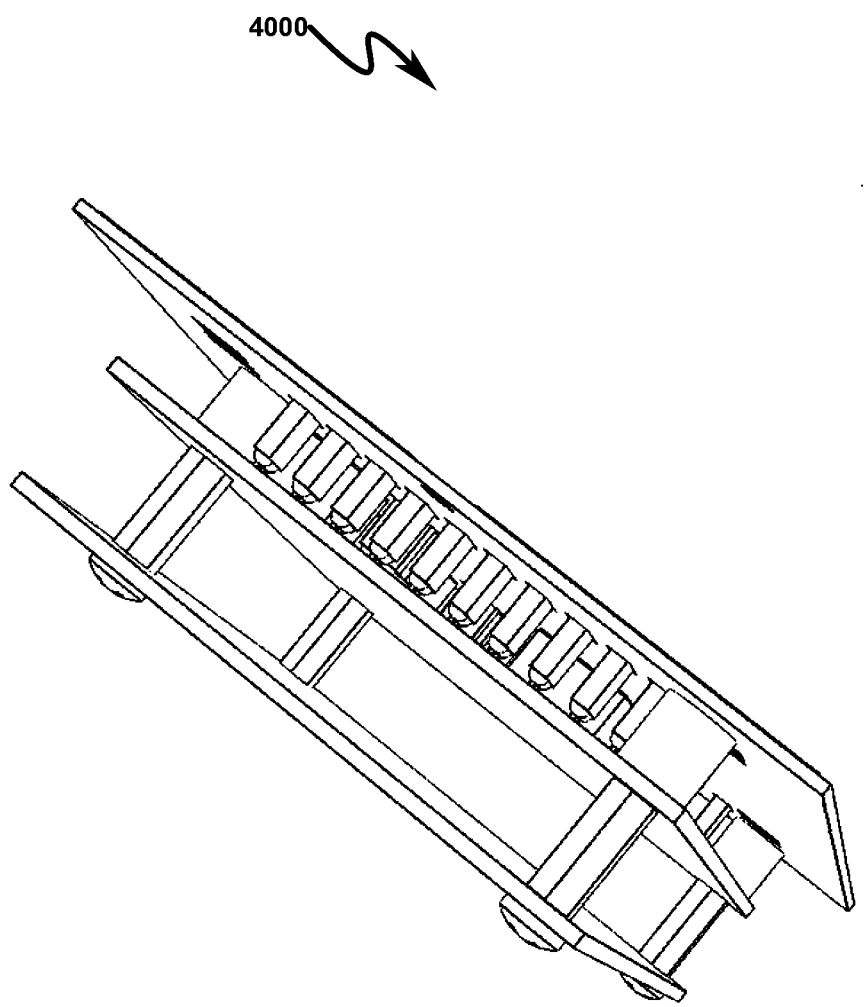
FIG. 40 illustrates a side perspective assembled view of a preferred exemplary embodiment of the present invention.

The various teachings of the present invention may be embodied in a wide variety of assemblies. However, a preferred embodiment assembly is generally illustrated in the perspective views depicted in FIG. 37 (3700), FIG. 38 (3800), FIG. 39 (3900), and FIG. 40 (4000). Each of these views indicates assembly of the UCSM, CUID, and CIBP as described herein.

Wireless Interface and Control/Monitoring (4100)-(4200)

Figure 2:
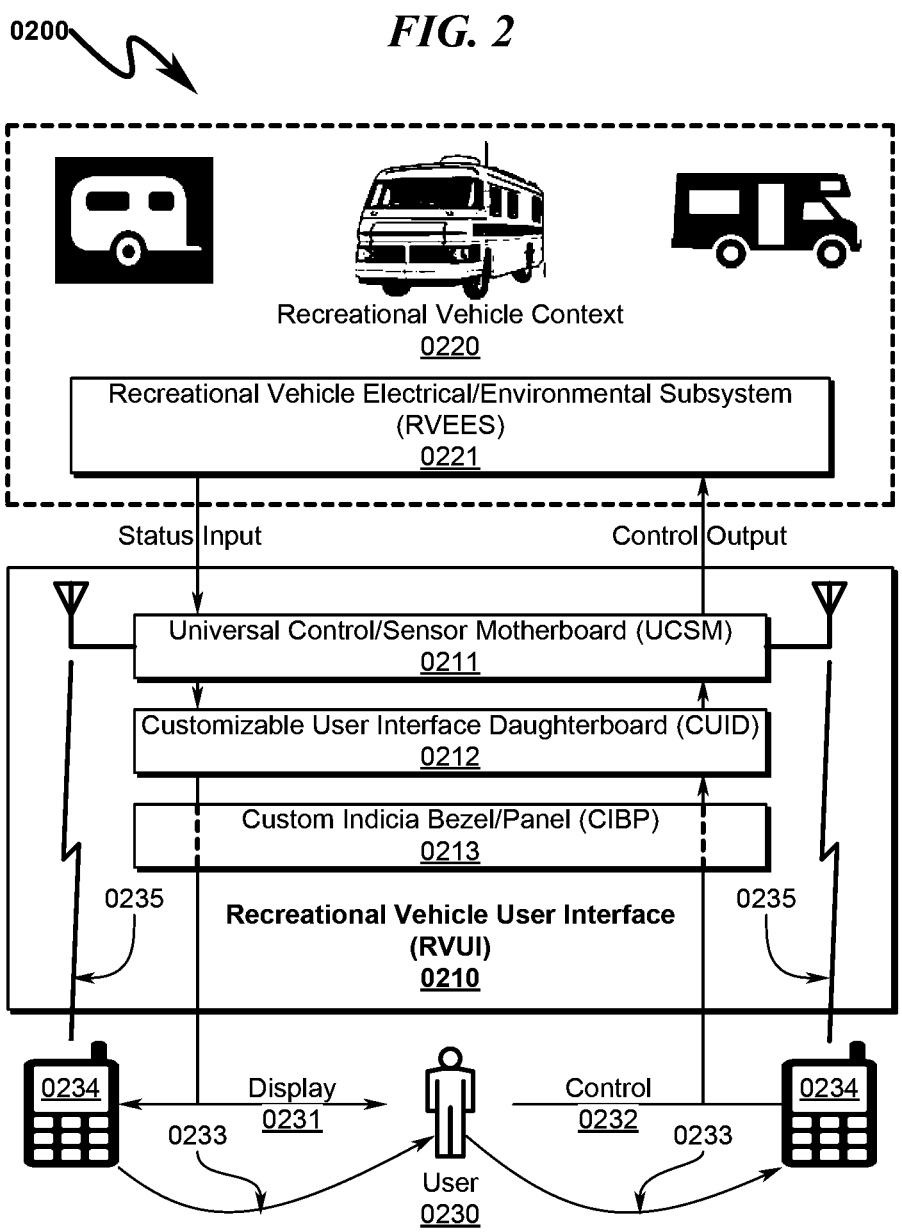
FIG. 2 illustrates a general system overview of the present invention.
Figure 3:
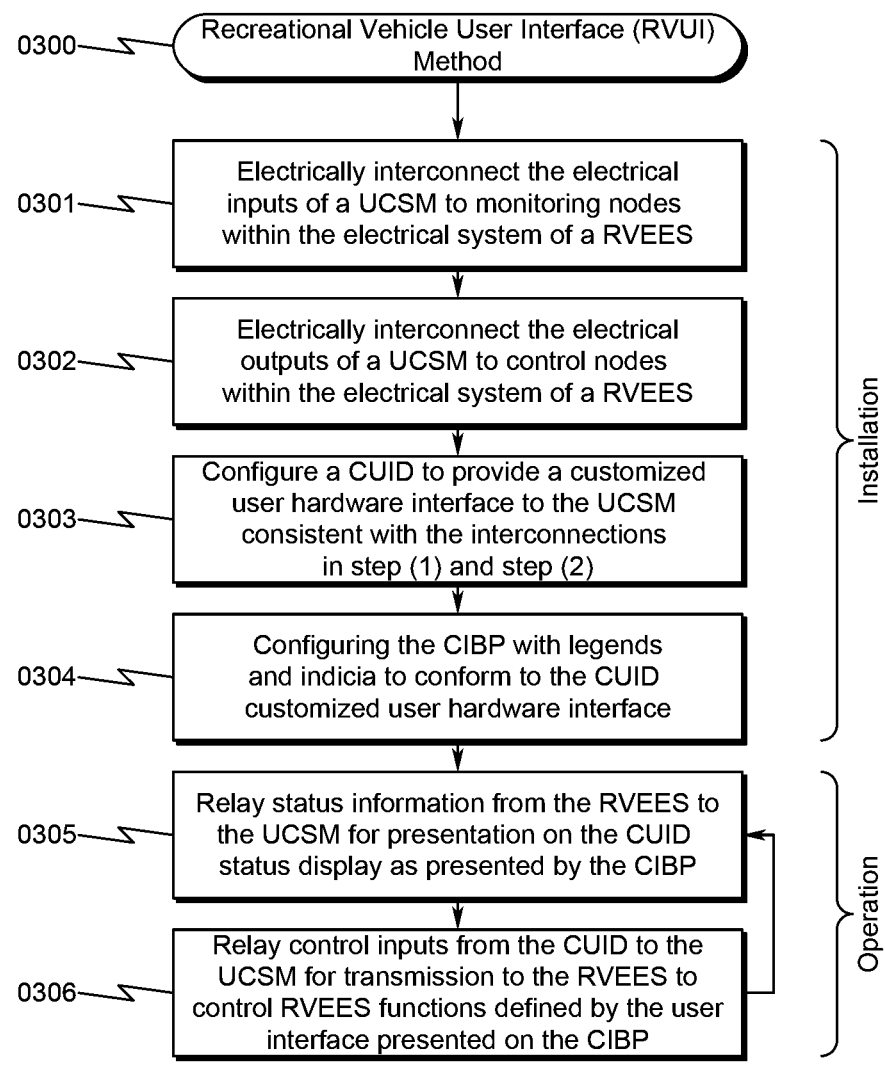
FIG. 3 illustrates a general method overview of the present invention.

The present invention RVUI anticipates that the UCSM/CUID combination may be augmented with wireless interface and monitoring from a wireless mobile device as generally depicted in FIG. 2 (0200) and FIG. 4 (0400). This embodiment configuration is further detailed in FIG. 41 (4100) wherein a wireless interface (4114) is provided to interface the UCSM (4111) to a mobile device (4134). This configuration presents a variety of remote control capabilities, including but not limited to the following:
- The ability to control the UCSM functionality remotely via a wireless mobile device.
- The ability to monitor UCSM functions as displayed on the CUID.
- The ability to provide user interface on the mobile device (4134) that may mimic the CUID display or some other user-selected interface.

The ability to relay alarms relating to monitored UCSM functions to the mobile device (4134).

While many varieties of mobile communication device (4134) are anticipated to be useful in this application, the use of mobile phones, smartphones, and computer tablets are specifically anticipated as being applicable in this context. Furthermore, while the wireless communication link may comprise standard interfaces such as WiFi, BLUETOOTH®, and cellular data transmission, the present invention is not necessarily limited to these wireless communication standards.

Figure 42:
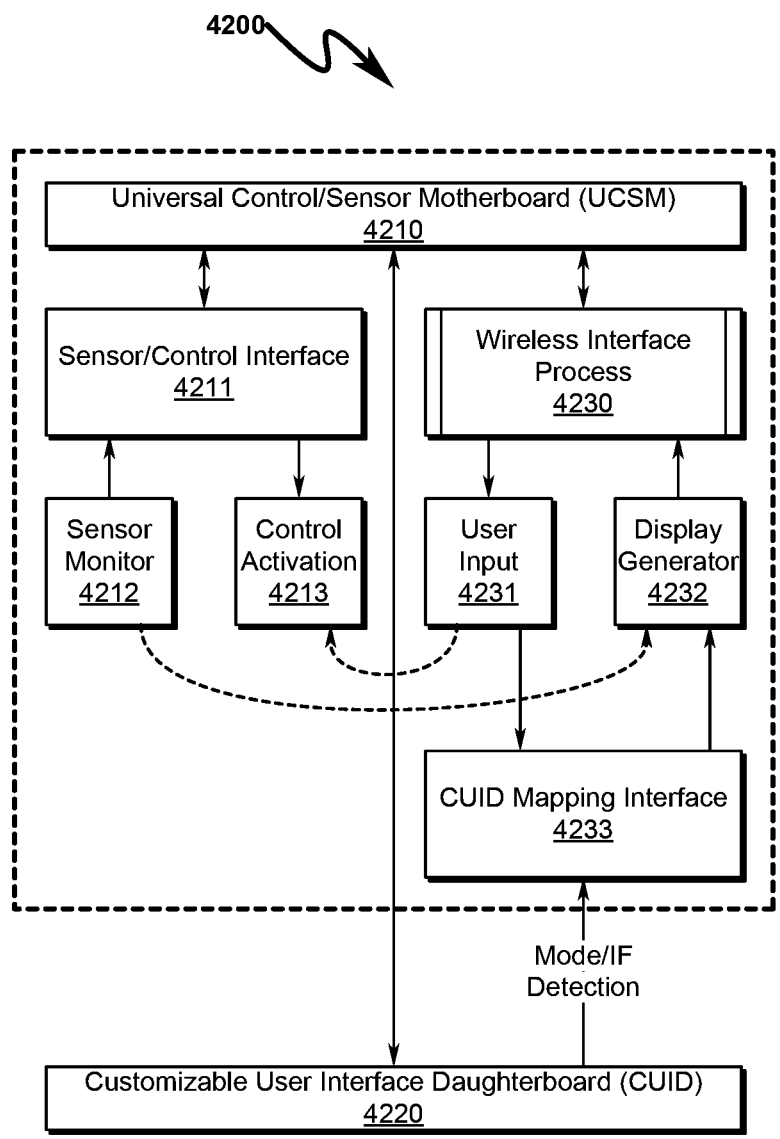
FIG. 42 illustrates an exemplary wireless interface and control detail for some preferred invention embodiments and depicts the interaction between UCSM sensor/control interface and the wireless user interface presentation.

More detail on the wireless interface can be seen in FIG. 42 (4200), wherein the UCSM (4210) is seen interfacing with the CUID (4220). Here the UCSM (4210) incorporates a sensor/control interface (4211) that generally is responsible for monitoring sensors (4212) and controlling activation (4213) of various RV power systems. This control/status information is made available to the UCSM (4210) which then in turn permits control/monitoring of this subsystem via a wireless interface process (4230). The wireless user interface (4230) generally comprises support for user inputs (4231) (linked to the control activation circuitry (4213)) and display generation (linked to the sensor monitor circuitry (4212)).

Figure 43:
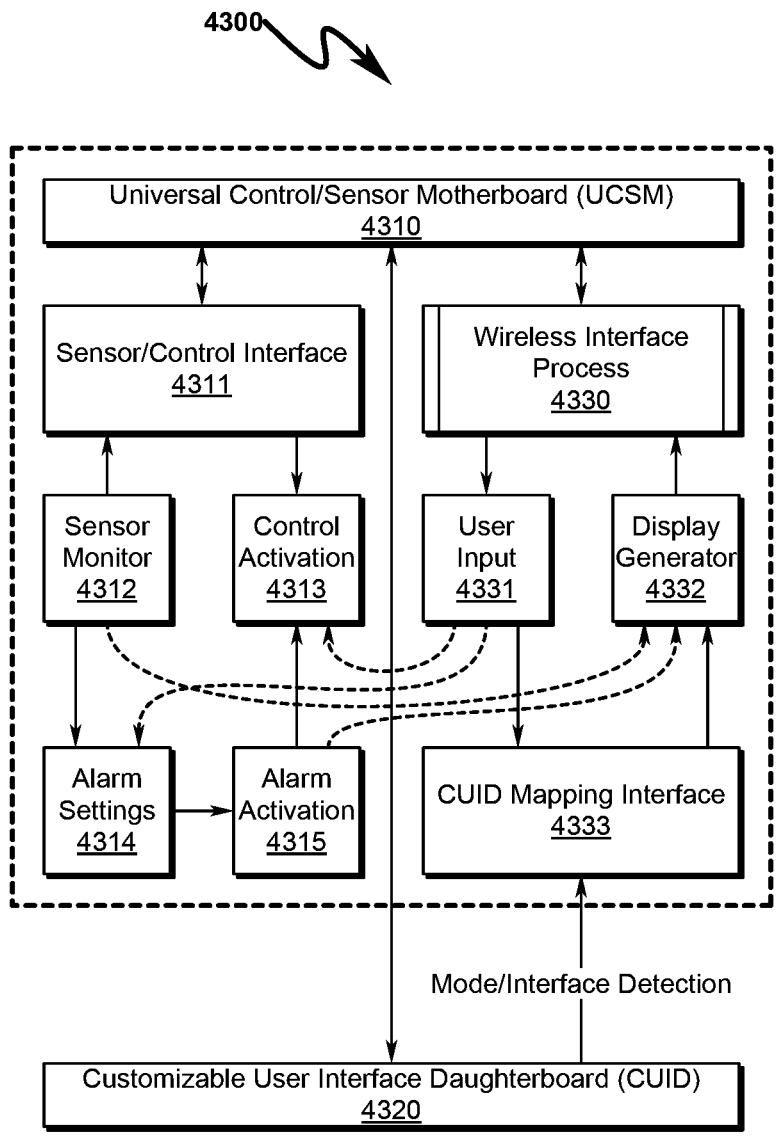
FIG. 43 illustrates an exemplary wireless interface and control detail for some preferred invention embodiments and depicts the interaction between UCSM sensor/control interface alarms and the wireless user interface presentation.

As generally depicted in FIG. 43 (4300), the incorporation of alarm settings (4314) and alarm activation (4315) may also be linked with appropriate wireless interface user presentations for user input (4331) and display generation (4332) within the wireless interface process (4330). Thus, this embodiment may permit alarm threshold values (4314) to be set remotely via wireless user inputs (4331) and alarm conditions subsequently triggered to be displayed remotely (4332). These remote settings can form the basis of a control activation (4313) (or deactivation) of a RVEES subsystem based on these triggering events.

UCSM Wireless Mapping Process (4400)

Figure 41:
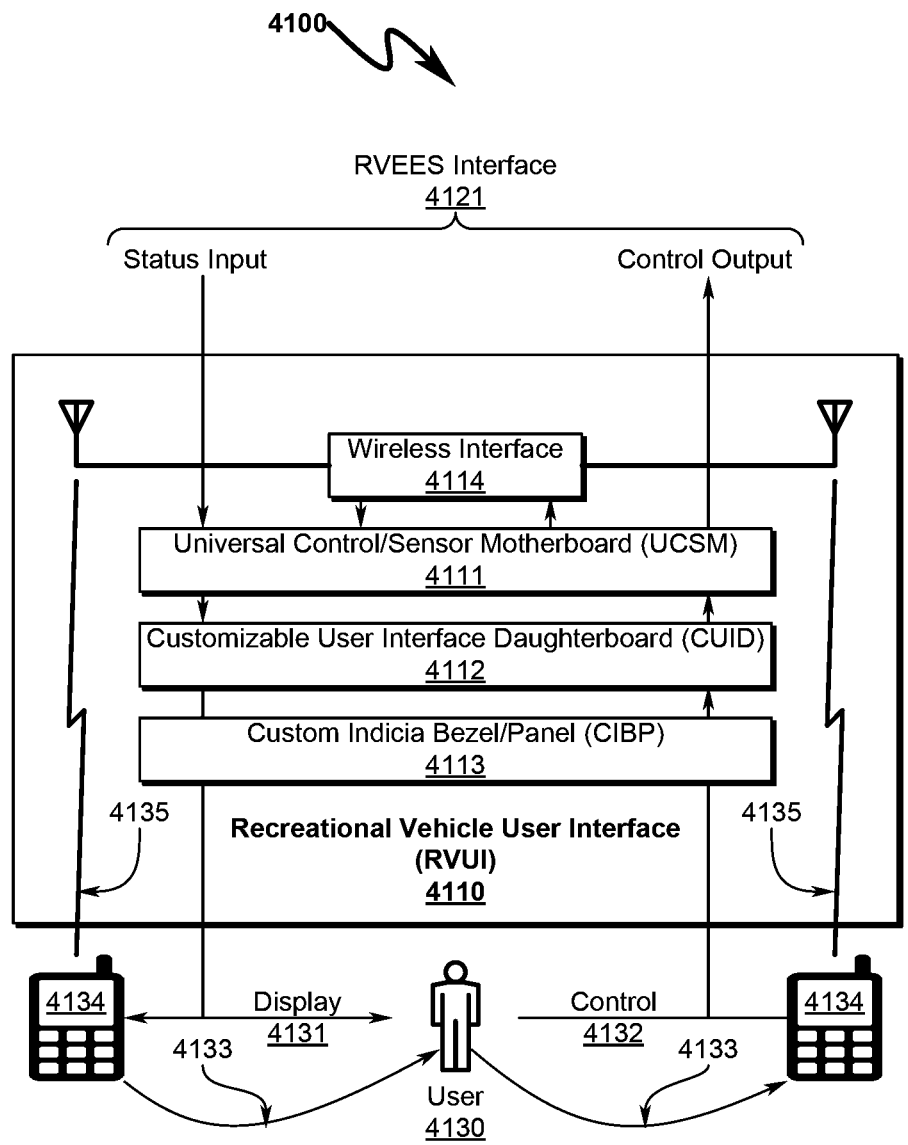
FIG. 41 illustrates an exemplary wireless interface and control detail for some preferred invention embodiments.
Figure 44:
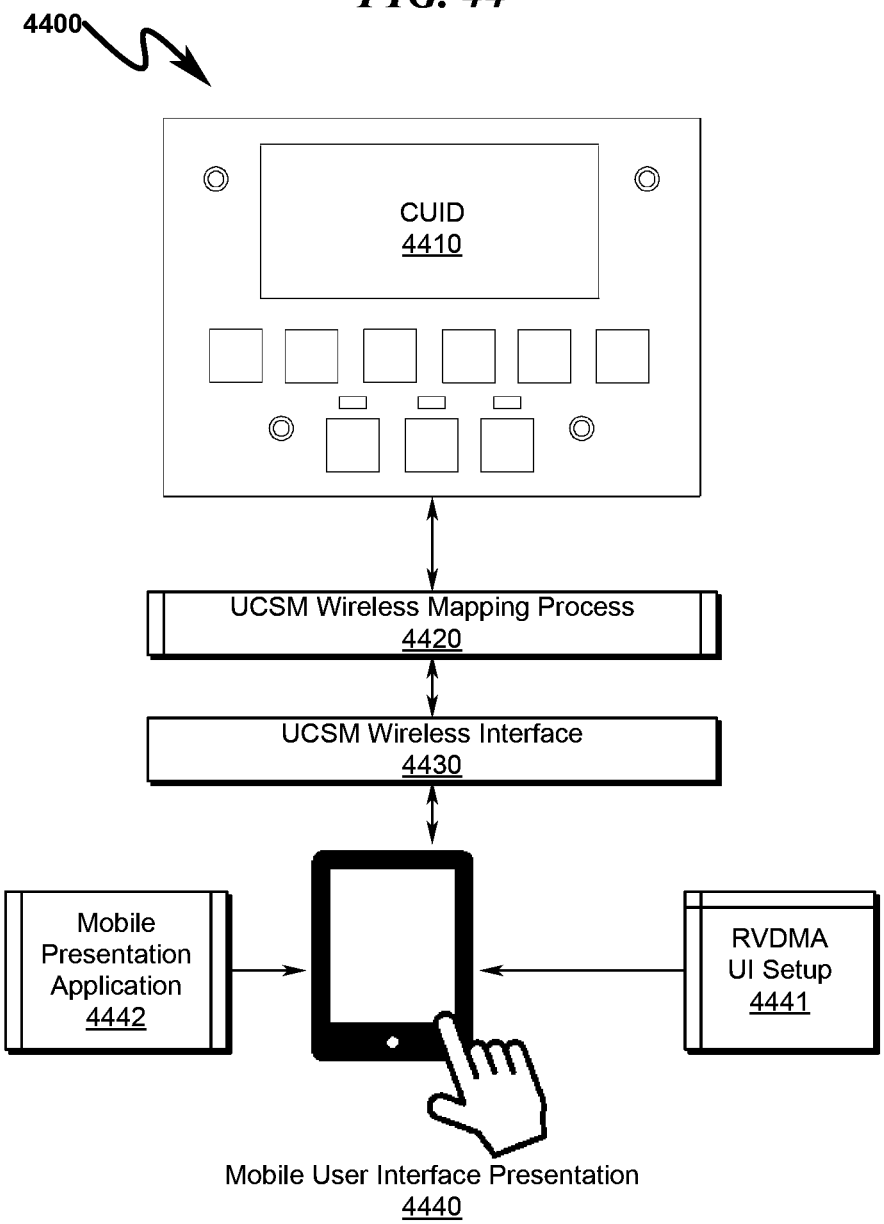
FIG. 44 illustrates an exemplary UCSM wireless mapping process context useful in some preferred invention embodiments.
Figure 45:
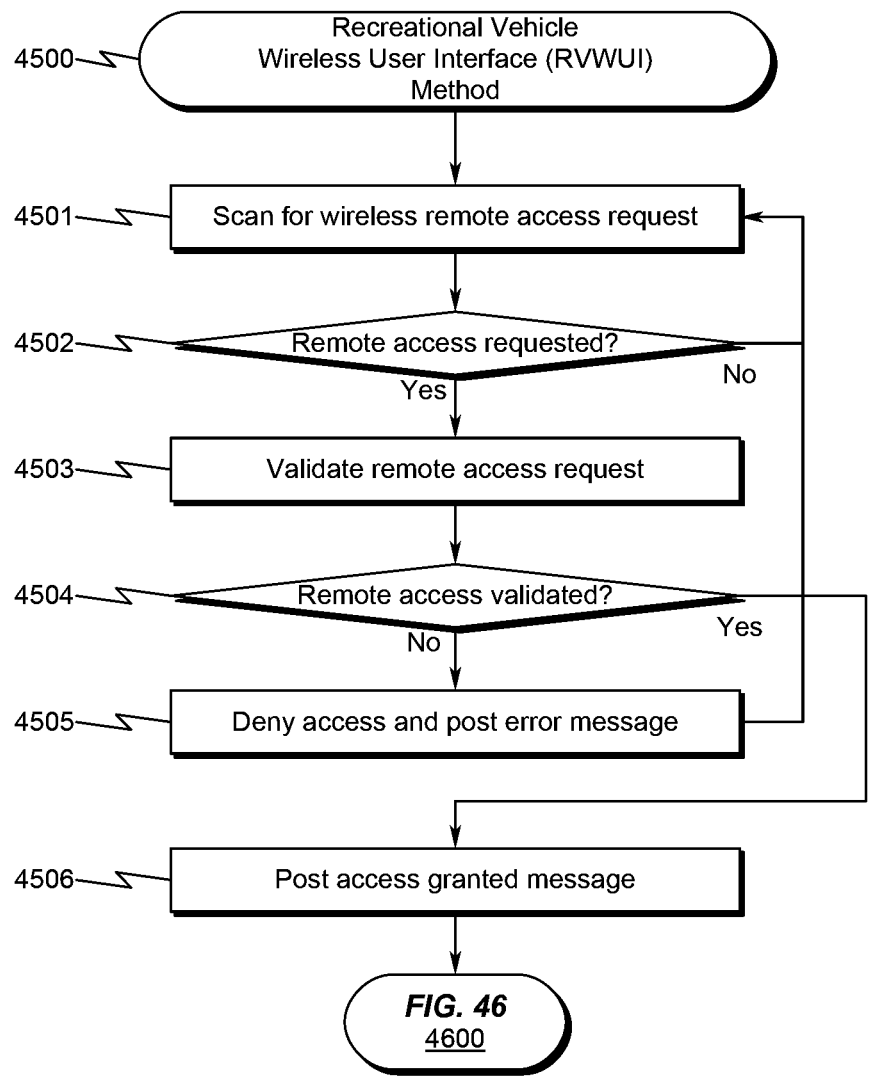
FIG. 45 illustrates a general method flowchart overview of the present invention as applied to a recreational vehicle wireless user interface (RVWUI) depicting the access control logic.
Figure 46:
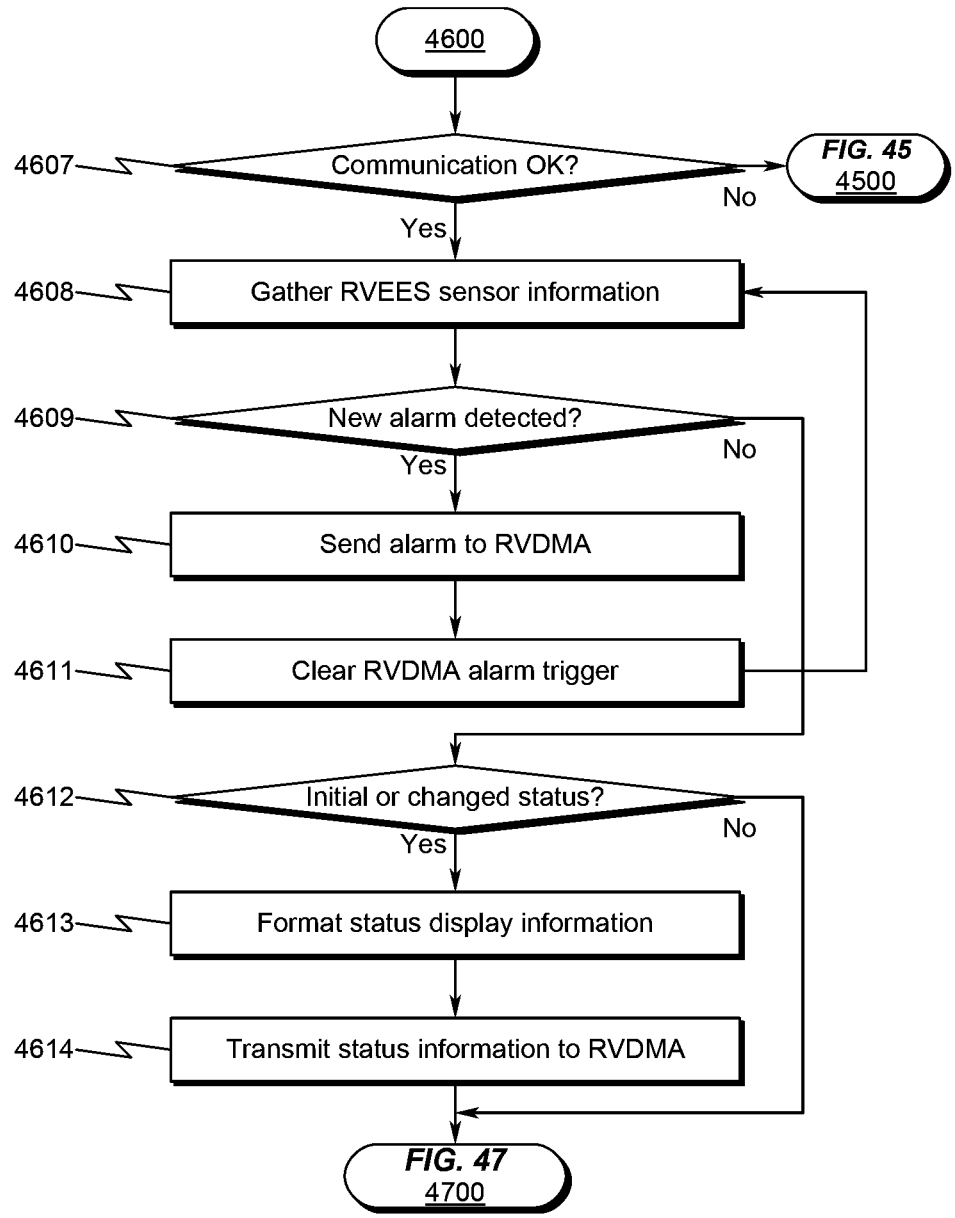
FIG. 46 illustrates a general method flowchart overview of the present invention as applied to a recreational vehicle wireless user interface (RVWUI) depicting the user display logic.
Figure 47:
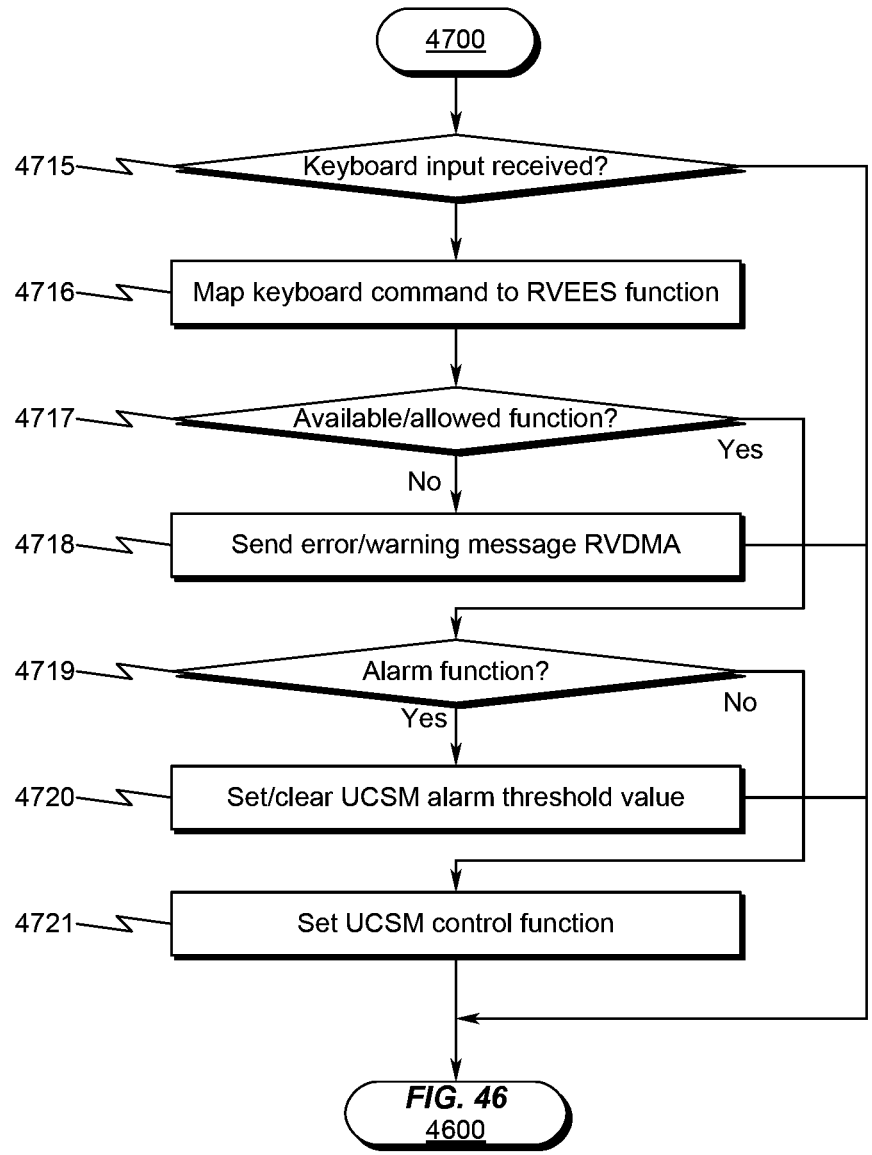
FIG. 47 illustrates a general method flowchart overview of the present invention as applied to a recreational vehicle wireless user interface (RVWUI) depicting the user input logic.
Figure 48:
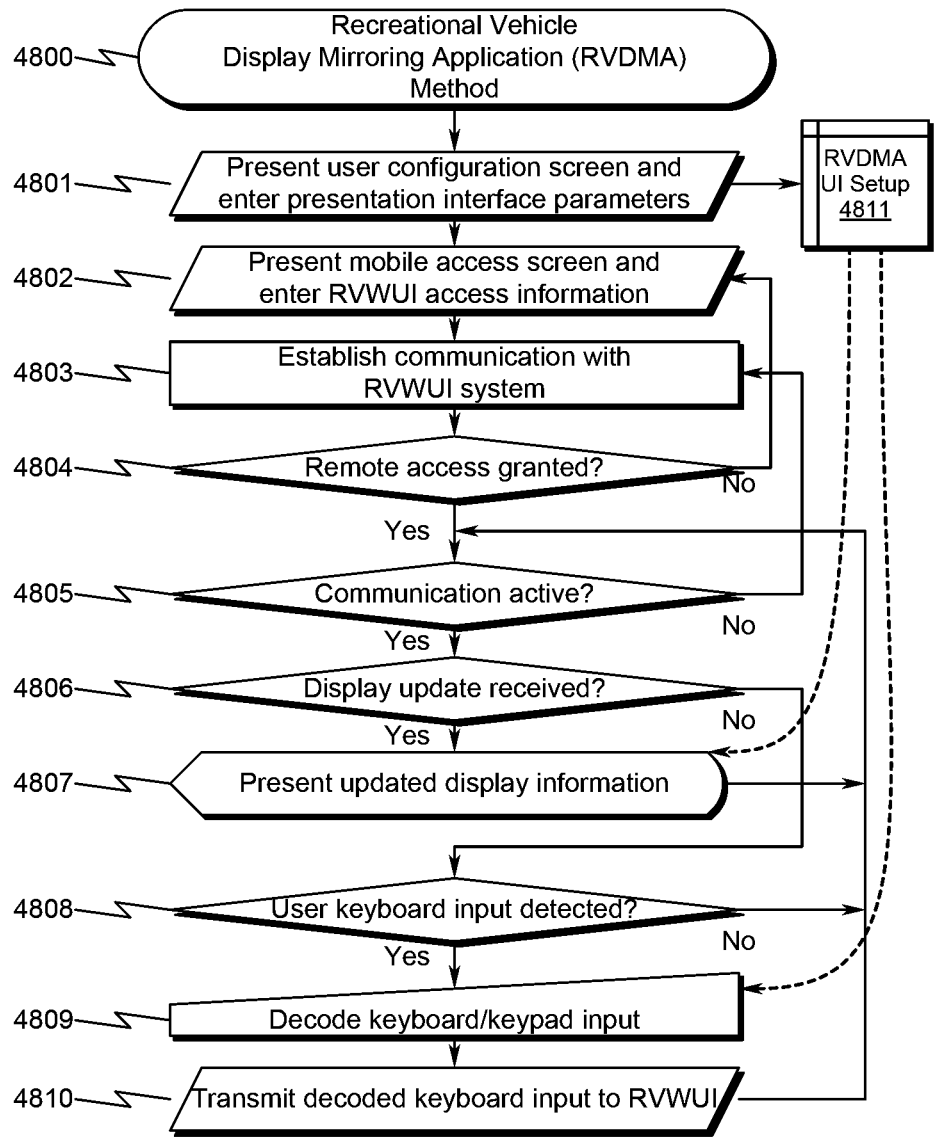
FIG. 48 illustrates a general method overview of the present invention as applied to a recreational vehicle mobile display mirroring application (RVDMA).

The above-described wireless mobile interface detailed in FIG. 41 (4100)-FIG. 43 (4300) may be generally described in the data flow depicted in FIG. 44 (4400), wherein the CUID (4410) may have a wide variety of implementations as determined by a specific application context within the RV. The UCSM wireless interface process described previously provides for a UCSM wireless mapping process (4420) that generally maps the CUID user interface environment (4410) to a mobile user interface presentation context (4440) via the UCSM wireless hardware interface (4430). This mapping is an abstraction of the control/status functionality provided by the CUID (4410) and may vary based on application parameters and setup information (4441) localized at the mobile user interface level (4440).

Thus, how the mobile user actually "sees" the CUID control/status panel (4410) may vary based on information sent to the mobile presentation device (4440), such as the particular custom indicia bezel/panel (CIBP) implemented, or the available control/status signals actually implemented within the UCSM. Note that the remote mobile application context (4440) may be configured to provide more or less control/status information than is provided within the CUID (4410) context, depending on the implementation of the remote application (4442) running on the remote mobile device (4440).

RV Wireless User Interface (RVWUI) Method (4700)

The present invention anticipates that a RV wireless user interface (RVWUI) may operate on the UCSM and permit a RV user to access the RVEES via a predefined wireless protocol. A generalized method associated with this wireless access application may generally be described in terms of the following method steps:

(1) Scanning for a wireless remote access request (4501). This step may this step involves determining the presence of a compatible mobile device that is attempting to communicate with the UCSM.
(2) Determining if a remote mobile device is attempting to login to the UCSM for access control, and if not, proceeding to step (1) (4502).
(3) Validating access by the mobile RVDMA device to determine if it is properly authorized to access the UCSM (4503).
(4) Determining if remote access is validated, and if so, proceeding to step (6) (4504).
(5) Denying remote mobile access to the UCSM, posting an error message to the RVDMA, and proceeding to step (1) (4505).
(6) Posting an access granted message to the RVDMA via the wireless connection (4506).
(7) Determining if wireless communication is still active between the UCSM and the RVDMA, and if not, proceeding to step (1) (4607).
(8) Gathering RVEES sensor information (4608).
(9) Determining if a RVEES sensor alarm is detected, and if not, proceeding to step (12) (4609).
(10) Sending an alarm message via the wireless link to the RVDMA (4610).
(11) Clearing the RVDMA associated with the alarm condition (to prevent recurrent RVDMA alarms) and proceeding to step (8) (4611).
(12) Determining if RVEES status information is initially unknown to the RVDMA or changed since the last RVDMA display update, and if not, proceeding to step (15) (4612).
(13) Formatting status display information based on collected RVEES status information (4613).
(14) Transmitting the formatted status display information to the RVDMA via the wireless link (4614).
(15) Determining if a RVDMA keyboard/keypad input has been received, and if not, proceeding to step (7) (4715).
(16) Mapping the RVDMA keyboard/keypad input to an equivalent RVEES control function (4716).
(17) Determining if the mapped RVEES control function is available for execution or allowed to the user based on access control limitations configured within the RVWUI, and if so, proceeding to step (19) (4717).
(18) Sending an error/warning message to the RVDMA via the wireless communication link (4718).
(19) Determining if an alarm function command has been received, and if not, proceeding to step (21) (4719).
(20) Setting/clearing the alarm threshold in the UCSM based on the RVDMA alarm message content and proceeding to step (7) (4720).
(21) Setting the UCSM control function based on the RVDMA control message content and proceeding to step (7) (4721).

One skilled in the art will recognize that these method steps may be augmented or rearranged without limiting the teachings of the present invention. This general method summary may be augmented by the various elements described herein to produce a wide variety of invention embodiments consistent with this overall design description.

RV Display Mirroring Application (RVDMA) Method (4800)

The present invention anticipates that a RV display mirroring application (RVDMA) may operate on a mobile device and permit a RV user to access the RVEES via the RVWUI described above. A generalized method associated with this remote access application may generally be described in terms of the following method steps:

(1) Presenting a user configuration screen to the remote mobile user and permitting the user to enter presentation interface parameters (4801). This step may include selection of a given user interface from among a variety of possible user interfaces, and may involve mapping a variety of different controls associated with the RVEES to a preselected set of modal dialog screens that are presented to the user for configuration/monitoring of RVEES components. This information may be stored in a user interface setup dataset (4811). Thus, there may exist differences between the form and function of the RVEES displays/controls associated with the CUID and the user interface selected for use by the mobile user in this context.

(2) Presenting the mobile user with an access screen and entering RVWUI access information (4802).

(3) Establishing or maintaining wireless communication between the mobile RVDMA and the RVWUI host system (4803).

(4) Determining if remote access is granted, and if not, proceeding to step (2) (4804).

(5) Determining if communication between the RVWUI and the RVDMA is active (or data is received) and if not, proceeding to step (3) (4805).

(6) Determining if a display update has been received, and if not, proceeding to step (8) (4806).

(7) Presenting updated display information to the mobile user interface (4807) using data provided by the RVWUI and the display formatting defined by the RVDMA UI setup parameters (4811) and proceeding to step (5).

(8) Determining if a mobile user keyboard/keypad entry has been detected, and if not, proceeding to step (5) (4808).

(9) Decoding the mobile keyboard/keypad entry (4809) as defined by the RVDMA UI parameters (4811).

(10) Wirelessly transmitting the decode keyboard/keypad entry to the RVWUI (4810) and proceeding to step (5).

One skilled in the art will recognize that these method steps may be augmented or rearranged without limiting the teachings of the present invention. This general method summary may be augmented by the various elements described herein to produce a wide variety of invention embodiments consistent with this overall design description.

Exemplary RV Subsystem Context

While the present invention is anticipated to monitor/control a wide variety of RV electrical/environmental subsystems, a brief review of various subsystems in a typical application is warranted. Thus, the following discussion will detail various key RV subsystems that may be included in this typical application context.

Alternating Current Voltage System
120/240 VAC Shore Connection

This is the main electrical connection when an RV is parked in a location such as a campground or often time at a residence or out-building. There are currently two supply voltage standards for shore connections:

120VAC rated at 30 amps.
120/240VAC rated at 50 amps (typically this is configured as two 120VAC lines capable of 50 amps each).

Monitoring the voltage, amperage, and load balance, polarity, and open conductors on 120/240 volt systems is desirable to prevent accidental breaker tripping, or possible equipment damage due to improper input voltage.

Generator Supply

Generators for RV use are configured to provide either 120VAC or 120/240VAC similar to the SHORE CONNECTION described above. However, the amount of current provided in either system is limited by the output wattage of the generator system. It is important in this context to monitor the same parameters for the same reasons as shore connections. RVs with on-board generators typically have electrical switching mechanisms to start and turn off the generator. These are control features that some embodiments of the present invention may be configured to perform.

Automatic Line/Generator Transfer Switch

The purpose of this subsystem is to safely and conveniently transfer sources of AC voltage from shore source to generator source. These transfer switches sense when the generator is providing voltage and then switch to generator source automatically. When the generator is no longer providing electrical power the transfer switch returns to the shore line source.

Parameters for monitoring and control of this system may include:
Presence of source AC voltage at shoreline input.
Presence of source AC voltage at generator input.
Verification of output AC voltage at output to RV AC electrical system.
Subsystems such as the PARALLAX POWER SUPPLY ATS501 Transfer Switch contain logic that indicates when there is a switching fault. This feature (and others present in various other power supply subsystems) may be monitored in some preferred invention embodiments.
Forcing the switch to return to shore connection even though the generator is still running.

This list is only exemplary of the types of monitoring and control that are possible using the present invention.

Nominal 12VDC (24VDC) Electrical System

Most of the electrical equipment in an RV is powered by the 12 volt system. This is to allow the user to enjoy the greatest benefit of the RV even in remote locations where 120VAC source power is not readily available. The components of the DC electrical system include:

Battery or Battery Bank

Batteries or battery banks are used for energy storage to power the RVs 12VDC electrical system when AC voltage is not available. RV batteries are almost always of lead acid chemistry, and can be of flooded, AGM, or Gel technologies. Parameters for monitoring and control of these may include:

Different battery technologies ideally have different charging parameters. The ability to select the type of battery technology could modify the operation of a power supply converter subsystem (such as the PARALLAX POWER SUPPLY CONVERTER SYSTEM) to provide more suitable charging for the selected battery type.
Battery voltage monitoring.
Battery drain or charge rate (current) monitoring.
Battery temperature monitoring.

This list is only exemplary of the types of monitoring and control that are possible using the present invention.

RV Converter

When AC source voltage is available the converter creates 12VDC to provide a current source for the DC loads in the RV, including the RV battery or batteries if they are in a state of discharge. Monitoring and control parameters for this subsystem may include:
input voltage
input current;
output voltage;

output current;
the ability to shut off the converter's output; and/or
control of special converter functions.

Examples of special converter functions may include:
In PARALLAX CONVERTERS, turning the high charge rate function on and off, incorporating the monitoring/control functions as listed above, and/or incorporating monitoring/control functions in addition to those listed above.

In other converter systems having special control features which may be controlled remotely through the monitoring/control functions of the present invention. These monitoring and control parameters may be performed by the use of sensing wires run to the output of the converter in addition to a current shunt being installed in the DC output of the converter system and sensing wires being connected to the shunts.

Current Shunts

Current shunts typically used in RV applications are in the 100-300 ADC range. Shunts are used to monitor the flow of current between devices, batteries, and the intermixing of these items. While a variety of shunts may be used, some preferred embodiments make use of SIMPSON® External Portable and Switchboard Shunts such as models 06713-06715 (100-200 A); 06500 (100 A); and 06503-06508 (150 A-500 A).

Battery Disconnect Relays

These are high current solenoid type, single pole relays. These types of relays are either open to isolate a high current device (battery or converter) from the DC electrical system of the RV, or closed to connect a device to the system. These are commonly used to disconnect the battery or batteries when the RV is in storage, and to electrically separate individual batteries in multi-battery systems.

PARALLAX POWER SUPPLY manufactures such a device, the model BR100. Traditionally these types of relays are controlled manually by the activation of a remote low current electrical switch. The present invention may also allow the ability to connect or disconnect devices, specifically batteries to the DC electrical system in the event of a triggering event. For example there could be a need to automatically disconnect the battery from the electrical system in the event of a low voltage threshold trigger, preventing the battery from fully discharging, which is an undesirable state.

Important parameters associated with the monitoring/control of this subsystem may include:
Monitoring of the status open or closed.
Control of the status open or closed.

Storage Tanks

Several storage tanks are often installed in an RV, for fresh water as well as waste water. It is important to be able to monitor the levels of these tanks, as well activate pumps to fill or empty the tanks. Additionally this is a situation where an alarm indicator may be needed, such as when a waste water tank is full.

Additional Systems

Additional subsystems in a typical RV application may be seen in the "RV WIRING BLOCK DIAGRAM" which illustrates additional main components of a typical RV electrical system. It can be desirable to monitor and control the interaction between these components, and the present invention in various embodiments may be configured to accomplish this task.

Exemplary Application Contexts

While the present invention may be applied to a wide variety of RV application contexts, the following non-exhaustive list is specifically anticipated:

Provide for advanced battery charging techniques within the context of RVEES subsystems.

Offer a RV manufacturer a customized monitoring/control solution based on the specific needs of their application. This solution would allow for the elimination of many if not all of the individual switches and displays currently being used, thus reducing mounting space and installation time significantly.

As an individual aftermarket retrofit application, the present invention incorporating the Standard Alarm Module described herein would produce a general purpose configuration, allowing the connection of any converter system readily available as well as the ability to control any currently installed battery disconnect relay. In a situation such as this the RVUI unit could easily be upgraded in the future by incorporating TrueSense a charging module and adding a TempAssure converter system.

While it is not practical to illustrate every conceivable possibility of the present invention, key functions and features of the invention have been illustrated herein. The ability for any element desirable in the RVEES to be monitored either as an on/off condition or as a signal level of some sort (typically voltage or current) within the context of a universal monitoring/control system is extremely powerful given the current diversity in monitoring/control within RVEES subsystems currently on the market. Additionally, based on the outcome of the monitored signal(s) some action be taken whether it is in the form of an indicator, alarm, the adjustment of some other device with in the RVEES, or combination of these responses. The control of these signals and responses can be performed in a variety of means, the simplest being primarily from the use of comparator circuits that will either turn on or off when a certain threshold or set point is met, along with logic gates to perform math when multiple signals may be involved, these methods have been illustrated in a manner of ways. Other methods of signal monitoring could be by the use of mixed signal technology such as analog-to-digital converters, to ultimately, software programmed microcontrollers in the more advanced invention design embodiments. The manner and technology that is employed will depend largely on the technical and financial requirements of the client application.

The incorporation of a "True Sense" battery charging module and system (as described herein), with the system consisting of a TempAssure converter, controller (in this case the user interface described herein) and battery disconnect relay provides a substantially improved control and optimization of battery charging within an RV context that is currently not available in the prior art.

One skilled in the art will recognize that both the functionality and adaptability of the present invention as disclosed herein permits an integration and expansion level within the context of RVEES subsystems that has not been addressed by the prior art. This control/monitoring capability in conjunction with various means of remote access provides for a range of system integration and control not possible in the current state of the art.

Preferred Embodiment System Summary

The present invention preferred exemplary system embodiment anticipates a wide variety of variations in the basic theme of construction, but can be generalized as a recreational vehicle user interface system comprising:

(a) universal control/sensor motherboard (UCSM);
(b) customizable user interface daughterboard (CUID); and
(c) custom indicia bezel/panel (CIBP);
wherein
the UCSM is configured to accept electrical inputs from and distribute electrical outputs to electrical controls and environmental sensors within a plethora of recreational vehicle electrical/environmental subsystems (RVEES);
the UCSM is configured to electrically communicate with the CUID to send status information regarding the RVEES to the CUID;
the UCSM is configured to electrically communicate with the CUID to accept command inputs from the CUID for configuration of the RVEES;
the CUID comprises a status display that presents the status information to a user;
the CUID comprises a control input configured to provide the command inputs;
the CIBP is configured to cover the PCB of the CUID;
the CIBP is configured to present custom legends and indicia proximal to the status display; and
the CIBP is configured to present custom legends and indicia proximal to the control input.

This general system summary may be augmented by the various elements described herein to produce a wide variety of invention embodiments consistent with this overall design description.

Preferred Wireless Embodiment System Summary

The present invention preferred wireless exemplary system embodiment anticipates a wide variety of variations in the basic theme of construction, but can be generalized as a recreational vehicle user interface system comprising:
(a) universal control/sensor motherboard (UCSM);
(b) customizable user interface daughterboard (CUID); and
(c) custom indicia bezel/panel (CIBP);
wherein
the UCSM is configured to accept electrical inputs from and distribute electrical outputs to electrical controls and environmental sensors within a plethora of recreational vehicle electrical/environmental subsystems (RVEES);
the UCSM is configured to electrically communicate with the CUID to send status information regarding the RVEES to the CUID;
the UCSM is configured to electrically communicate with the CUID to accept command inputs from the CUID for configuration of the RVEES;
the CUID comprises a status display that presents the status information to a user;
the CUID comprises a control input configured to provide the command inputs;
the CIBP is configured to cover the PCB of the CUID;
the CIBP is configured to present custom legends and indicia proximal to the status display; and
the CIBP is configured to present custom legends and indicia proximal to the control input;
the UCSM comprises a wireless communication interface (WCI);
the WCI is electrically connected to and communicates with the UCSM;
the WCI is configured to interact with a mobile communication device (MCD) via wireless communication;
the MCD executes application software read from a computer readable medium;
the application software is configured to present a graphical user interface (GUI) on the MCD;
the GUI is configured to permit a user to receive RVEES status from the UCSM; and
the GUI is configured to permit a user to direct RVEES operation of the UCSM.

This general system summary may be augmented by the various elements described herein to produce a wide variety of invention embodiments consistent with this overall design description.

Preferred Embodiment Method Summary

The present invention preferred exemplary method embodiment anticipates a wide variety of variations in the basic theme of implementation, but can be generalized as a method for integrating the monitoring and control of a plethora of recreational vehicle electrical/environmental subsystems (RVEES) under control of a recreational vehicle user interface (RVUI) system, the system comprising:
(a) universal control/sensor motherboard (UCSM);
(b) customizable user interface daughterboard (CUID); and
(c) custom indicia bezel/panel (CIBP);
wherein
the UCSM is configured to accept electrical inputs from and distribute electrical outputs to electrical controls and environmental sensors within a plethora of recreational vehicle electrical/environmental subsystems (RVEES);
the UCSM is configured to electrically communicate with the CUID to send status information regarding the RVEES to the CUID;
the UCSM is configured to electrically communicate with the CUID to accept command inputs from the CUID for configuration of the RVEES;
the CUID comprises a status display that presents the status information to a user;
the CUID comprises a control input configured to provide the command inputs;
the CIBP is configured to cover the PCB of the CUID;
the CIBP is configured to present custom legends and indicia proximal to the status display; and
the CIBP is configured to present custom legends and indicia proximal to the control input;
wherein the method comprises the steps of:
(1) electrically interconnecting the electrical inputs of the UCSM to monitoring nodes within the electrical system of the RVEES;
(2) electrically interconnecting the electrical outputs of the UCSM to control nodes within the electrical system of the RVEES;
(3) configuring the CUID to provide a customized user hardware interface to the UCSM consistent with the interconnections in step (1) and step (2);
(4) configuring the CIBP with legends and indicia to conform to the CUID customized user hardware interface;
(5) relaying status information from the RVEES to the UCSM for presentation on the CUID status display as presented by the CIBP to a user; and
(6) relaying control inputs from the CUID to the UCSM for transmission to the RVEES to control RVEES functions defined by the user interface presented on the CIBP.

One skilled in the art will recognize that these method steps may be augmented or rearranged without limiting the teachings of the present invention. This general method summary may be augmented by the various elements described herein to produce a wide variety of invention embodiments consistent with this overall design description.

Preferred Battery Charging Embodiment Method Summary

The present invention preferred exemplary battery charging method embodiment anticipates a wide variety of variations in the basic theme of implementation, but can be generalized as a method for monitoring and control of battery charging within a recreational vehicle electrical/environmental subsystem (RVEES) comprising:

(1) determining if a cycle delay has elapsed, and if not, proceeding to step (1);
(2) incrementing a counter value;
(3) determining if the counter value is equal to a preset count parameter C2, and if not, proceeding to step (5);
(4) disconnecting the battery from a battery charger and proceeding to step (1);
(5) determining if battery storage mode is enabled, and if not, proceeding to step (7);
(6) determining if the counter value is equal to a preset count parameter C8, and if so, proceeding to step (8), otherwise proceeding to step (4);
(7) determining if the counter value is equal to a preset count parameter C6, and if not, proceeding to step (12);
(8) determining if the battery voltage is greater than a predetermined upper voltage VH, and if so, proceeding to step (1);
(9) determining if the battery voltage is greater than a predetermined lower voltage VL, and if not, proceeding to step (11);
(10) enabling battery boost charging;
(11) connecting the battery to the charger and proceeding to step (1);
(12) determining if the counter value is equal to a preset count parameter C9, and if not, proceeding to step (1); and
(13) resetting the counter value to zero and proceeding to step (1).

One skilled in the art will recognize that these method steps may be augmented or rearranged without limiting the teachings of the present invention. This general method summary may be augmented by the various elements described herein to produce a wide variety of invention embodiments consistent with this overall design description.

Alternate Preferred Battery Charging Method Summary

A present invention alternate preferred exemplary battery charging monitoring and control method embodiment anticipates a wide variety of variations in the basic theme of implementation, but can be generalized as a method for monitoring and control of battery charging within a recreational vehicle electrical/environmental subsystem (RVEES) comprising:

(1) determining if a battery charge converter and associated load system are both active, and if not, proceed to step (1);
(2) continuously monitoring the converter voltage and if the converter voltage falls below an upper threshold VH and the battery voltage is greater than a lower threshold VL, then connecting the battery to the battery charge converter regardless of any other state;
(3) waiting a first time period T1;
(4) disconnecting the battery from the charge converter;
(5) waiting a time period T2;
(6) waiting a time period T3;
(7) measuring the battery voltage;
(8) determining if the measured battery voltage indicates a charge mode is necessary, and if so, proceeding to step (10);
(9) connecting the battery to the converter system and adjusting the converter voltage to the proper battery charging stage based on the measured battery voltage; and
(10) disconnecting the battery from the converter and proceed to step (6).

One skilled in the art will recognize that these method steps may be augmented or rearranged without limiting the teachings of the present invention. This general method summary may be augmented by the various elements described herein to produce a wide variety of invention embodiments consistent with this overall design description.

Alternate Preferred Battery Charging Method Summary

A present invention alternate preferred exemplary battery charging monitoring and control method embodiment anticipates a wide variety of variations in the basic theme of implementation, but can be generalized as a method for monitoring and control of battery charging within a recreational vehicle electrical/environmental subsystem (RVEES) comprising:

(1) disconnecting the battery from a battery charging converter;
(2) measuring the no-load battery voltage;
(3) deciding on a battery charging method based on the measured no-load battery voltage;
(4) connecting the battery to the battery charging converter;
(5) activating a battery charge cycle for the battery; and
(6) waiting a selected battery charging interval and then proceeding to step (1).

One skilled in the art will recognize that these method steps may be augmented or rearranged without limiting the teachings of the present invention. This general method summary may be augmented by the various elements described herein to produce a wide variety of invention embodiments consistent with this overall design description.

Preferred APX Switching Embodiment Method Summary

The present invention preferred exemplary automatic power exchange (APX) method embodiment anticipates a wide variety of variations in the basic theme of implementation, but can be generalized as a method for monitoring and controlling automatic power exchange (APX) within a recreational vehicle electrical/environmental subsystem (RVEES) comprising:

(1) continuously monitoring the utility power connection status (LINE1, LINE2, NEUTRAL, GROUND);
(2) determining if good utility power is detected for approximately 90 s, and if not, proceeding to step (5);
(3) activating a shore contactor (K1);
(4) continuously monitoring the generator power connection status (LINE1, LINE2, NEUTRAL, GROUND);
(5) determining if generator power is detected, and if not, proceeding to step (3);
(6) determining if good generator power is detected for approximately 90 s, and if not, proceeding to step (5);
(7) releasing the shore contactor (K1);
(8) activating a generator contactor (K2);

(9) determining if generator power is detected, and if so, proceeding to step (8); and

(10) deactivating the generator contactor (K2) and proceeding to step (1).

One skilled in the art will recognize that these method steps may be augmented or rearranged without limiting the teachings of the present invention. This general method summary may be augmented by the various elements described herein to produce a wide variety of invention embodiments consistent with this overall design description.

System/Method Variations

The present invention anticipates a wide variety of variations in the basic theme of construction. The examples presented previously do not represent the entire scope of possible usages. They are meant to cite a few of the almost limitless possibilities.

This basic system and method may be augmented with a variety of ancillary embodiments, including but not limited to:

An embodiment wherein the RVEES is selected from a group consisting of: battery temperature, battery voltage, overall system voltage, battery disconnect relay, vent fan, solar panel, cabin temperature, temperature alarm, power converter module, temperature sensitive power converter, PARALLAX POWER SUPPLY, load management controller, AC distribution controller, transfer switch, AC/generator input, storage tank sensor, pump motor, 12V electrical load, and 24V electrical load.

An embodiment wherein the status display comprises an indicator selected from a group consisting of: battery voltage bar graph; battery low voltage alarm display; battery high voltage alarm display; battery voltage digital display; battery temperature bar graph; battery low temperature alarm display; battery high temperature alarm display; battery voltage digital display; storage tank level bar graph; storage tank low level alarm display; storage tank high level alarm display; storage tank level digital display.

An embodiment wherein the status display and the control input comprise a touch screen display/control.

An embodiment wherein the CUID comprises an alarm indicator selected from a group consisting of: audible alarm; audible alarm that is enabled in response to activation of the status display.

An embodiment wherein the UCSM comprises a printed circuit board (PCB) further comprising an Expansion Module Landing Array (EMLA).

An embodiment wherein the UCSM comprises a wireless communication interface (WCI) wherein the WCI is configured to interact with a mobile communication device (MCD) via wireless communication; the MCD executes application software read from a computer readable medium; the application software is configured to present a graphical user interface (GUI) on the MCD; the GUI is configured to permit a user to receive RVEES status from the UCSM; and the GUI is configured to permit a user to direct RVEES operation of the UCSM.

An embodiment wherein the WCI comprises a wireless interface selected from a group consisting of: BLUETOOTH® wireless communication interface; and WiFi wireless communication interface.

An embodiment wherein the MCD comprises a device selected from a group consisting of: laptop computer; tablet computer; cellphone; mobile phone; and smartphone.

An embodiment wherein the application software is configured to interrogate the UCSM and reconfigure the GUI based on the configuration status of the CUID.

An embodiment wherein the count parameter C2 has a value of approximately 2.

An embodiment wherein the count parameter C6 has a value of approximately 6.

An embodiment wherein the count parameter C8 has a value of approximately 8.

An embodiment wherein the count parameter C9 has a value of approximately 9.

An embodiment wherein the voltage VL has a value of approximately 12.5V.

An embodiment wherein the voltage VH has a value of approximately 12.7V.

An embodiment wherein the lower threshold has a value of approximately 12.3V.

An embodiment wherein the upper threshold has a value of approximately 13.0V.

An embodiment wherein the time period T1 has a value of approximately 0.5 hour.

An embodiment wherein the time period T2 has a value of approximately 1.5 hour.

An embodiment wherein the time period T3 has a value of approximately 0.25 hour.

One skilled in the art will recognize that other embodiments are possible based on combinations of elements taught within the above invention description.

Anticipated Invention Scope/Advantages

While the present invention may be considered as a product that would allow the user of a Recreational Vehicle (RV), to have some ability to monitor and control electrical products from specific manufacturers such as CONNECTICUT ELECTRIC and their associated PARALLAX POWER SUPPLY product line, the invention scope exceeds this particular application and may be broadly applied to a wide variety of RVEES available within the RV application context. There is a certain amount of modularity in these RV products, especially in the area of converter systems. This modularity allows the product to be changed or enhanced as market needs or technology changes. The RVUI described here is designed to function as the hub of PARALLAX POWER SUPPLY subsystems within the RV context, and planned to be adaptable/expandable as other power supply products were improved or introduced by a wide variety of manufacturers. This presents one of the key features of the invention: the ability to monitor, control, and easily adapt to a wide variety of RV electrical/environmental products. The prior art does not teach of other interfaces that are made for the integration and control of PARALLAX POWER SUPPLY subsystems or other power supply products within a RVEES context.

Specific implementations of the user interface may give additional consideration to the different systems used in Recreational Vehicles and the idea for the invention embodiment to allow for the monitoring and control of these systems whether they are manufactured by Connecticut Electric or a third party company. Today the different systems and devices in an RVEES context are controlled by individual panels or separately installed switches in a common location. This means the installer has to become familiar with multiple platforms, and wiring conventions, as well as making several openings in the location for mounting several different items. Additionally there is no interaction between the components or systems. For example, there is no automatic means to change the functionality of Device A, based on system feedback from Device B. In short, the RVEES are generally separate and independently controlled/monitored and lack any form of unified command/control structure.

Some advantages of the present invention in various embodiments may include the ability to monitor and control different devices or systems including monitoring and control of electrical devices by one or more manufacturers. The present invention also allows for signaling in one or more methodologies, fault or programmable trigger points (alarms) for critical system events or status, and/or automated actions based on the trigger or alarm. Additionally the present invention may incorporate a single wiring point and be capable of mounted in a single installation location, needing only one opening in the mounting surface. This would potentially free mounting space for other items, as well as reduce time and cost of the RVUI by simplifying wiring and mounting installation.

The adaptability of the invention as implemented on a small scale may be enhanced by the ability to label the switches and displays easily due to a printed adhesive overlay that can be changed to cover or uncover areas of the panel based on customer needs, and simply wiring the inputs and outputs of the UCSM in a specific manner to achieve customizable application. Alternative implementations may take the form of a larger panel in order to accommodate more switches and displays as well as incorporating programmable microprocessor control to allow the functions to be controlled and changed even more easily by software revisions and system programming during installation.

Generalized Computer Usable Medium

In various alternate embodiments, the present invention may be implemented as a computer program product for use with a computerized computing system. Those skilled in the art will readily appreciate that programs defining the functions defined by the present invention can be written in any appropriate programming language and delivered to a computer in many forms, including but not limited to: (a) information permanently stored on non-writeable storage media (e.g., read-only memory devices such as ROMs or CD-ROM disks); (b) information alterably stored on writeable storage media (e.g., floppy disks, hard drives, thumb drives); and/or (c) information conveyed to a computer through communication media, such as a local area network, a telephone network, or a public network such as the Internet. When carrying computer readable instructions that implement the present invention methods, such computer readable media represent alternate embodiments of the present invention.

As generally illustrated herein, the present invention system embodiments can incorporate a variety of computer readable media that comprise computer usable medium having computer readable code means embodied therein. One skilled in the art will recognize that the software associated with the various processes described herein can be embodied in a wide variety of computer accessible media from which the software is loaded and activated. Pursuant to In re Beauregard, 35 USPQ2d 1383 (U.S. Pat. No. 5,710,578), the present invention anticipates and includes this type of computer readable media within the scope of the invention. Pursuant to In re Nuijten, 500 F.3d 1346 (Fed. Cir. 2007) (U.S. patent application Ser. No. 09/211,928), the present invention scope is limited to computer readable media wherein the media is both tangible and non-transitory.

CONCLUSION

A recreational vehicle user interface (RVUI) system/method that allows centralized control and monitoring of electrical/environmental subsystems within the context of a recreational vehicle has been disclosed. The system/method permits monitoring of a wide variety of electrical/environmental subsystems in this context, including but not limited to battery temperatures, battery voltages, overall system voltages, battery disconnect relays, vent fans, solar panels, cabin temperatures, battery temperature alarms, power converter modules, temperature sensitive power converters, PARALLAX POWER SUPPLIES, load management controllers, AC distribution controllers, transfer switches, AC/generator inputs, storage tank levels, pumps, and other electrical loads. The system/method may be optionally configured to wirelessly communicate with a mobile device using a variety of customizable mobile user interface applications, and/or be configured to support a universal control/sensor motherboard that mates to a customizable user interface daughterboard with associated custom display/control indicia bezel/panel or integrated touch screen display/control.

What is claimed is:

1. A recreational vehicle user interface (RVUI) system comprising:
   (a) universal control/sensor motherboard (UCSM);
   (b) customizable user interface daughterboard (CUID);
   (c) custom indicia bezel/panel (CIBP); and
   a connector providing an electrical interface between said UCSM and said CUID;
   wherein said UCSM is configured to accept parallel analog and digital electrical inputs from and distribute analog and digital parallel electrical outputs to electrical controls and environmental sensors within a plethora of recreational vehicle electrical/environmental subsystems (RVEES);
   said UCSM is configured to electrically communicate analog and digital signals in parallel with said CUID to send status information regarding said RVEES to said CUID;
   said UCSM is configured to electrically communicate in parallel with said CUID to accept command inputs from said CUID for configuration of said RVEES;
   said UCSM further comprises a plug matrix configured to allow custom settings to be programmed prior to installation of said UCSM;
   said UCSM further comprises UCSM/CUID jumpers configured to permit reconfiguration of the electrical interface between said UCSM and said CUID;
   said CUID comprises a status display that presents said status information to a user;
   said CUID comprises a control input configured to provide said command inputs;
   said CUID is configured to cover the PCB of said UCSM;
   said CIBP is configured to cover the PCB of said CUID;
   said CIBP is configured to present custom legends and indicia proximal to said status display; and
   said CIBP is configured to present custom legends and indicia proximal to said control input.

2. The RVUI system of claim 1 wherein said RVEES is selected from a group consisting of: battery temperature, battery voltage, overall system voltage, battery disconnect relay, vent fan, solar panel, cabin temperature, temperature alarm, power converter module, temperature sensitive power converter, PARALLAX POWER SUPPLY, load management controller, AC distribution controller, transfer switch, AC/generator input, storage tank sensor, pump motor, 12V electrical load, and 24V electrical load.

3. The RVUI system of claim 1 wherein said status display comprises an indicator selected from a group consisting of: battery voltage bar graph; battery low voltage alarm display; battery high voltage alarm display; battery voltage digital display; battery temperature bar graph; battery low temperature alarm display; battery high temperature alarm display; battery voltage digital display; storage tank level bar graph; storage tank low level alarm display; storage tank high level alarm display; storage tank level digital display.

4. The RVUI system of claim 1 wherein said status display and said control input comprise a touch screen display/control.

5. The RVUI system of claim 1 wherein said CUID comprises an alarm indicator selected from a group consisting of: visual alarm; audible alarm; audible alarm that is enabled in response to activation of the status display.

6. The RVUI system of claim 1 wherein said UCSM comprises a printed circuit board (PCB) further comprising an Expansion Module Landing Array (EMLA) configured to accept either soldered-in or pluggable expansion modules and also configured to form the basis for an interconnect channel between a number of UCSM modules that are "stacked" wherein said EMLA forming a common pathway to collect and distribute signaling information to said CUID.

7. The RVUI system of claim 1 wherein said UCSM comprises:
wireless communication interface (WCI);
wherein
said WCI is configured to interact with a mobile communication device (MCD) via wireless communication;
said MCD executes application software read from a computer readable medium;
said application software is configured to present a graphical user interface (GUI) on said MCD;
said GUI is configured to permit a user to receive RVEES status from said UCSM; and
said GUI is configured to permit a user to direct RVEES operation of said UCSM.

8. The RVUI system of claim 7 wherein said WCI comprises a wireless interface selected from a group consisting of: BLUETOOTH® wireless communication interface; and WiFi wireless communication interface.

9. The RVUI system of claim 7 wherein said MCD comprises a device selected from a group consisting of: laptop computer; tablet computer; cellphone; mobile phone; and smartphone.

10. The RVUI system of claim 7 wherein said application software is configured to interrogate said UCSM and reconfigure said GUI based on the configuration status of said CUID.

11. A method for integrating the monitoring and control of a plethora of recreational vehicle electrical/environmental subsystems (RVEES) under control of a recreational vehicle user interface (RVUI) system, said system comprising:
(a) universal control/sensor motherboard (UCSM);
(b) customizable user interface daughterboard (CUID);
(c) custom indicia bezel/panel (CIBP); and
a connector providing an electrical interface between said UCSM and said CUID;
wherein said UCSM is configured to accept parallel analog and digital electrical inputs from and distribute analog and digital parallel electrical outputs to electrical controls and environmental sensors within a plethora of recreational vehicle electrical/environmental subsystems (RVEES);
said UCSM is configured to electrically communicate analog and digital signals in parallel with said CUID to send status information regarding said RVEES to said CUID;
said UCSM is configured to electrically communicate in parallel with said CUID to accept command inputs from said CUID for configuration of said RVEES;
said UCSM further comprises a plug matrix configured to allow custom settings to be programmed prior to installation of said UCSM;
said UCSM further comprises UCSM/CUID jumpers configured to permit reconfiguration of the electrical interface between said UCSM and said CUID;
said CUID comprises a status display that presents said status information to a user;
said CUID comprises a control input configured to provide said command inputs;
said CUID is configured to cover the PCB of said UCSM;
said CIBP is configured to cover the PCB of said CUID;
said CIBP is configured to present custom legends and indicia proximal to said status display; and
said CIBP is configured to present custom legends and indicia proximal to said control input;
wherein said method comprises the steps of:
(1) electrically interconnecting said electrical inputs of said UCSM to monitoring nodes within the electrical system of said RVEES;
(2) electrically interconnecting said electrical outputs of said UCSM to control nodes within the electrical system of said RVEES;
(3) configuring said CUID to provide a customized user hardware interface to said UCSM consistent with said interconnections in said step (1) and said step (2);
(4) configuring said CIBP with legends and indicia to conform to said CUID customized user hardware interface;
(5) relaying status information from said RVEES to said UCSM for presentation on said CUID status display as presented by said CIBP to a user; and
(6) relaying control inputs from said CUID to said UCSM for transmission to said RVEES to control RVEES functions defined by the user interface presented on said CIBP.

12. The RVUI method of claim 11 wherein said RVEES is selected from a group consisting of: battery temperature, battery voltage, overall system voltage, battery disconnect relay, vent fan, solar panel, cabin temperature, temperature alarm, power converter module, temperature sensitive power converter, PARALLAX POWER SUPPLY, load management controller, AC distribution controller, transfer switch, AC/generator input, storage tank sensor, pump motor, 12V electrical load, and 24V electrical load.

13. The RVUI method of claim 11 wherein said status display comprises an indicator selected from a group consisting of: battery voltage bar graph; battery low voltage alarm display; battery high voltage alarm display; battery voltage digital display; battery temperature bar graph; battery low temperature alarm display; battery high temperature alarm display; battery voltage digital display; storage tank level bar graph; storage tank low level alarm display; storage tank high level alarm display; storage tank level digital display.

14. The RVUI method of claim 11 wherein said status display and said control input comprise a touch screen display/control.

15. The RVUI method of claim 11 wherein said CUID comprises an alarm indicator selected from a group consisting of: visual alarm; audible alarm; audible alarm that is enabled in response to activation of the status display.

16. The RVUI method of claim 11 wherein said UCSM comprises a printed circuit board (PCB) further comprising an Expansion Module Landing Array (EMLA) configured to accept either soldered-in or pluggable expansion modules and also configured to form the basis for an interconnect channel between a number of UCSM modules that are "stacked" wherein said EMLA forming a common pathway to collect and distribute signaling information to said CUID.

17. The RVUI method of claim 11 wherein said UCSM comprises:
   wireless communication interface (WCI);
   wherein
      said WCI is configured to interact with a mobile communication device (MCD) via wireless communication;
      said MCD executes application software read from a computer readable medium;
      said application software is configured to present a graphical user interface (GUI) on said MCD;
      said GUI is configured to permit a user to receive RVEES status from said UCSM; and
      said GUI is configured to permit a user to direct RVEES operation of said UCSM.

18. The RVUI method of claim 17 wherein said WCI comprises a wireless interface selected from a group consisting of: BLUETOOTH® wireless communication interface; and WiFi wireless communication interface.

19. The RVUI method of claim 18 wherein said MCD comprises a device selected from a group consisting of: laptop computer; tablet computer; cellphone; mobile phone; and smartphone.

20. The RVUI method of claim 19 wherein said application software is configured to interrogate said UCSM and reconfigure said GUI based on the configuration status of said CUID.

* * * * *